United States Patent
Yamazaki et al.

(10) Patent No.: US 9,449,996 B2
(45) Date of Patent: Sep. 20, 2016

(54) SEMICONDUCTOR DEVICE

(71) Applicant: Semiconductor Energy Laboratory Co., Ltd., Atsugi-shi, Kanagawa-ken (JP)

(72) Inventors: Shunpei Yamazaki, Tokyo (JP); Hiroyuki Miyake, Kanagawa (JP); Hideaki Shishido, Kanagawa (JP); Jun Koyama, Kanagawa (JP); Daisuke Matsubayashi, Kanagawa (JP); Keisuke Murayama, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 96 days.

(21) Appl. No.: 13/957,819

(22) Filed: Aug. 2, 2013

(65) Prior Publication Data
US 2014/0034954 A1 Feb. 6, 2014

(30) Foreign Application Priority Data

Aug. 3, 2012 (JP) ................. 2012-173349
Aug. 10, 2012 (JP) ................. 2012-178941
Aug. 28, 2012 (JP) ................. 2012-188093

(51) Int. Cl.
H01L 31/00 (2006.01)
H01L 27/12 (2006.01)
(Continued)

(52) U.S. Cl.
CPC ..... *H01L 27/1255* (2013.01); *G02F 1/136213* (2013.01); *H01L 27/1225* (2013.01);
(Continued)

(58) Field of Classification Search
USPC .......................................... 257/59
See application file for complete search history.

(56) References Cited

U.S. PATENT DOCUMENTS 5,299,041 A 3/1994 Morin et al.
5,724,107 A 3/1998 Nishikawa et al.
(Continued)

FOREIGN PATENT DOCUMENTS

CN 101897031 A 11/2010
CN 101997007 A 3/2011
(Continued)

OTHER PUBLICATIONS

International Search Report, PCT Application No. PCT/JP2013/070677, dated Sep. 17, 2013, 3 pages.
(Continued)

*Primary Examiner* — Cuong Q Nguyen
*Assistant Examiner* — Nishath Yasmeen
(74) *Attorney, Agent, or Firm* — Fish & Richardson P.C.

(57) ABSTRACT

To provide a semiconductor device including a capacitor whose charge capacity is increased without reducing the aperture ratio. The semiconductor device includes a transistor including a light-transmitting semiconductor film, a capacitor where a dielectric film is provided between a pair of electrodes, an insulating film provided over the light-transmitting semiconductor film, and a light-transmitting conductive film provided over the insulating film. In the capacitor, a metal oxide film containing at least indium (In) or zinc (Zn) and formed on the same surface as the light-transmitting semiconductor film in the transistor serves as one electrode, the light-transmitting conductive film serves as the other electrode, and the insulating film provided over the light-transmitting semiconductor film serves as the dielectric film.

22 Claims, 48 Drawing Sheets

(51) Int. Cl.
   *G02F 1/1362* (2006.01)
   *H01L 27/32* (2006.01)
   *G02F 1/1339* (2006.01)
   *G02F 1/1345* (2006.01)
   *G02F 1/1343* (2006.01)

(52) U.S. Cl.
   CPC ......... *G02F1/1339* (2013.01); *G02F 1/13454* (2013.01); *G02F 1/13458* (2013.01); *G02F 1/136204* (2013.01); *G02F 2001/134372* (2013.01); *G02F 2201/40* (2013.01); *H01L 27/3265* (2013.01)

(56) References Cited

U.S. PATENT DOCUMENTS

| | | |
|---|---|---|
| 5,731,856 A | 3/1998 | Kim et al. |
| 5,744,864 A | 4/1998 | Cillessen et al. |
| 6,294,274 B1 | 9/2001 | Kawazoe et al. |
| 6,421,101 B1 | 7/2002 | Zhang et al. |
| 6,545,305 B1 | 4/2003 | Randazzo |
| 6,559,477 B2 | 5/2003 | Tada et al. |
| 6,563,174 B2 | 5/2003 | Kawasaki et al. |
| 6,727,522 B1 | 4/2004 | Kawasaki et al. |
| 6,784,949 B1 | 8/2004 | Nagata et al. |
| 6,955,953 B2 | 10/2005 | Yamazaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,142,260 B2 | 11/2006 | Yang |
| 7,211,825 B2 | 5/2007 | Shih et al |
| 7,250,991 B2 | 7/2007 | Nagata et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,515,217 B2 | 4/2009 | Yang |
| 7,674,650 B2 | 3/2010 | Akimoto et al. |
| 7,732,819 B2 | 6/2010 | Akimoto et al. |
| 7,745,798 B2 | 6/2010 | Takahashi |
| 7,773,167 B2 | 8/2010 | Tsai et al. |
| 7,847,904 B2 | 12/2010 | Kimura |
| 7,872,261 B2 | 1/2011 | Ikeda |
| 8,039,842 B2 | 10/2011 | Jinbo |
| 8,102,476 B2 | 1/2012 | Son et al. |
| 8,368,066 B2 | 2/2013 | Yamazaki et al. |
| 8,384,077 B2 | 2/2013 | Yano et al. |
| 8,441,011 B2 | 5/2013 | Yamazaki et al. |
| 8,481,373 B2 | 7/2013 | Okabe et al. |
| 8,537,318 B2 | 9/2013 | Kimura |
| 8,610,862 B2 | 12/2013 | Kimura |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189210 A1 | 10/2003 | Yamazaki et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2004/0169991 A1 | 9/2004 | Nagata et al. |
| 2004/0183978 A1 | 9/2004 | Jeoung |
| 2004/0246424 A1 | 12/2004 | Sawasaki et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091399 A1* | 5/2006 | Lee ......................... H01L 27/12 257/72 |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0215945 A1 | 9/2007 | Tokunaga et al. |
| 2007/0236640 A1 | 10/2007 | Kimura |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0141203 A1* | 6/2009 | Son .................. G02F 1/136213 349/39 |
| 2009/0152506 A1 | 6/2009 | Umeda et al. |
| 2009/0152541 A1 | 6/2009 | Maekawa et al. |
| 2009/0189156 A1 | 7/2009 | Akimoto |
| 2009/0242888 A1* | 10/2009 | Hosoya ............. G02F 1/136213 257/59 |
| 2009/0278122 A1 | 11/2009 | Hosono et al. |
| 2009/0280600 A1 | 11/2009 | Hosono et al. |
| 2009/0283762 A1 | 11/2009 | Kimura |
| 2009/0289256 A1 | 11/2009 | Jinbo |
| 2010/0044711 A1 | 2/2010 | Imai |
| 2010/0065844 A1 | 3/2010 | Tokunaga |
| 2010/0084655 A1* | 4/2010 | Iwasaki ............... H01L 29/7869 257/43 |
| 2010/0092800 A1 | 4/2010 | Itagaki et al. |
| 2010/0102311 A1 | 4/2010 | Ito et al. |
| 2010/0109002 A1 | 5/2010 | Itagaki et al. |
| 2010/0123136 A1 | 5/2010 | Lee et al. |
| 2010/0163867 A1 | 7/2010 | Yamazaki et al. |
| 2010/0163874 A1 | 7/2010 | Koyama et al. |
| 2010/0289020 A1 | 11/2010 | Yano et al. |

(56) References Cited

U.S. PATENT DOCUMENTS

| | | | |
|---|---|---|---|
| 2011/0024750 A1 | 2/2011 | Yamazaki et al. | |
| 2011/0024751 A1 | 2/2011 | Yamazaki et al. | |
| 2011/0031491 A1 | 2/2011 | Yamazaki et al. | |
| 2011/0031492 A1 | 2/2011 | Yamazaki et al. | |
| 2011/0032435 A1 | 2/2011 | Kimura | |
| 2011/0037068 A1 | 2/2011 | Yamazaki et al. | |
| 2011/0084271 A1 | 4/2011 | Yamazaki et al. | |
| 2011/0284848 A1* | 11/2011 | Yamazaki | H01L 27/1225 257/57 |
| 2011/0297930 A1 | 12/2011 | Choi et al. | |
| 2012/0062811 A1 | 3/2012 | Miyake | |
| 2012/0108018 A1 | 5/2012 | Okabe et al. | |
| 2012/0161820 A1 | 6/2012 | Koo et al. | |
| 2012/0211745 A1 | 8/2012 | Ueda et al. | |
| 2012/0273780 A1 | 11/2012 | Yamazaki et al. | |
| 2012/0280230 A1 | 11/2012 | Akimoto et al. | |
| 2013/0134424 A1 | 5/2013 | Kim et al. | |
| 2013/0146452 A1 | 6/2013 | Yano et al. | |
| 2013/0328044 A1 | 12/2013 | Yamazaki et al. | |
| 2014/0014948 A1 | 1/2014 | Matsukura | |
| 2014/0042432 A1 | 2/2014 | Yamazaki | |
| 2014/0042443 A1 | 2/2014 | Yamazaki | |
| 2014/0061636 A1 | 3/2014 | Miyake et al. | |
| 2014/0061654 A1 | 3/2014 | Yamazaki et al. | |
| 2014/0070209 A1 | 3/2014 | Yamazaki et al. | |
| 2014/0098334 A1 | 4/2014 | Kimura | |

FOREIGN PATENT DOCUMENTS

| | | | |
|---|---|---|---|
| CN | 102473362 A | 5/2012 | |
| CN | 102906804 A | 1/2013 | |
| EP | 1 037 095 A2 | 9/2000 | |
| EP | 1737044 A | 12/2006 | |
| EP | 1843194 A | 10/2007 | |
| EP | 2 192 441 A2 | 6/2010 | |
| EP | 2226847 A | 9/2010 | |
| EP | 2 458 577 A2 | 5/2012 | |
| EP | 2 579 237 A2 | 4/2013 | |
| JP | 60-198861 A | 10/1985 | |
| JP | 63-210022 A | 8/1988 | |
| JP | 63-210023 A | 8/1988 | |
| JP | 63-210024 A | 8/1988 | |
| JP | 63-215519 A | 9/1988 | |
| JP | 63-239117 A | 10/1988 | |
| JP | 63-265818 A | 11/1988 | |
| JP | 01-129234 A | 5/1989 | |
| JP | 05-251705 A | 9/1993 | |
| JP | 07-104312 A | 4/1995 | |
| JP | 08-264794 A | 10/1996 | |
| JP | 11-505377 | 5/1999 | |
| JP | 2000-044236 A | 2/2000 | |
| JP | 2000-150900 A | 5/2000 | |
| JP | 2000-323698 A | 11/2000 | |
| JP | 2001-051300 A | 2/2001 | |
| JP | 2002-050761 A | 2/2002 | |
| JP | 2002-076356 A | 3/2002 | |
| JP | 2002-289859 A | 10/2002 | |
| JP | 2002-359252 A | 12/2002 | |
| JP | 2003-086000 A | 3/2003 | |
| JP | 2003-086808 A | 3/2003 | |
| JP | 2004-103957 A | 4/2004 | |
| JP | 2004-273614 A | 9/2004 | |
| JP | 2004-273732 A | 9/2004 | |
| JP | 2005-077822 A | 3/2005 | |
| JP | 2007-096055 A | 4/2007 | |
| JP | 2007-123861 A | 5/2007 | |
| JP | 2007-298976 A | 11/2007 | |
| JP | 2008-009425 A | 1/2008 | |
| JP | 2010-004027 A | 1/2010 | |
| JP | 5133468 A | 1/2010 | |
| JP | 2010-171394 A | 8/2010 | |
| JP | 2010-243741 A | 10/2010 | |
| JP | 2011-054949 A | 3/2011 | |
| JP | 2012-018970 A | 1/2012 | |
| JP | 2012-083738 A | 4/2012 | |
| JP | 5074625 A | 11/2012 | |
| KR | 2004-0012208 A | 2/2004 | |
| KR | 2010-0094509 A | 8/2010 | |
| KR | 2012-0136426 A | 12/2012 | |
| TW | 200937638 A | 9/2009 | |
| WO | WO-01/33292 | 5/2001 | |
| WO | WO-2004/114391 | 12/2004 | |
| WO | 2009/075281 A1 | 6/2009 | |
| WO | 2011/010415 A1 | 1/2011 | |
| WO | 2011/148537 A1 | 12/2011 | |

OTHER PUBLICATIONS

Written Opinion, PCT Application No. PCT/JP2013/070677, dated Sep. 17, 2013, 8 pages.

Asakuma.N. et al., "Crystallization and Reduction of Sol-Gel-Derived Zinc Oxide Films by Irradiation with Ultraviolet Lamp", Journal of Sol-Gel Science and Technology, 2003, vol. 26, pp. 181-184.

Asaoka.Y et al., "29.1:Polarizer-Free Reflective LCD Combined With Ultra Low-Power Driving Technology", SID Digest '09: SID Digest '09: SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:AL and SN-Doped Zinc Indium Oxide Thin Film Transistors for Amoled Back-Plane", SID Digest '09: SID International Symposium Digest of Technical Papers, May 31, 2009, pp. 280-283.

Clark.S et al., "First Principles Methods Using CASTEP", Zeitschrift fur Kristallographie, 2005, vol 220, pp. 567-570.

Coates.D et al., "Optical Studies of the Amorphous Liquid-Cholesteric Liquid Crystal Transition: The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A. (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Device Meeting, Dec. 5, 2005, pp. 1067-1069.

Fortunato.E et al., "Wide-Bandgap High-Mobility ZNO Thin-Film Transistors Produced at Room Temperature", Appl. Phys. Lett. (Applied Physics Letters), Sep. 27, 2004, vol. 85, No. 13, pp. 2541-2543.

Fung.T et al., "2-D Numerical Simulation of High Performance Amorphous In-Ga-Zn-O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In-Ga-Zn-Oxide TFT", SID Digest '09: SID International Symposium Digest of Technical Papers, May 31, 2009, pp. 1110-1112.

Godo.H et al., "Temperature Dependence of Characteristics and Electronic Structure for Amorphous In-Ga-Zn-Oxide TFT", AM-FPD '09 Digest of Technical Papers, Jul. 1, 2009, pp. 41-44.

Hayashi.R et al., "42.1: Invited Paper: Improved Amorphous In-Ga-Zn-0 TFTS", SID Digest '08: SID International Symposium Digest of Technical Papers, May 20, 2008, vol. 39, pp. 621-624.

Hirao.T et al., "Novel Top-Gate Zinc Oxide Thin-Film Transistors (ZNO TFTS) for AMLCDS", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cyst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07: SID International Symposium Digest of Technical Papers, 2007, vol. 38, pp. 1830-1833.

(56) References Cited

OTHER PUBLICATIONS

Hsieh.H et al., "P-29:Modeling of Amorphous Oxide Semiconductor Thin Film Transistors and Subgap Density of States", SID Digest '08: SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04: SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters), 2005, vol. 87, pp. 122102-1-122102-3.

Jeong.J et al., "3.1: Distinguished Paper: 12.1-Inch WXGA AMOLED Display Driven by Indium-Gallium-Zinc Oxide TFTs Array", SID Digest '08: SID International Symposium Digest of Technical Papers, May 20, 2008, vol. 39, No.1, pp. 1-4.

Jin.D et al., "65.2:Distinguished Paper:World-Largest (6.5") Flexible Full Color Top Emission AMOLED Display on Plastic Film and Its Bending Properties", SID Digest '09: SID International Symposium Digest of Technical Papers, May 31, 2009, pp. 983-985.

Kanno.H et al., "White Stacked Electrophosphorecent Organic Light-Emitting Devices Employing MOO3 as a Charge-Generation Layer", Adv. Matter. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09: SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07: SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N. et al., "Spinel,YBFE2O4, and YB2FE3O7 Types of Structures for Compounds in The IN2O3 and SC2O3-A2O3-BO Systems [A; FE, GA, OR AL; B: MG, MN, FE, NI, CU,OR, ZN] at Temperatures over 1000°C", Journal of Solid State Chemistry, 1985, vol. 60, pp. 382-384.

Kimizuka.N. et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3-ZnGa2O4-ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No.3 , pp. 911-916.

Kurokawa.Y et al., "UHF RFCPUS on Flexible and Glass Substrates for Secure RFID Systems", Journal of Solid-State Circuits , 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED ", IDW '06 : Proceedings of the 13th International Display Workshops, Dec. 7, 2006, pp. 663-666.

Lee.J et al., "World'S Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium-Oxide-Based Thin-Film Transistors by Dc Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "Suftla Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M et al., "The phase relations in the In2O3-Ga2ZnO4-ZnO system at 1350°C", Journal of Solid State Chemistry, Aug. 1, 1991, vol. 93, No. 2, pp. 298-315.

Nakamura.M, "Synthesis of Homologous Compound with New Long-Period Structure", Nirim Newsletter, Mar. 1, 1995, vol. 150, pp. 1-4.

Nomura.K et al., "Amorphous Oxide Semiconductors for High-Performance Flexible Thin-Film Transistors", JPN. J. Appl. Phys. (Japanese Journal of Applied Physics) , 2006, vol. 45, No. 5B, pp. 4303-4308.

Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B. (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 in. QVGA AMOLED Display Using In-Ga-Zn-Oxide TFTs with a Novel Passivation Layer", SID Digest '09 : SID International Symposium Digest of Technical Papers, May 31, 2009, pp. 284-287.

OHara.H et al., "Amorphous In-Ga-Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In-Ga-Zn-Oxide TFT", SID Digest '09 : SID International Symposium Digest of Technical Papers, May 31, 2009, pp. 184-187.

Osada.T et al., "Development of Driver-Integrated Panel Using Amorphous In-Ga-Zn-Oxide TFT", AM-FPD '09 Digest of Technical Papers, Jul. 1, 2009, pp. 33-36.

Park.J et al., "Amorphous Indium-Gallium-Zinc Oxide Tfts and Their Application for Large Size AMOLED", AM-FPD '08 Digest of Technical Papers, Jul. 2, 2008, pp. 275-278.

(56) References Cited

OTHER PUBLICATIONS

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by AR Plasma Treatment", Appl. Phys. Lett. (Applied Physics Letters), Jun. 26, 2007, vol. 90, No. 26, pp. 262106-1-262106-3.

Park.S et al., "Challenge to Future Displays: Transparent Am-Oled Driven by Peald Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Sakata.J et al., "Development of 4.0-In. AMOLED Display With Driver Circuit Using Amorphous In-Ga-Zn-Oxide TFTs", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3-In2O3-ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs", IDW '02 : Proceedings of the 9th International Display Workshops, Dec. 4, 2002, pp. 295-298.

Ueno.K et al., "Field-Effect Transistor on SrTiO3 with Sputtered Al2O3 Gate Insulator", Appl. Phys. Lett. (Applied Physics Letters), Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2010, vol. 85, No. 5, pp. 1012-1015.

International Search Report (Application No. PCT/JP2013/074167) Dated Oct. 8, 2013.

Written Opinion (Application No. PCT/JP2013/074167) Dated Oct. 8, 2013.

Allowed Claims (U.S. Appl. No. 14/011,899) Submitted Jul. 30, 2015.

Allowed Claims (U.S. Appl. No. 14/023,295) Submitted Jan. 28, 2016.

\* cited by examiner

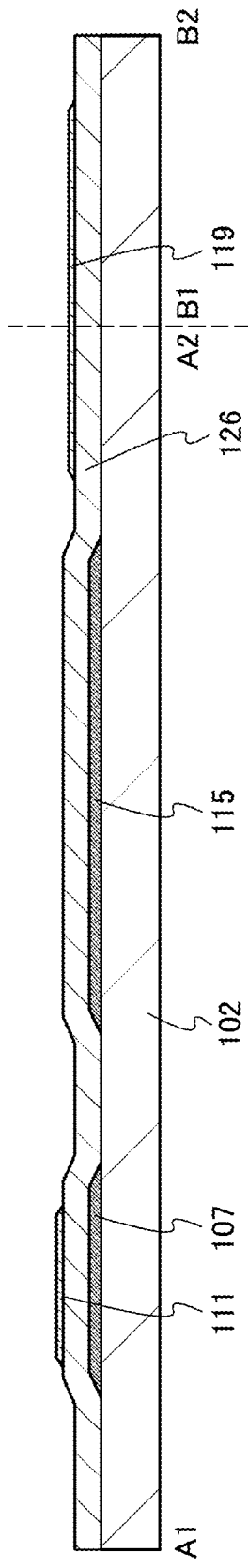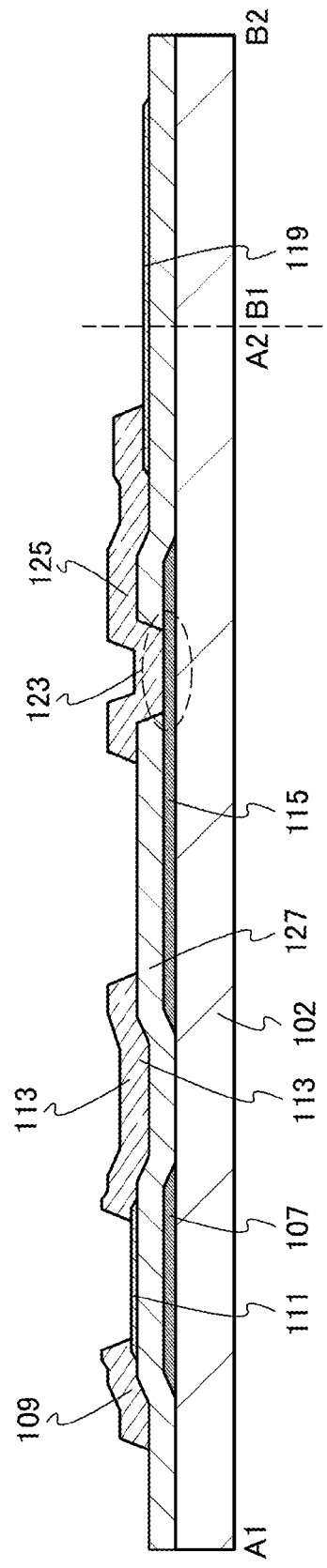

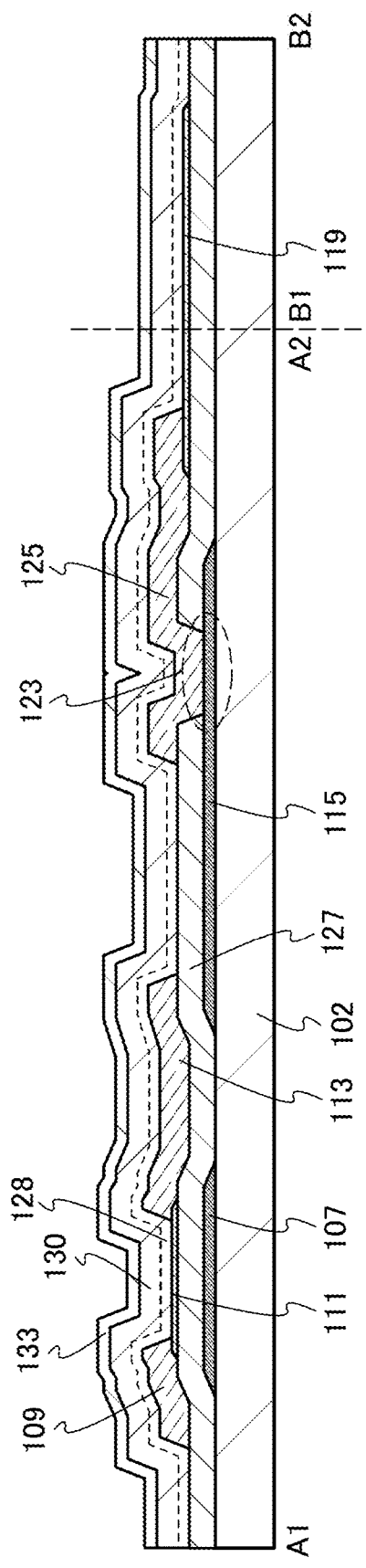
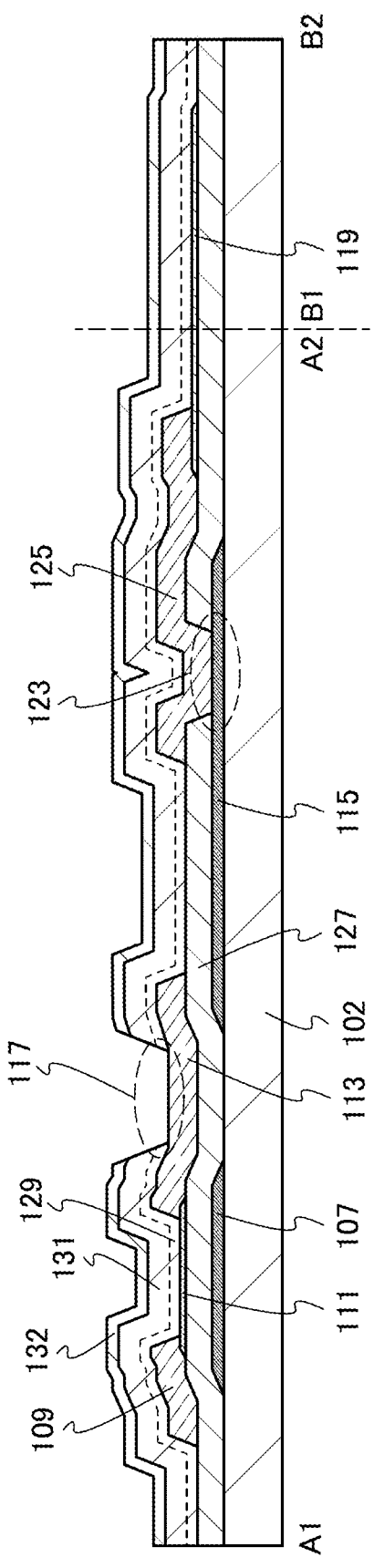
FIG. 5A
FIG. 5B

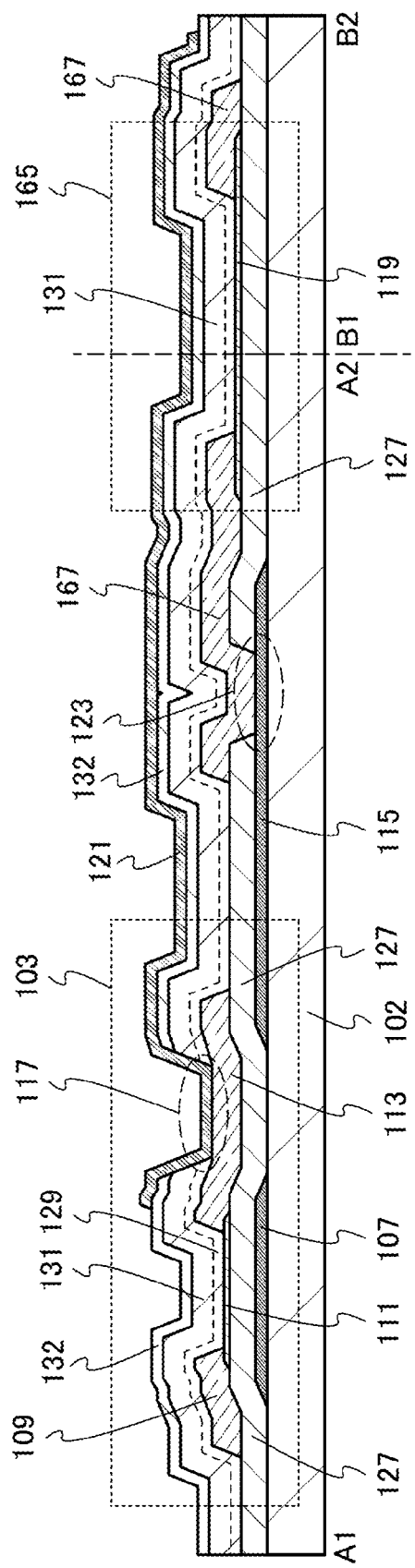
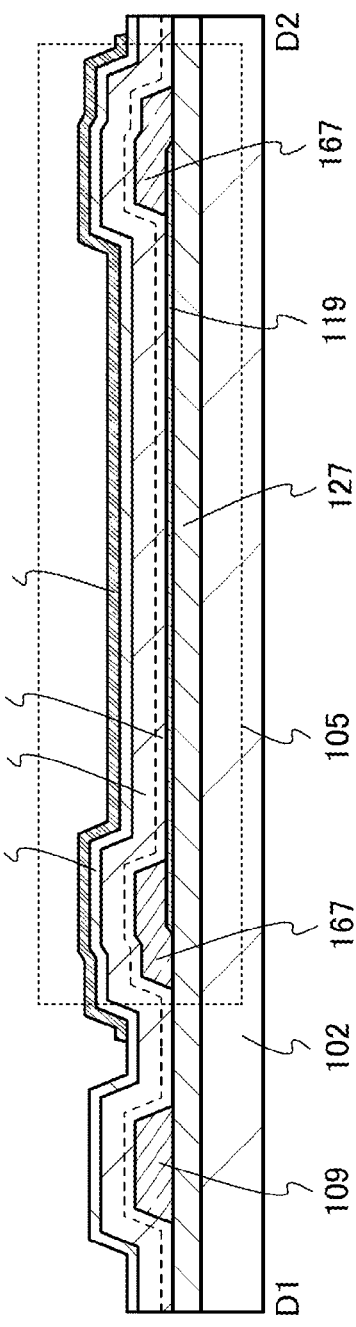
FIG. 10A
FIG. 10B

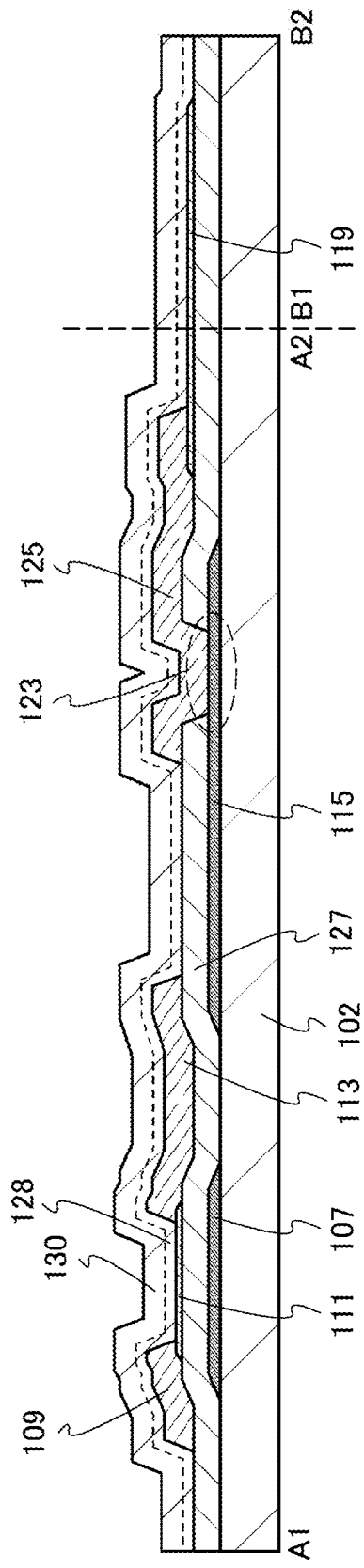
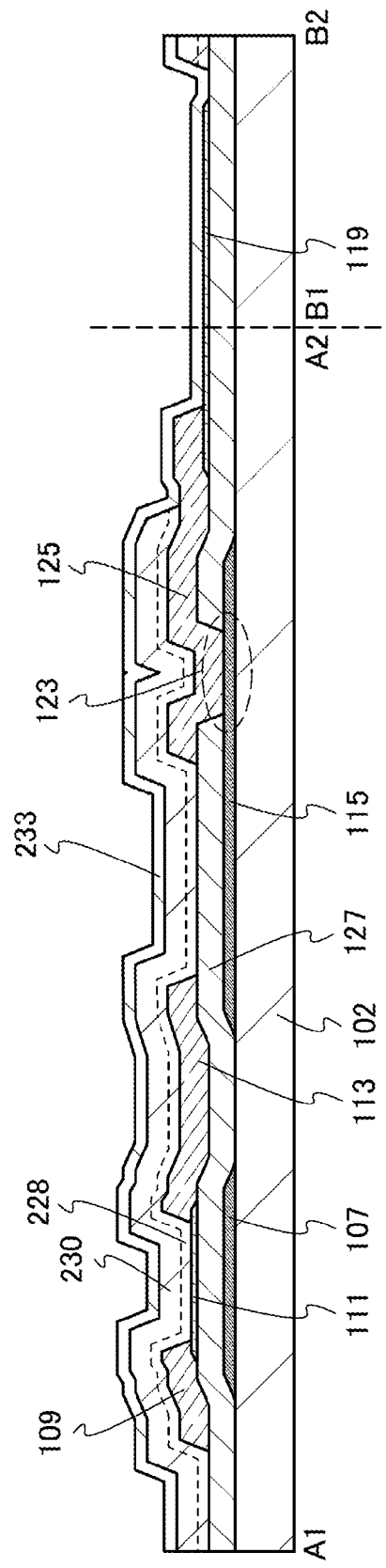
FIG. 22A
FIG. 22B

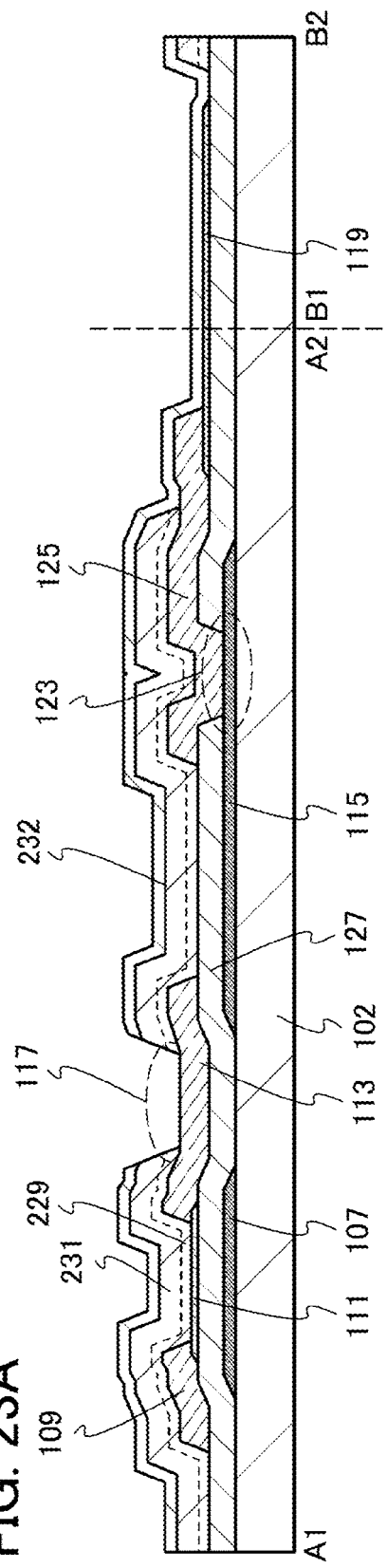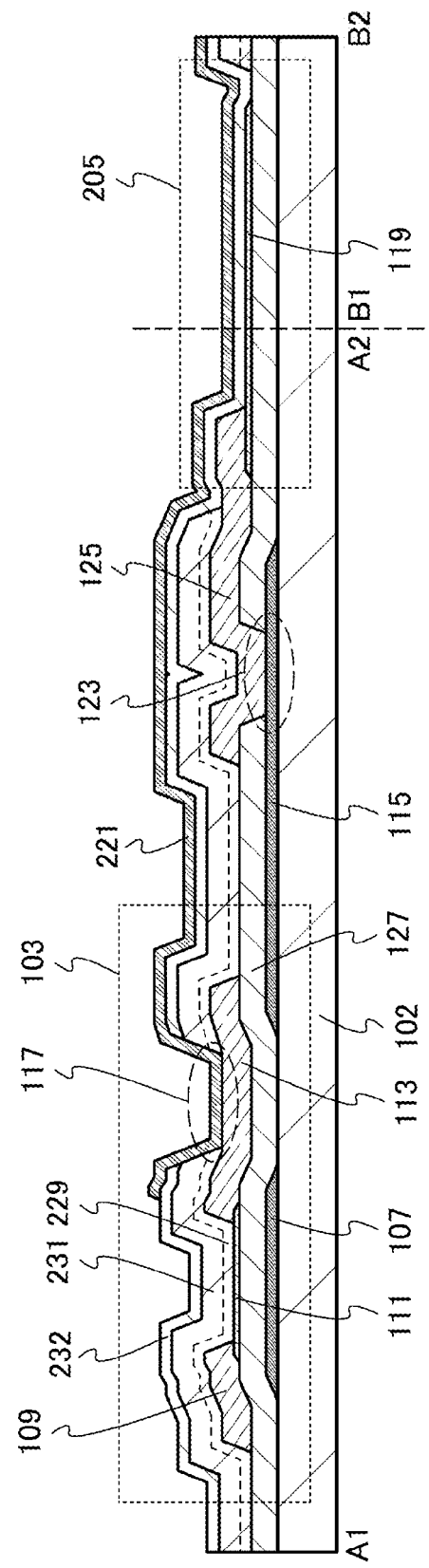

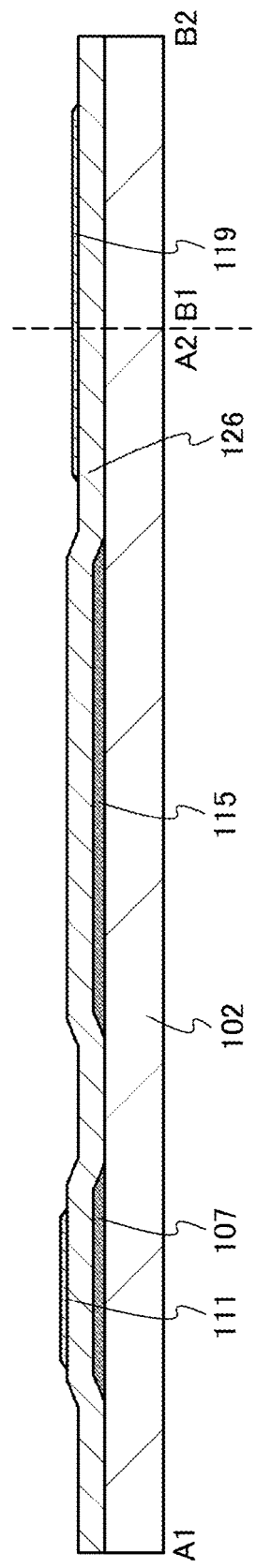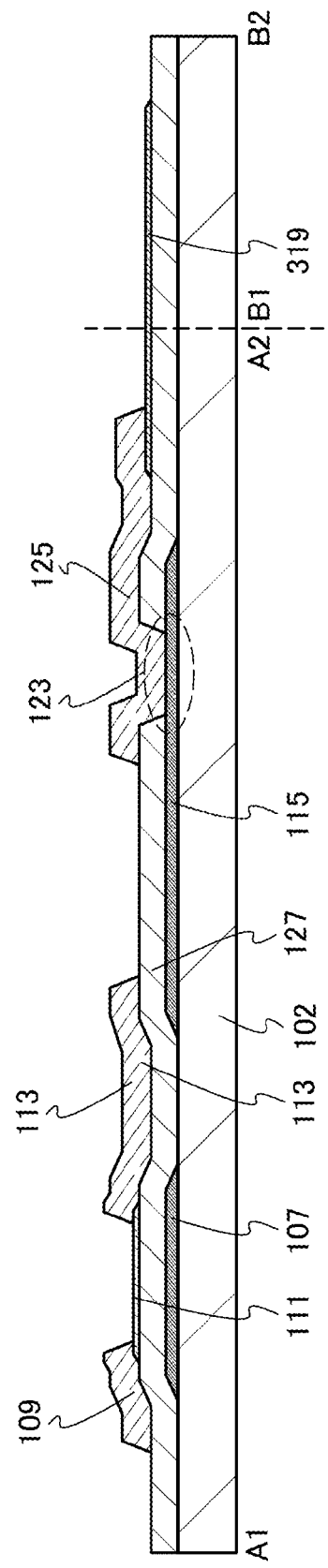
FIG. 27A
FIG. 27B

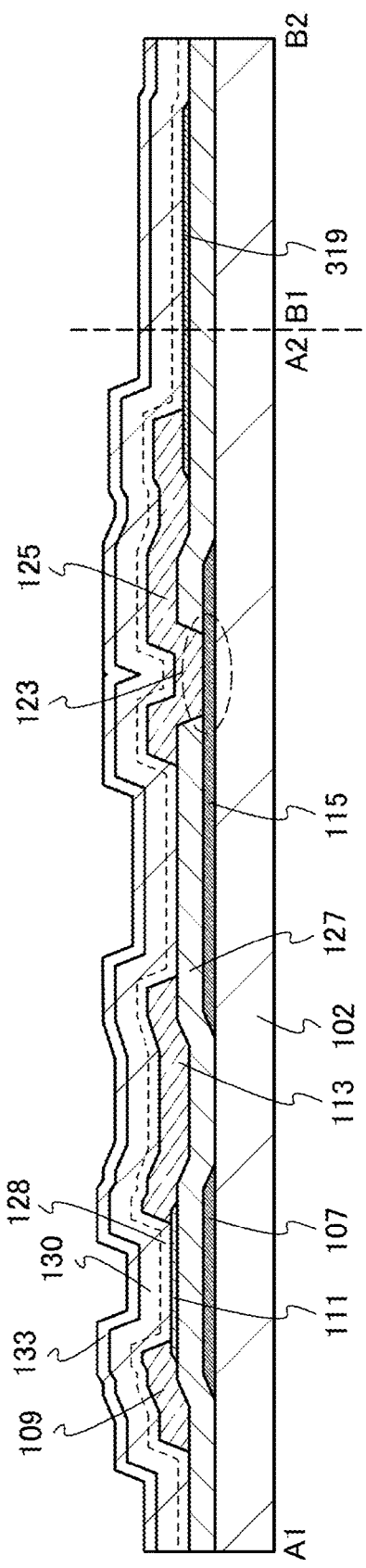
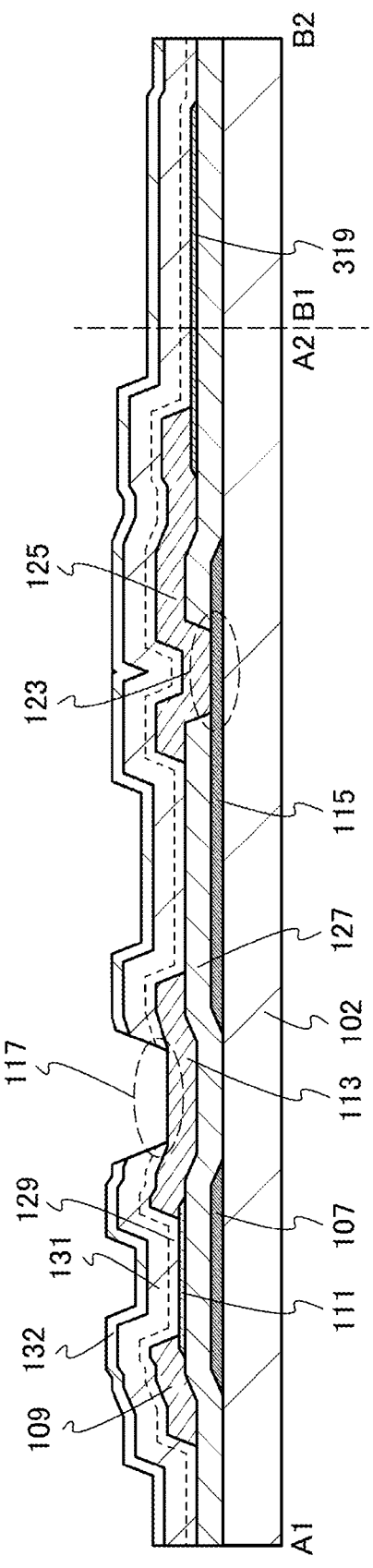
FIG. 28A
FIG. 28B

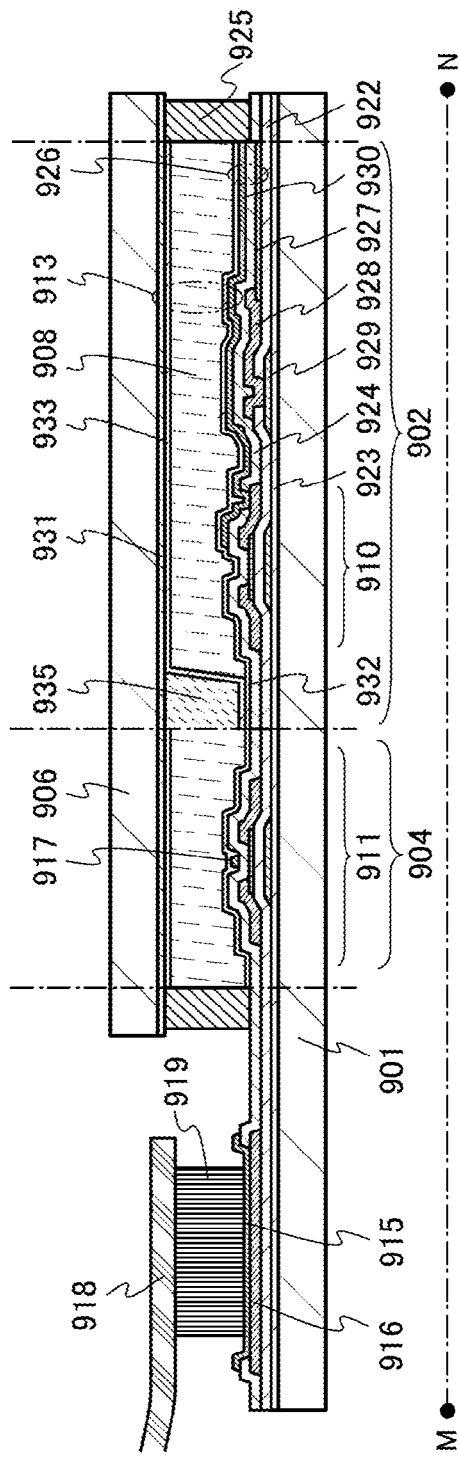
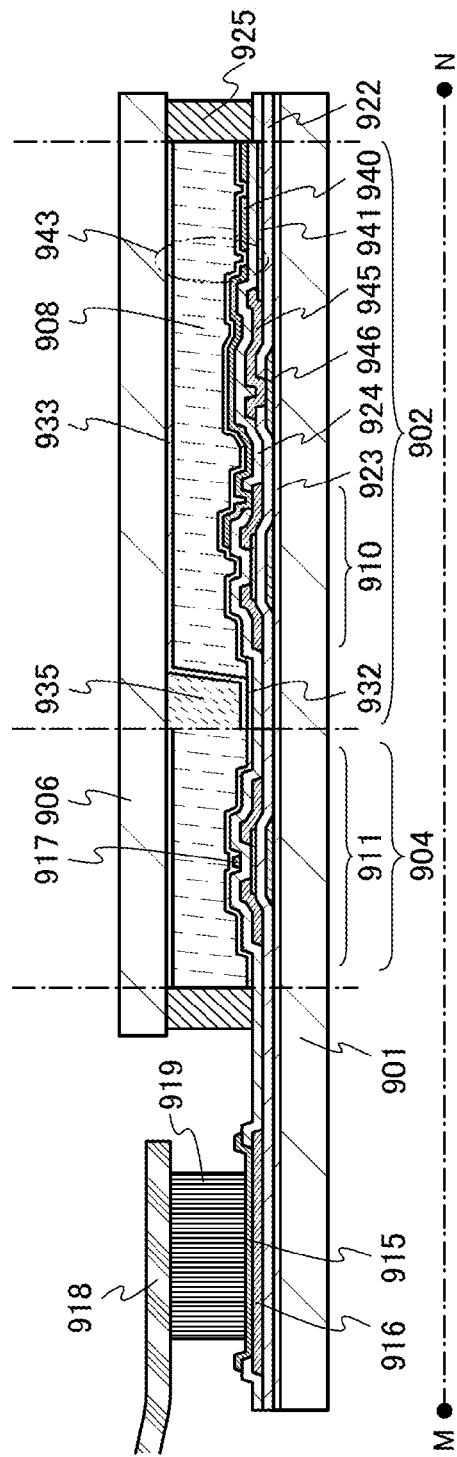
FIG. 31A
FIG. 31B $V_{th} \geqq 0$ $V_{th} < 0$

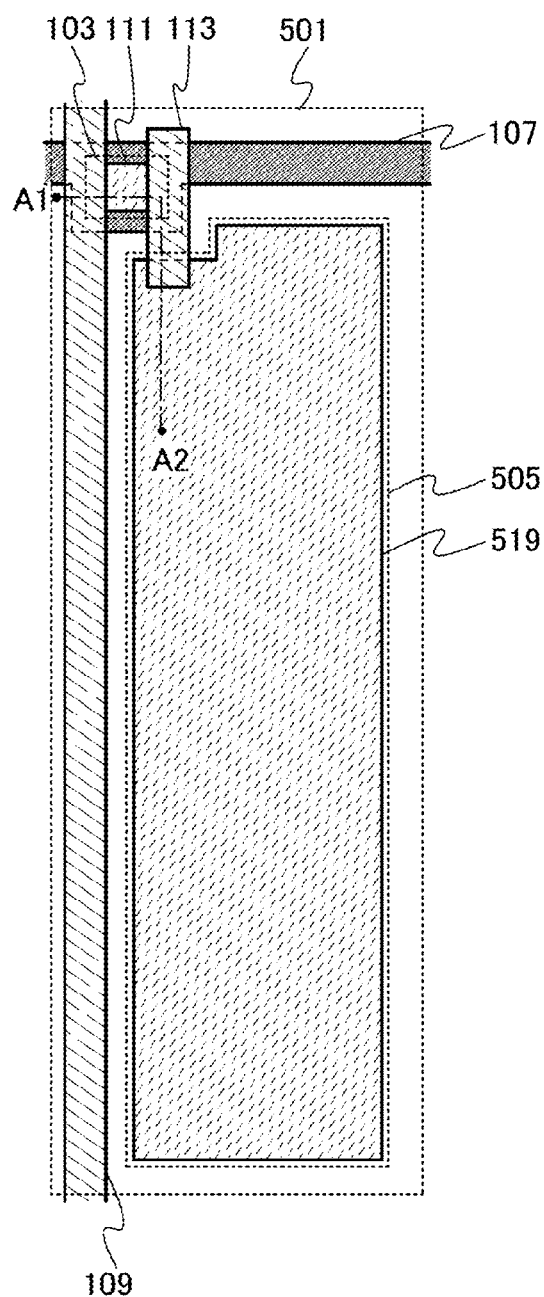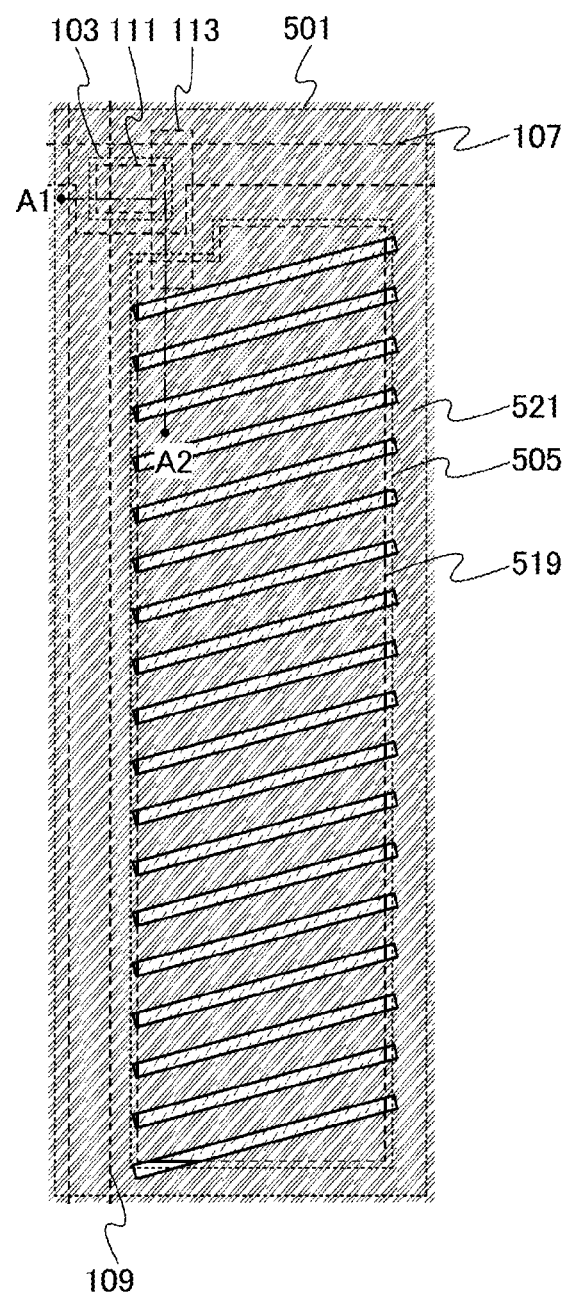

SEMICONDUCTOR DEVICE

TECHNICAL FIELD

The invention disclosed in this specification and the like relates to a semiconductor device.

BACKGROUND ART

In recent years, flat panel displays such as liquid crystal displays (LCDs) have been widespread. In each of pixels provided in the row direction and the column direction in a display device such as a flat panel display, a transistor serving as a switching element, a liquid crystal element electrically connected to the transistor, and a capacitor connected to the liquid crystal element in parallel are provided.

As a semiconductor material of a semiconductor film of the transistor, a silicon semiconductor such as amorphous silicon or polysilicon (polycrystalline silicon) is generally used.

Metal oxides having semiconductor characteristics (hereinafter referred to as oxide semiconductors) can be used for semiconductor films in transistors. For example, techniques for forming transistors using zinc oxide or an In—Ga—Zn-based oxide semiconductor are disclosed (see Patent Documents 1 and 2).

REFERENCES

[Patent Document 1] Japanese Published Patent Application No. 2007-123861
[Patent Document 2] Japanese Published Patent Application No. 2007-096055

DISCLOSURE OF INVENTION

In a capacitor, a dielectric film is provided between a pair of electrodes at least one of which is formed, in many cases, using a light-blocking film partly serving as a gate electrode, a source electrode, a drain electrode, or the like of a transistor.

As the capacitance value of a capacitor is increased, a period in which the alignment of liquid crystal molecules of a liquid crystal element can be kept constant in the state where an electric field is applied can be made longer. When the period can be made longer in a display device which displays a still image, the number of times of rewriting image data can be reduced, leading to a reduction in power consumption.

One of methods for increasing the charge capacity of a capacitor is to increase the area occupied by the capacitor, specifically, to increase the area of a portion where a pair of electrodes overlap each other. However, when the area of a light-blocking conductive film is increased to increase the area of a portion where a pair of electrodes overlaps with each other, the aperture ratio of a pixel is lowered and thus display quality of an image is degraded.

In view of the above problems, it is an object of one embodiment of the present invention to provide a semiconductor device including a capacitor with increased charge capacity and having a high aperture ratio.

One embodiment of the present invention is a semiconductor device including a transistor and a light-transmitting capacitor. Specifically, in the capacitor in the semiconductor device, a light-transmitting semiconductor film serves as one electrode of the capacitor, a light-transmitting conductive film serves as the other electrode of the capacitor, and a light-transmitting insulating film serves as a dielectric film.

One embodiment of the present invention is a semiconductor device including a transistor including a light-transmitting semiconductor film, a capacitor where a dielectric film is provided between a pair of electrodes, an insulating film provided over the light-transmitting semiconductor film, and a light-transmitting conductive film provided over the insulating film. In the capacitor, a light-transmitting semiconductor film formed on the same surface as the light-transmitting semiconductor film in the transistor serves as one electrode, the light-transmitting conductive film serves as the other electrode, and the insulating film provided over the light-transmitting semiconductor film serves as the dielectric film.

The light-transmitting semiconductor film can be formed using an oxide semiconductor. This is because an oxide semiconductor has an energy gap as wide as 3.0 eV or more and high visible-light transmissivity.

In the case where a semiconductor film formed in a step of forming the semiconductor film included in the transistor is used as one electrode of the capacitor, the conductivity of the semiconductor film may be increased. For example, it is preferable to add one or more selected from boron, nitrogen, fluorine, aluminum, phosphorus, arsenic, indium, tin, antimony, and a rare gas element to the semiconductor film. An ion implantation method, an ion doping method, or the like may be employed to add the element to the semiconductor film. Alternatively, the semiconductor film may be exposed to plasma containing the element to add the element. In that case, the conductivity of the semiconductor film serving as one electrode of the capacitor is greater than or equal to 10 S/cm and less than or equal to 1000 S/cm, preferably greater than or equal to 100 S/cm and less than or equal to 1000 S/cm.

With the above structure, the capacitor transmits light and thus can be formed large (in a large area) in a pixel region except a portion where transistors are formed in the pixel. For this reason, the semiconductor device can have charge capacity increased while improving the aperture ratio. Accordingly, the semiconductor device can have excellent display quality.

In the capacitor, the insulating film provided over the semiconductor film included in the transistor is used as the dielectric film; therefore, the dielectric film can have the same layered structure as the insulating film. For example, in the case where the insulating film provided over the semiconductor film included in the transistor has a layered structure of an oxide insulating film and a nitride insulating film, the dielectric film of the capacitor can have a layered structure of the oxide insulating film and the nitride insulating film.

In the case where in the capacitor, the insulating film provided over the semiconductor film included in the transistor has a layered structure of an oxide insulating film and a nitride insulating film, only a portion of the oxide insulating film in a region where the capacitor is formed is removed after the oxide insulating film is formed, whereby the dielectric film of the capacitor can have a single-layer structure of the nitride insulating film. In other words, the nitride insulating film is in contact with an oxide semiconductor film serving as the pair of electrodes of the capacitor, whereby defect states (interface states) at the interface between the nitride insulating film and the oxide semiconductor film or nitrogen contained in the nitride insulating film diffuses into the oxide semiconductor film, leading to an increase in the conductivity of the oxide semiconductor film.

Further, the thickness of the dielectric film can be reduced; therefore, an increase in the charge capacity of the capacitor can be achieved.

When the nitride insulating film is in contact with the semiconductor film in the capacitor as described above, a step of adding an element which increases the conductivity to the semiconductor film by an ion implantation method, an ion doping method, or the like can be skipped; therefore, the yield of the semiconductor device can be increased and the manufacturing cost thereof can be reduced.

In the case where the semiconductor film included in the transistor is an oxide semiconductor film and the insulating film over the semiconductor film is a stack of an oxide insulating film and a nitride insulating film, the oxide insulating film is preferably less likely to transmit nitrogen, that is, the oxide insulating film preferably has a barrier property against nitrogen.

With the above structure, one of or both nitrogen and hydrogen can be prevented from diffusing into the oxide semiconductor film as the semiconductor film included in the transistor, so that variations in the electrical characteristics of the transistor can be suppressed.

In the above, an organic insulating film may be provided between the light-transmitting conductive film and the insulating film provided over the semiconductor film included in the transistor. With such a structure, parasitic capacitance between the light-transmitting conductive film and a conductive film partly serving as a source electrode, a drain electrode, or the like can be reduced, so that favorable electrical characteristics of the semiconductor device can be achieved. For example, signal delays of the semiconductor device can be reduced.

To increase the charge capacity of the capacitor, it is effective to reduce the thickness of the dielectric film; therefore, it is preferable to remove a portion of the organic insulating film which is over a region where the capacitor is formed. In the case where the semiconductor film included in the transistor is an oxide semiconductor film, to prevent hydrogen, water, and the like contained in the organic insulating film from diffusing into the oxide semiconductor film, it is preferable to remove a portion of the organic insulating film which overlaps with the semiconductor film included in the transistor.

In the case where the light-transmitting conductive film is connected to the transistor, the light-transmitting conductive film serves as a pixel electrode.

In the case where the light-transmitting conductive film serves as a pixel electrode, a capacitor line extends in the direction parallel with a scan line, on the same surface as the scan line. One electrode (semiconductor film) of the capacitor is electrically connected to the capacitor line through a conductive film formed at the same time as formation of source and drain electrodes of the transistor.

The capacitor line does not necessarily extend in the direction parallel with a scan line, on the same surface as the scan line. The capacitor line may extend in the direction parallel with a scan line including the source electrode or the drain electrode of the transistor, on the same surface as the signal line, and may be electrically connected to one electrode (the semiconductor film one) of the capacitor.

The capacitor line may be formed using the semiconductor film included in the capacitor.

The capacitor line may be connected to each of capacitors included in a plurality of adjacent pixels. In this case, the capacitor line may be provided between the adjacent pixels.

In the case where the conductivity of the semiconductor film included in the capacitor is high, the semiconductor film included in the capacitor may be connected to the transistor. In this case, the semiconductor film included in the capacitor serves as a pixel electrode, and the light-transmitting conductive film serves as a common electrode and the capacitor line.

In the case where the semiconductor film formed in the step of forming the semiconductor film included in the transistor serves as one electrode of the capacitor, the conductive film in contact with the semiconductor film and the capacitor line may be provided in contact with an end portion of the semiconductor film and, for example, can be provided in contact with the semiconductor film along the outer periphery thereof. With such a structure, the contact resistance between the semiconductor film and the conductive film is reduced.

The light-transmitting capacitor can be formed using a formation process of the transistor. One electrode of the capacitor can be formed using a formation process of the semiconductor film included in the transistor. The dielectric film of the capacitor can be formed using a formation process of the insulating film provided over the semiconductor film included in the transistor. The other electrode of the capacitor can be formed using a formation process of the light-transmitting conductive film serving as a pixel electrode or a common electrode. Thus, the semiconductor film included in the transistor and one electrode of the capacitor are formed using the same metal element.

A fabrication method of a semiconductor device of one embodiment of the present invention is one embodiment of the present invention.

According to one embodiment of the present invention, a semiconductor device including a capacitor whose charge capacity is increased while improving the aperture ratio can be provided.

BRIEF DESCRIPTION OF DRAWINGS

In the accompanying drawings:

FIGS. 4A and 4B are cross-sectional views illustrating a manufacturing method of a semiconductor device of one embodiment of the present invention;

FIGS. 5A and 5B are cross-sectional views illustrating the manufacturing method of a semiconductor device of one embodiment of the present invention;

FIGS. 10A and 10B are cross-sectional views illustrating the semiconductor device of one embodiment of the present invention;

FIGS. 22A and 22B are cross-sectional views illustrating a manufacturing method of a semiconductor device of one embodiment of the present invention;

FIGS. 23A and 23B are cross-sectional views illustrating a manufacturing method of a semiconductor device of one embodiment of the present invention;

FIGS. 27A and 27B are cross-sectional views illustrating a manufacturing method of a semiconductor device of one embodiment of the present invention;

FIGS. 28A and 28B are cross-sectional views illustrating the manufacturing method of a semiconductor device of one embodiment of the present invention;

FIGS. 31A and 31B are cross-sectional views each illustrating a semiconductor device of one embodiment of the present invention;

FIGS. 40A and 40B are top views illustrating a semiconductor device of one embodiment of the present invention;

BEST MODE FOR CARRYING OUT THE INVENTION

Figure 1A:
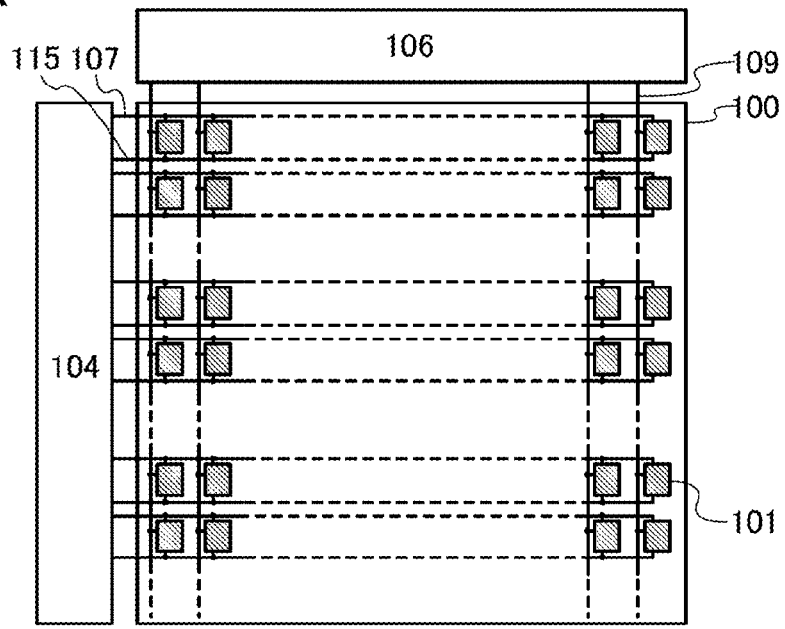
FIG. 1A illustrates a semiconductor device of one embodiment of the present invention and FIGS. 1B and 1C are circuit diagrams each illustrating a pixel.

Hereinafter, embodiments and an example of the present invention will be described in detail with reference to the accompanying drawings. However, the present invention is not limited to the description below, and it is easily understood by those skilled in the art that modes and details disclosed herein can be modified in various ways. In addition, the present invention is not construed as being limited to the following descriptions of the embodiments and example.

Note that in structures of the present invention described below, the same portions or portions having similar functions are denoted by common reference numerals in different drawings, and descriptions thereof are not repeated. Further, the same hatching pattern is applied to portions having similar functions, and the portions are not especially denoted by reference numerals in some cases.

Note that in each drawing described in this specification, the size, the film thickness, or the region of each component is exaggerated for clarity in some cases. Therefore, the embodiments and example of the present invention are not limited to such scales in the drawings.

Note that the ordinal numbers such as "first", "second", and the like in this specification and the like are used for convenience and do not denote the order of steps or the stacking order of layers. In addition, the ordinal numbers in this specification and the like do not denote particular names which specify the present invention.

Functions of a "source" and a "drain" in the present invention are sometimes replaced with each other when the direction of current flow is changed in circuit operation, for example. Therefore, the terms "source" and "drain" can be interchanged with each other in this specification.

Note that a voltage refers to a difference between potentials of two points, and a potential refers to electrostatic energy (electric potential energy) of unit charge at a given point in an electrostatic field. Note that in general, a difference between a potential of one point and a reference potential (e.g., a ground potential) is merely called a potential or a voltage, and a potential and a voltage are used as synonymous words in many cases. Thus, in this specification, a potential may be rephrased as a voltage and a voltage may be rephrased as a potential unless otherwise specified.

In this specification, in the case where etching treatment is performed after photolithography treatment, a mask formed in the photolithography treatment is removed after the etching treatment.

Embodiment 1

In this embodiment, a semiconductor device of one embodiment of the present invention will be described with reference to drawings. Note that in this embodiment, a semiconductor device of one embodiment of the present invention will be described taking a liquid crystal display device as an example.

<Structure of Semiconductor Device>

FIG. 1A illustrates an example of a semiconductor device. The semiconductor device in FIG. 1A includes a pixel portion 100, a scan line driver circuit 104, a signal line driver circuit 106, m scan lines 107 which are arranged in parallel or substantially in parallel and whose potentials are controlled by the scan line driver circuit 104, and n signal lines 109 which are arranged in parallel or substantially in parallel and whose potentials are controlled by the signal line driver circuit 106. Further, the pixel portion 100 includes a plurality of pixels 101 arranged in a matrix. Furthermore, capacitor lines 115 arranged in parallel or substantially in parallel are provided along the scan lines 107. Note that the capacitor lines 115 may be arranged in parallel or substantially in parallel along the signal lines 109.

Each scan line 107 is electrically connected to the n pixels 101 in the corresponding row among the pixels 101 arranged in m rows and n columns in the pixel portion 100. Each signal line 109 is electrically connected to the m pixels 101 in the corresponding column among the pixels 101 arranged in m rows and n columns. Note that m and n are each an integer of 1 or more. Each capacitor line 115 is electrically connected to the n pixels 101 in the corresponding row among the pixels 101 arranged in m rows and n columns. Note that in the case where the capacitor lines 115 are arranged in parallel or substantially in parallel along the signal lines 109, each capacitor line 115 is electrically connected to the m pixels 101 in the corresponding column among the pixels 101 arranged in m rows and n columns.

Figure 1B:
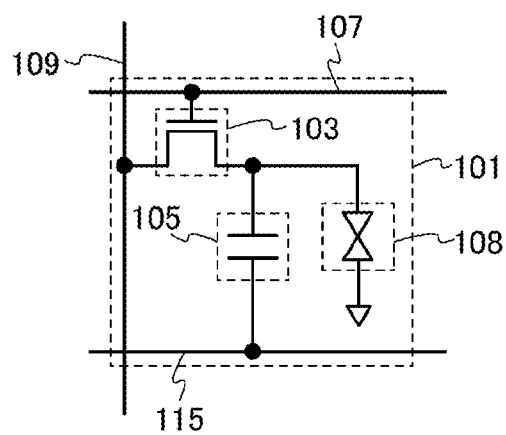

FIG. 1B is an example of a circuit diagram of the pixel 101 included in the semiconductor device illustrated in FIG. 1A. The pixel 101 in FIG. 1B includes a transistor 103 which is electrically connected to the scan line 107 and the signal line 109, a capacitor 105 one electrode of which is electrically connected to a drain electrode of the transistor 103 and the other electrode of which is electrically connected to the capacitor line 115 which supplies a constant potential, and a liquid crystal element 108. A pixel electrode of the liquid crystal element 108 is electrically connected to the drain electrode of the transistor 103 and the one electrode of the capacitor 105, and an electrode (counter electrode) facing the pixel electrode is electrically connected to a wiring which supplies a common potential.

The liquid crystal element 108 is an element which controls transmission of light by an optical modulation action of liquid crystal which is sandwiched between a substrate provided with the transistor 103 and the pixel electrode and a substrate provided with the counter electrode. The optical modulation action of liquid crystal is controlled by an electric field applied to the liquid crystal (including a vertical electric field and a diagonal electric field). In the case where a counter electrode (also referred to as a common electrode) is provided over the substrate where the pixel electrode is provided, an electric field applied to liquid crystal is a transverse electric field.

Figure 2:
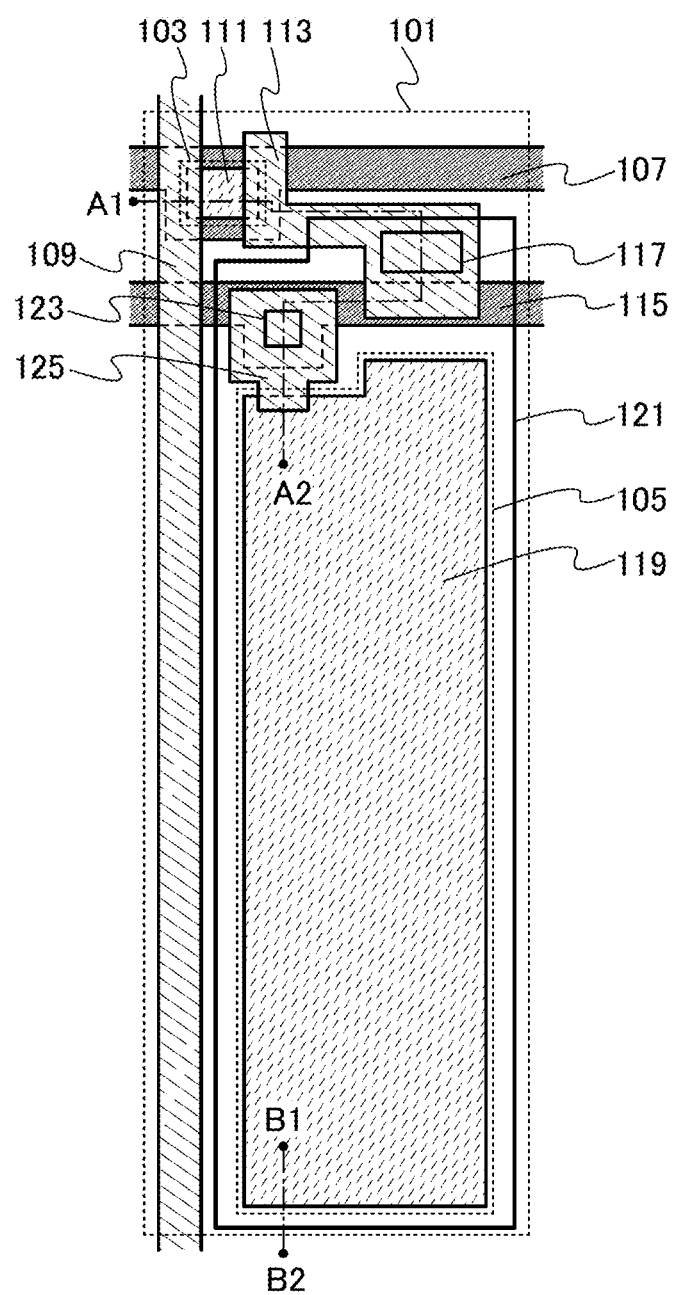
FIG. 2 is a top view illustrating a semiconductor device of one embodiment of the present invention.

Next, a specific example of the pixel 101 of the liquid crystal display device will be described. FIG. 2 is a top view of the pixel 101. Note that in FIG. 2, the counter electrode and the liquid crystal element are omitted.

In FIG. 2, the scan line 107 is provided so as to extend in the direction perpendicular or substantially perpendicular to the signal line 109 (in the horizontal direction in the drawing). The signal line 109 is provided so as to extend in the direction perpendicular or substantially perpendicular to the scan line 107 (in the vertical direction in the drawing). The capacitor line 115 is provided so as to extend in the direction parallel with the scan line 107. The scan line 107 and the capacitor line 115 are electrically connected to the scan line driver circuit 104 (see FIG. 1A), and the signal line 109 is electrically connected to the signal line driver circuit 106 (see FIG. 1A).

The transistor 103 is provided in a region where the scan line 107 and the signal line 109 cross each other. The transistor 103 includes at least a semiconductor film 111 including a channel formation region, a gate electrode, a gate insulating film (not illustrated in FIG. 2), a source electrode, and a drain electrode. A portion of the scan line 107 which overlaps with the semiconductor film 111 functions as the gate electrode of the transistor 103. A portion of the signal line 109 which overlaps with the semiconductor film 111 functions as the source electrode of the transistor 103. A portion of a conductive film 113 which overlaps with the semiconductor film 111 functions as the drain electrode of the transistor 103. Thus, the gate electrode, the source electrode, and the drain electrode may be referred to as the scan line 107, the signal line 109, and the conductive film 113, respectively. Further, in FIG. 2, an edge of the scan line 107 is on the outer side than an edge of the semiconductor film when seen from above. Thus, the scan line 107 functions as a light-blocking film for blocking light from a light source such as a backlight. For this reason, the semiconductor film 111 included in the transistor is not irradiated with light, so that variations in the electrical characteristics of the transistor can be reduced.

Further, an oxide semiconductor processed under appropriate conditions can significantly reduce the off-state current of a transistor; therefore, such an oxide semiconductor is used for the semiconductor film 111 in one embodiment of the present invention. Thus, power consumption of a semiconductor device can be reduced.

The conductive film 113 is electrically connected to a pixel electrode 121 formed using a light-transmitting conductive film, through an opening 117. In FIG. 2, the hatch pattern of the pixel electrode 121 is not illustrated.

The capacitor 105 is provided in a region of the pixel 101 and located on the inner sides of the capacitor lines 115 and the signal lines 109. The capacitor 105 is electrically connected to the capacitor line 115 through a conductive film 125 provided in and over an opening 123. The capacitor 105 includes a semiconductor film 119 including an oxide semiconductor, the pixel electrode 121, and an insulating film (not illustrated in FIG. 2) which is formed as a dielectric film over the transistor 103. The semiconductor film 119, the pixel electrode 121, and the dielectric film transmit light; accordingly, the capacitor 105 transmits light.

Thanks to the light-transmitting property of the semiconductor film 119, the capacitor 105 can be formed large (in a large area) in the pixel 101. Thus, a semiconductor device having charge capacity increased while improving the aperture ratio, to typically 55% or more, preferably 60% or more can be obtained. For example, in a semiconductor device with a high resolution such as a liquid crystal display device, the area of a pixel is small and thus the area of a capacitor is also small. For this reason, the capacity of charge stored in the capacitor is small. However, since the capacitor 105 of this embodiment transmits light, when it is provided in a pixel, enough charge capacity can be obtained in the pixel and the aperture ratio can be improved. Typically, the capacitor 105 can be favorably used in a high-resolution semiconductor device with a pixel density of 200 ppi or more, or furthermore, 300 ppi or more. Further, according to one embodiment of the present invention, the aperture ratio can be improved even in a display device with a high resolution, which makes it possible to use light from a light source such as a backlight efficiently, so that power consumption of the display device can be reduced.

Here, the characteristics of a transistor including an oxide semiconductor will be described. The transistor including an oxide semiconductor is an n-channel transistor. Further, carriers might be generated due to oxygen vacancies in the oxide semiconductor, which might degrade the electrical characteristics and reliability of the transistor. For example, in some cases, the threshold voltage of the transistor is shifted in the negative direction, and drain current flows when the gate voltage is 0 V. A transistor in which drain current flows when the gate voltage is 0 V is referred to as a normally-on transistor, whereas a transistor in which substantially no drain current flows when the gate voltage is 0 V is referred to as a normally-off transistor.

In view of the above, it is preferable that defects in an oxide semiconductor film as the semiconductor film 111, typically, oxygen vacancies be reduced as much as possible when an oxide semiconductor is used for the semiconductor film 111. For example, it is preferable that the spin density of the oxide semiconductor film (the density of defects in the oxide semiconductor film) at a g-value of 1.93 in electron spin resonance spectroscopy in which a magnetic field is applied in parallel with the film surface be reduced to lower than or equal to the lower detection limit of measurement equipment. When the defects typified by oxygen vacancies in the oxide semiconductor film are reduced as much as possible, the transistor 103 can be prevented from being normally on, leading to improvements in the electrical characteristics and reliability of a semiconductor device.

The shift of the threshold voltage of a transistor in the negative direction is caused by hydrogen (including a hydrogen compound such as water) contained in an oxide semiconductor in some cases as well as by oxygen vacancies. Hydrogen contained in the oxide semiconductor is reacted with oxygen bonded to a metal atom to be water, and in addition, vacancies (also referred to as oxygen vacancies) are formed in a lattice from which oxygen is released (or a portion from which oxygen is removed). In addition, the reaction of part of hydrogen and oxygen causes generation of electrons serving as carriers. Thus, a transistor including an oxide semiconductor which contains hydrogen is likely to be normally on.

In view of the above, when an oxide semiconductor is used for the semiconductor film 111, it is preferable that hydrogen in the oxide semiconductor film as the semiconductor film 111 be reduced as much as possible. Specifically, the concentration of hydrogen in the semiconductor film 111, which is measured by secondary ion mass spectrometry (SIMS), is set to lower than $5 \times 10^{18}$ atoms/cm$^3$, preferably lower than or equal to $1 \times 10^{18}$ atoms/cm$^3$, more preferably lower than or equal to $5 \times 10^{17}$ atoms/cm$^3$, still more preferably lower than or equal to $1 \times 10^{16}$ atoms/cm$^3$.

The concentration of alkali metals or alkaline earth metals in the semiconductor film 111, which is measured by secondary ion mass spectrometry (SIMS), is set to lower than or equal to $1 \times 10^{18}$ atoms/cm$^3$, preferably lower than or equal to $2 \times 10^{16}$ atoms/cm$^3$. This is because an alkali metal and an alkaline earth metal might generate carriers when bonded to an oxide semiconductor, in which case the off-state current of the transistor 103 might be increased.

Further, when nitrogen is contained in the oxide semiconductor film as the semiconductor film 111, electrons serving as carriers are generated and the carrier density increases, so that the oxide semiconductor film easily becomes n-type. Thus, a transistor including an oxide semiconductor which contains nitrogen is likely to be normally on. For this reason, nitrogen in the oxide semiconductor film is preferably reduced as much as possible; the concentration of nitrogen is preferably set to, for example, lower than or equal to $5 \times 10^{18}$ atoms/cm$^3$.

When such an oxide semiconductor film highly purified by reducing impurities (such as hydrogen, nitrogen, an alkali metal, and an alkaline earth metal) as much as possible is used as the semiconductor film 111, the transistor 103 can be prevented from being normally on, so that the off-state current of the transistor 103 can be significantly reduced. Therefore, a semiconductor device having favorable electrical characteristics can be fabricated. Further, a highly reliable semiconductor device can be fabricated.

Various experiments can prove the low off-state current of a transistor including a highly-purified oxide semiconductor film. For example, even when an element has a channel width of $1 \times 10^6$ μm and a channel length (L) of 10 μm, the off-state current can be less than or equal to the measurement limit of a semiconductor parameter analyzer, i.e., less than or equal to $1 \times 10^{-13}$ A, at a voltage (drain voltage) between a source electrode and a drain electrode of from 1 V to 10 V. In this case, it can be seen that the off-state current corresponding to a value obtained by dividing the off-state current by the channel width of the transistor is 100 zA/μm or lower. Further, the off-state current was measured with the use of a circuit in which a capacitor and a transistor are connected to each other and charge that flows in or out from the capacitor is controlled by the transistor. In the measurement, a purified oxide semiconductor film was used for a channel formation region of the transistor, and the off-state current of the transistor was measured from a change in the amount of charge of the capacitor per unit time. As a result, it is found that in the case where the voltage between a source electrode and a drain electrode of the transistor is 3 V, a lower off-state current of several tens of yoctoamperes per micrometer (yA/μm) can be achieved. Thus, the transistor including the highly purified oxide semiconductor film has a significantly low off-state current.

Figure 3:
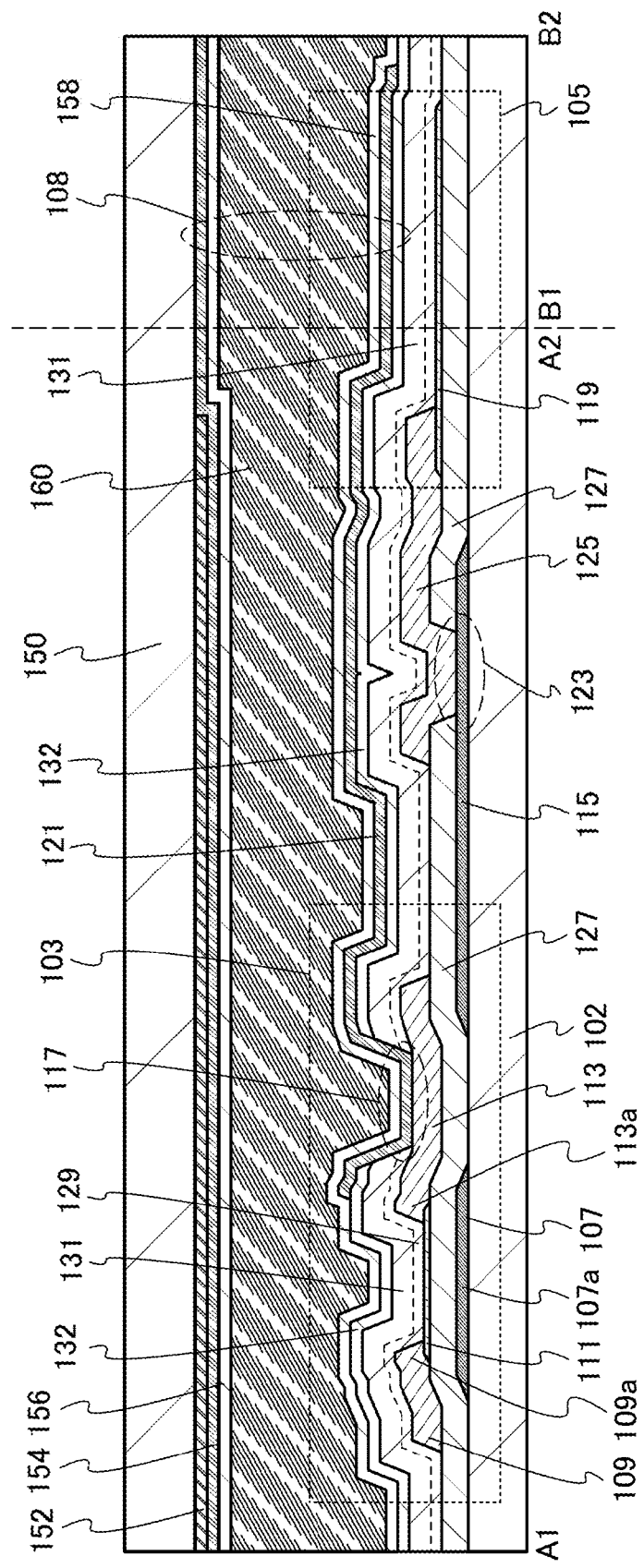
FIG. 3 is a cross-sectional view illustrating a semiconductor device of one embodiment of the present invention.

Next, FIG. 3 is a cross-sectional view taken along dashed-dotted lines A1-A2 and B1-B2 in FIG. 2.

A cross-sectional structure of the pixel 101 of the liquid crystal display device is as follows. The liquid crystal display device includes an element portion over a substrate 102, an element portion on a substrate 150, and a liquid crystal layer sandwiched between the two element portions.

First, the structure of the element portion over the substrate 102 will be described. The scan line 107 including a gate electrode 107a of the transistor 103 and the capacitor line 115 over the same surface as the scan line 107 are provided over the substrate 102. A gate insulating film 127 is provided over the scan line 107 and the capacitor line 115.

The semiconductor film 111 is provided over a portion of the gate insulating film 127 which overlaps with the scan line 107, and the semiconductor film 119 is provided over the gate insulating film 127. The signal line 109 including a source electrode 109a of the transistor 103 and the conductive film 113 including a drain electrode 113a of the transistor 103 are provided over the semiconductor film 111 and the gate insulating film 127. An opening 123 reaching the capacitor line 115 is formed in the gate insulating film 127, and the conductive film 125 is provided in and over the opening 123 and over the gate insulating film 127 and the semiconductor film 119. An insulating film 129, an insulating film 131, and an insulating film 132 functioning as protective insulating films of the transistor 103 are provided over the gate insulating film 127, the signal line 109, the semiconductor film 111, the conductive film 113, the conductive film 125, and the semiconductor film 119. The opening 117 reaching the conductive film 113 is formed in the insulating film 129, the insulating film 131, and the insulating film 132, and the pixel electrode 121 is provided in the opening 117 and over the insulating film 132. An insulating film 158 functioning as an alignment film is provided over the pixel electrode 121 and the insulating film 132. Note that a base insulating film may be provided between the substrate 102 and each of the scan line 107, the capacitor line 115, and the gate insulating film 127.

In the capacitor 105 described in this embodiment, the semiconductor film 119 formed in a manner similar to that of the semiconductor film 111 serves as one of a pair of electrodes, the pixel electrode 121 serves as the other of the pair of electrodes, and the insulating film 129, the insulating film 131, and the insulating film 132 serve as a dielectric film provided between the pair of electrodes.

The details of the components of the above structure will be described below.

Although there is no particular limitation on a material and the like of the substrate 102, it is necessary that the substrate have heat resistance high enough to withstand at least heat treatment performed in a fabrication process of a semiconductor device. Examples of the substrate are a glass substrate, a ceramic substrate, and a plastic substrate, and as the glass substrate, an alkali-free glass substrate such as a barium borosilicate glass substrate, an aluminoborosilicate glass substrate, or an aluminosilicate glass substrate is preferably used. Alternatively, a non-light-transmitting substrate such as a stainless alloy substrate may be used, in which case a surface of the substrate is preferably provided with an insulating film. As the substrate 102, any of the following may alternatively be used: a quartz substrate, a sapphire substrate, a single crystal semiconductor substrate, a polycrystalline semiconductor substrate, a compound semiconductor substrate, and a silicon on insulator (SOI) substrate.

The scan line 107 and the capacitor line 115, through which a large amount of current flows, are preferably formed using a metal film; typically, they are formed to have a single-layer structure or a layered structure using any of metal materials such as molybdenum (Mo), titanium (Ti), tungsten (W), tantalum (Ta), aluminum (Al), copper (Cu), chromium (Cr), neodymium (Nd), or scandium (Sc), or an alloy material which contains any of these materials as its main component.

Examples of the scan line 107 and the capacitor line 115 are a single-layer structure using aluminum containing silicon, a two-layer structure in which titanium is stacked over aluminum, a two-layer structure in which titanium is stacked over titanium nitride, a two-layer structure in which tungsten is stacked over titanium nitride, a two-layer structure in which tungsten is stacked over tantalum nitride, a two-layer structure in which copper is stacked over Cu—Mg—Al alloy, and a three-layer structure in which titanium nitride, copper, and tungsten are stacked in this order.

As a material of the scan line 107 and the capacitor line 115, a light-transmitting conductive material which can be used for the pixel electrode 121 can be used.

Alternatively, as a material of the scan line 107 and the capacitor line 115, a metal oxide containing nitrogen, specifically, an In—Ga—Zn-based oxide containing nitrogen, an In—Sn-based oxide containing nitrogen, an In—Ga-based oxide containing nitrogen, an In—Zn-based oxide containing nitrogen, a Sn-based oxide containing nitrogen, an In-based oxide containing nitrogen, or a metal nitride (InN, SnN, or the like) can be used. These materials each have a work function higher than or equal to 5 eV (electron volts). When such an oxide semiconductor is used for the semiconductor film 111 in the transistor 103, the use of a metal oxide containing nitrogen for the scan line 107 (the gate electrode of the transistor 103) allows the threshold voltage of the transistor 103 to be shifted in the positive direction, i.e., the transistor can be normally off. For example, in the case of using an In—Ga—Zn-based oxide containing nitrogen, an In—Ga—Zn-based oxide having at least a higher nitrogen concentration than the semiconductor film 111, specifically, an In—Ga—Zn-based oxide having a nitrogen concentration of 7 at. % or higher can be used.

The scan line 107 and the capacitor line 115 are preferably formed using aluminum or copper, which are low resistance materials. With the use of aluminum or copper, signal delay is reduced, so that higher image quality can be achieved. Note that aluminum has low heat resistance, and thus a defect due to hillocks, whiskers, or migration is easily generated. To prevent migration of aluminum, a layer of a metal material having a higher melting point than aluminum, such as molybdenum, titanium, or tungsten, is preferably stacked over an aluminum layer. Also in the case where copper is used, in order to prevent a defect due to migration and diffusion of copper element, a layer of a metal material having a higher melting point than copper, such as molybdenum, titanium, or tungsten, is preferably stacked over a copper layer.

The gate insulating film 127 is formed to have a single-layer structure or a layered structure using, for example, any of insulating materials such as silicon oxide, silicon oxynitride, silicon nitride oxide, silicon nitride, aluminum oxide, hafnium oxide, gallium oxide, and a Ga—Zn-based metal oxide. In order to improve the characteristics of the interface between the gate insulating film 127 and the oxide semiconductor film as the semiconductor film 111, a region in the gate insulating film 127 which is in contact with at least the semiconductor film 111 is preferably formed using an oxide insulating film.

Further, it is possible to prevent outward diffusion of oxygen from the oxide semiconductor film as the semiconductor film 111 and entry of hydrogen, water, or the like into the oxide semiconductor film from the outside by providing an insulating film having a barrier property against oxygen, hydrogen, water, and the like under the gate insulating film 127. Examples of the insulating film having a barrier property against oxygen, hydrogen, water, and the like are an aluminum oxide film, an aluminum oxynitride film, a gallium oxide film, a gallium oxynitride film, an yttrium oxide film, an yttrium oxynitride film, a hafnium oxide film, a hafnium oxynitride film, and a silicon nitride film.

The gate insulating film 127 may be formed using a high-k material such as hafnium silicate (HfSiO$_x$), hafnium silicate containing nitrogen (HfSi$_x$O$_y$N$_z$), hafnium aluminate containing nitrogen (HfAl$_x$O$_y$N$_z$), hafnium oxide, or yttrium oxide, in which case gate leakage current of the transistor 103 can be reduced.

The gate insulating film 127 preferably has the following layered structure. It is preferable that a silicon nitride film having fewer defects be provided as a first silicon nitride film, a silicon nitride film from which less hydrogen and ammonia are released be provided as a second silicon nitride film over the first silicon nitride film, and any of the oxide insulating films listed as those used for the gate insulating film 127 be provided over the second silicon nitride film.

As the second silicon nitride film, a nitride insulating film which releases hydrogen molecules less than 5×10$^{21}$ molecules/cm$^3$, preferably less than or equal to 3×10$^{21}$ molecules/cm$^3$, more preferably less than or equal to 1×10$^{21}$ molecules/cm$^3$, and ammonia molecules less than 1×10$^{22}$ molecules/cm$^3$, preferably less than or equal to 5×10$^{21}$ molecules/cm$^3$, more preferably less than or equal to 1×10$^{21}$ molecules/cm$^3$ by thermal desorption spectroscopy is preferably used. The first silicon nitride film and the second silicon nitride film are used as part of the gate insulating film 127, whereby a gate insulating film which has fewer defects and from which less hydrogen and ammonia are released can be formed as the gate insulating film 127. Thus, the amount of hydrogen and nitrogen contained in the gate insulating film 127 which enter the semiconductor film 111 can be reduced.

In the case where the trap level (also referred to as interface level) is present at the interface between an oxide semiconductor film and a gate insulating film or in the gate insulating film in a transistor including an oxide semiconductor, a shift of the threshold voltage of the transistor, typically, a shift of the threshold voltage in the negative direction, and an increase in the subthreshold swing (S value) showing a gate voltage needed for changing the drain current by an order of magnitude when the transistor is turned on are caused. As a result, there is a problem in that electrical characteristics vary among transistors. Therefore, the use of a silicon nitride film having fewer defects as a gate insulating film and provision of an oxide insulating film in contact with the semiconductor film 111 can reduce a shift of the threshold voltage in the negative direction and minimize an increase in S value.

The thickness of the gate insulating film 127 is greater than or equal to 5 nm and less than or equal to 400 nm, preferably greater than or equal to 10 nm and less than or equal to 300 nm, more preferably greater than or equal to 50 nm and less than or equal to 250 nm.

The semiconductor film 111 and the semiconductor film 119 are oxide semiconductor films which can be amorphous, single-crystalline, or polycrystalline. Further, the semiconductor film 111 and the semiconductor film 119 are formed using the same metal element. The thickness of the semiconductor film 111 is greater than or equal to 1 nm and less than or equal to 100 nm, preferably greater than or equal to 1 nm and less than or equal to 50 nm, more preferably greater than or equal to 1 nm and less than or equal to 30 nm, still more preferably greater than or equal to 3 nm and less than or equal to 20 nm.

An oxide semiconductor which can be used for the semiconductor film 111 and the semiconductor film 119 has an energy gap of greater than or equal to 2 eV, preferably greater than or equal to 2.5 eV, more preferably greater than or equal to 3 eV. The use of such an oxide semiconductor having a wide energy gap can reduce the off-state current of the transistor 103.

An oxide semiconductor used for the semiconductor film 111 is preferably a metal oxide containing at least indium (In) or zinc (Zn). Alternatively, the oxide semiconductor is preferably a metal oxide containing both In and Zn. In order to reduce variations in electrical characteristics of the transistors including the oxide semiconductor, the oxide semiconductor preferably contains one or more stabilizers in addition to one of or both In and Zn.

Examples of stabilizers are gallium (Ga), tin (Sn), hafnium (Hf), aluminum (Al), and zirconium (Zr). The other examples of stabilizers are lanthanoids such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu).

For an oxide semiconductor which can be used for the semiconductor film 111 and the semiconductor film 119, for example, the following can be used: an indium oxide; a tin oxide; a zinc oxide; an oxide containing two kinds of metals, such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide; an oxide containing three kinds of metals, such as an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—Zr—Zn-based oxide, an In—Ti—Zn-based oxide, an In—Sc—Zn-based oxide, an In—Y—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; or an oxide containing four kinds of metals, such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide.

Here, an "In—Ga—Zn-based oxide" means an oxide containing In, Ga, and Zn as its main components and there is no particular limitation on the ratio of In, Ga, and Zn. Further, the In—Ga—Zn-based oxide may contain a metal element other than In, Ga, and Zn.

Alternatively, a material represented by InMO$_3$(ZnO)$_m$ (m>0) may be used as an oxide semiconductor. Note that M represents one or more metal elements selected from Ga, Fe, Mn, and Co, or the above element as a stabilizer.

For example, an In—Ga—Zn-based metal oxide with an atomic ratio of In:Ga:Zn=1:1:1 (=1/3:1/3:1/3), In:Ga:Zn=2:2:1 (=2/5:2/5:1/5), or In:Ga:Zn=3:1:2 (=1/2:1/6:1/3). Alternatively, an In—Sn—Zn-based oxide with an atomic ratio of In:Sn:Zn=1:1:1 (=1/3:1/3:1/3), In:Sn:Zn=2:1:3 (=1/3:1/6:1/2), or In:Sn:Zn=2:1:5 (=1/4:1/8:5/8) may be used. Note that the proportion of each atom in the atomic ratio of the metal oxide varies within a range of ±20% as an error.

Note that without limitation to the materials given above, a material with an appropriate atomic ratio depending on semiconductor characteristics and electrical characteristics (field-effect mobility, threshold voltage, variation, and the like) may be used. Further, it is preferable to appropriately set the carrier density, the impurity concentration, the defect density, the atomic ratio of a metal element and oxygen, the interatomic distance, the density, or the like in order to obtain necessary semiconductor characteristics. For example, high field-effect mobility can be achieved relatively easily in the case of using an In—Sn—Zn oxide. Also in the case of using an In—Ga—Zn-based oxide, field-effect mobility can be increased by reducing the defect density in a bulk.

The signal line 109 including the source electrode 109a of the transistor 103, the conductive film 113 including the drain electrode of the transistor 103, and the conductive film 125 electrically connecting the semiconductor film 119 and the capacitor line 115 in the capacitor 105 can be formed to have a single-layer structure or a layered structure using a material which can be used for the scan line 107 and the capacitor line 115.

The insulating films 129, 131, and 132 functioning as the protective insulating films of the transistor 103 and the dielectric film in the capacitor 105 are insulating films each formed using a material which can be used for the gate insulating film 127. It is particularly preferable that the insulating films 129 and 131 be oxide insulating films and the insulating film 132 be a nitride insulating film. Further, the use of a nitride insulating film as the insulating film 132 can suppress entry of impurities such as hydrogen and water into the transistor 103 (in particular, the semiconductor film 111) from the outside. Note that the insulating film 129 is not necessarily provided.

Further, an oxide insulating film in which the oxygen content is higher than that in the stoichiometric composition is preferably used as one of or both the insulating film 129 and the insulating film 131. In that case, oxygen can be prevented from being released from the oxide semiconductor film, and the oxygen contained in the oxide insulating film can enter the oxide semiconductor film to reduce oxygen vacancies. For example, when an oxide insulating film having the following feature is used, oxygen vacancies in the oxide semiconductor film can be reduced. The feature of the oxide insulating film is that the number of oxygen molecules released from the oxide insulating film is greater than or equal to $1.0 \times 10^{18}/cm^3$ when measured by thermal desorption spectroscopy (hereinafter referred to as TDS spectroscopy). Note that an oxide insulating film partly including a region in which the oxygen content is higher than that in the stoichiometric composition (oxygen excess region) may be used as one of or both the insulating film 129 and the insulating film 131. When such an oxygen excess region is present in a region overlapping with at least the semiconductor film 111, oxygen is prevented from being released from the oxide semiconductor film and the oxygen contained in the oxygen excess region can enter the oxide semiconductor film to reduce oxygen vacancies.

In the case where the insulating film 131 is an oxide insulating film in which the oxygen content is higher than that in the stoichiometric composition, the insulating film 129 is preferably an oxide insulating film through which oxygen penetrates. Oxygen which enters the insulating film 129 from the outside does not completely penetrate through the insulating film 129 to be released and part thereof remains in the insulating film 129. Further, there is oxygen which is contained in the insulating film 129 from the first and is released from the insulating film 129 to the outside. Thus, the insulating film 129 preferably has a high coefficient of diffusion of oxygen.

Since the insulating film 129 is in contact with the oxide semiconductor film as the semiconductor film 111, the insulating film 129 is preferably an oxide insulating film through which oxygen penetrates and which has a low interface state with the semiconductor film 111. For example, the insulating film 129 is preferably an oxide insulating film having a lower defect density than the insulating film 131. Specifically, the spin density of the oxide insulating film at a g-value of 2.001 (E'-center) measured by electron spin resonance spectroscopy is lower than or equal to $3.0 \times 10^{17}$ spins/cm$^3$, preferably lower than or equal to $5.0 \times 10^{16}$ spins/cm$^3$. The spin density at a g-value of 2.001 measured by electron spin resonance spectroscopy corresponds to the number of dangling bonds in the insulating film 129.

The insulating film 129 can have a thickness of greater than or equal to 5 nm and less than or equal to 150 nm, preferably greater than or equal to 5 nm and less than or equal to 50 nm, more preferably greater than or equal to 10 nm and less than or equal to 30 nm. The insulating film 131 can have a thickness of greater than or equal to 30 nm and less than or equal to 500 nm, preferably greater than or equal to 150 nm and less than or equal to 400 nm.

In the case where a nitride insulating film is used as the insulating film 132, an insulating film having a barrier property against nitrogen is preferably used as one of or both the insulating film 129 and the insulating film 131. For example, a dense oxide insulating film can have a barrier property against nitrogen. Specifically, an oxide insulating film which can be etched at a rate of less than or equal to 10 nm per minute when the temperature is 25° C. and 0.5 wt % of fluoric acid is used is preferably used.

In the case where an oxide insulating film containing nitrogen, such as a silicon oxynitride film or a silicon nitride oxide film, is used as one of or both the insulating film 129 and the insulating film 131, the nitrogen concentration measured by SIMS is greater than or equal to the lower limit of measurement by SIMS and less than $3 \times 10^{20}$ atoms/cm$^3$, preferably greater than or equal to $1 \times 10^{18}$ atoms/cm$^3$ and less than or equal to $1 \times 10^{20}$ atoms/cm$^3$. In that case, the amount of nitrogen which enters the semiconductor film 111 included in the transistor 103 can be reduced and the number of defects in the nitrogen-containing oxide insulating film itself can be reduced.

As the insulating film 132, a nitride insulating film where the hydrogen content is low may be provided. The nitride insulating film is as follows, for example: the number of hydrogen molecules released from the nitride insulating film is less than $5.0 \times 10^{21}/cm^3$, preferably less than $3.0 \times 10^{21}/cm^3$, more preferably less than $1.0 \times 10^{21}/cm^3$ when measured by TDS spectroscopy.

The insulating film 132 has a thickness large enough to prevent entry of impurities such as hydrogen and water from the outside. For example, the thickness can be greater than or equal to 50 nm and less than or equal to 200 nm, preferably greater than or equal to 50 nm and less than or equal to 150 nm, more preferably greater than or equal to 50 nm and less than or equal to 100 nm.

Further, a silicon oxide film formed by a CVD method using an organosilane gas may be provided between the insulating film 131 and the insulating film 132. The silicon oxide film has excellent step coverage and thus can be advantageously used as a protective insulating film of the transistor 103. The silicon oxide film can be formed to a thickness of 300 nm to 600 nm inclusive. As the organosilane gas, any of the following silicon-containing compound can be used: tetraethyl orthosilicate (TEOS) (chemical formula: $Si(OC_2H_5)_4$); tetramethylsilane (TMS) (chemical formula: $Si(CH_3)_4$); tetramethylcyclotetrasiloxane (TMCTS); octamethylcyclotetrasiloxane (OMCTS); hexamethyldisilazane (HMDS); triethoxysilane (SiH(OC$_2$H$_5$)$_3$); trisdimethylaminosilane (SiH(N(CH$_3$)$_2$)$_3$); or the like.

According to the above description, when the silicon oxide film is provided between the insulating film 131 and the insulating film 132 and the nitride insulating film is used as the insulating film 132, entry of impurities such as hydrogen and water into the semiconductor film 111 and the semiconductor film 119 from the outside can be further suppressed.

The pixel electrode 121 is formed using a light-transmitting conductive film. The light-transmitting conductive film is formed using a light-transmitting conductive material such as an indium tin oxide, an indium oxide containing a tungsten oxide, an indium zinc oxide containing a tungsten oxide, an indium oxide containing a titanium oxide, an indium tin oxide containing a titanium oxide, an indium zinc oxide, or an indium tin oxide to which a silicon oxide is added.

Next, the structure of the element portion on the substrate 150 will be described. The element portion includes a light-blocking film 152 which is in contact with the substrate 150, an electrode (a counter electrode 154) which is in contact with the light-blocking film 152 and is provided so as to face the pixel electrode 121, and an insulating film 156 which is in contact with the counter electrode 154 and functions as an alignment film.

The light-blocking film 152 prevents the transistor 103 from being irradiated with light from a light source such as a backlight or the outside. The light-blocking film 152 can be formed using a material such as a metal or an organic resin including a pigment and may be provided in a region outside the pixel portion 100, such as over the scan line driver circuit 104 and over the signal line driver circuit 106 (see FIG. 1A), as well as over the transistor 103 in the pixel 101.

Note that a coloring film which transmits light with a predetermined wavelength may be provided across a space between light-blocking films 152 adjacent to each other. Further, an overcoat film may be provided between the counter electrode 154, and the light-blocking films 152 and the coloring film.

The counter electrode 154 is formed using any of the light-transmitting conductive materials given as those used for the pixel electrode 121 as appropriate.

The liquid crystal element 108 includes the pixel electrode 121, the counter electrode 154, and a liquid crystal layer 160. The liquid crystal layer 160 is sandwiched between the insulating film 158 which is provided in the element portion over the substrate 102 and functions as an alignment film and the insulating film 156 which is provided in the element portion on the substrate 150 and functions as an alignment film. Further, the pixel electrode 121 overlaps with the counter electrode 154 with the liquid crystal layer 160 interposed therebetween.

The insulating films 156 and 158 functioning as alignment films can be formed using a general-purpose material such as polyamide.

Here, connection of the components included in the pixel 101 described in this embodiment will be described with reference to the circuit diagram in FIG. 1C and the cross-sectional view in FIG. 3.

Figure 1C:
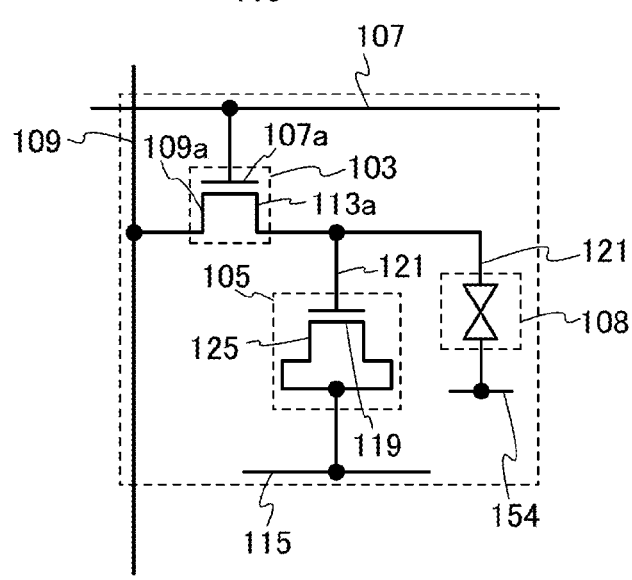

FIG. 1C is an example of a detailed circuit diagram of the pixel 101 included in the semiconductor device illustrated in FIG. 1A. As illustrated in FIG. 1C and FIG. 3, the transistor 103 includes the scan line 107 including the gate electrode 107a, the signal line 109 including the source electrode 109a, and the conductive film 113 including the drain electrode 113a.

In the capacitor 105, the semiconductor film 119 connected to the capacitor line 115 through the conductive film 125 functions as one electrode; the pixel electrode 121 connected to the conductive film 113 including the drain electrode 113a functions as the other electrode; and the insulating films 129, 131, and 132 provided between the semiconductor film 119 and the pixel electrode 121 function as a dielectric film.

The liquid crystal element 108 includes the pixel electrode 121, the counter electrode 154, and the liquid crystal layer 160 provided between the pixel electrode 121 and the counter electrode 154.

Figure 38:
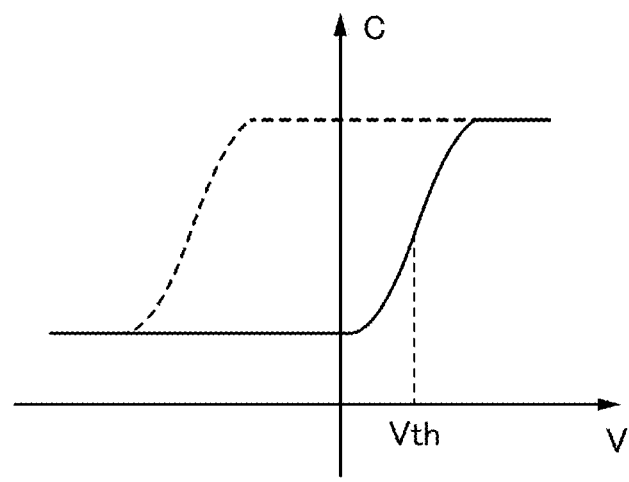
FIG. 38 is a graph showing a capacitor included in a semiconductor device of one embodiment of the present invention.
Figure 39A:
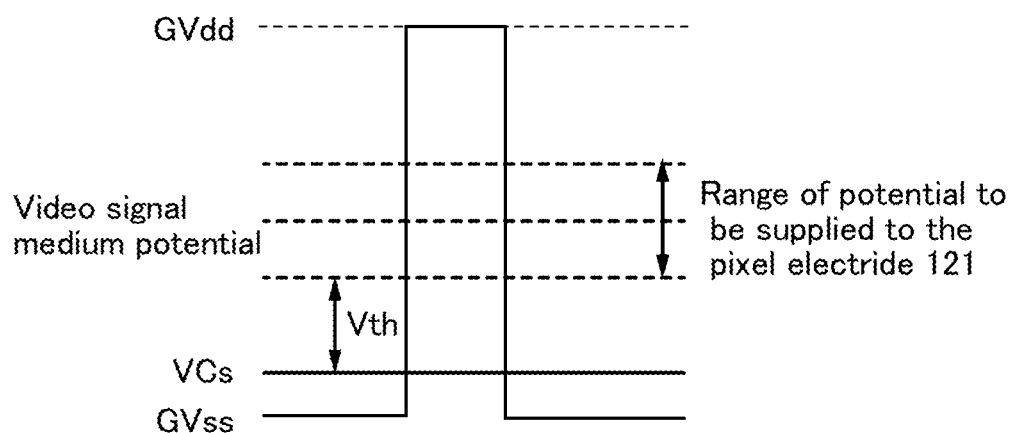
FIGS. 39A and 39B each illustrate an operating method of a capacitor included in a semiconductor device of one embodiment of the present invention.
Figure 39B:
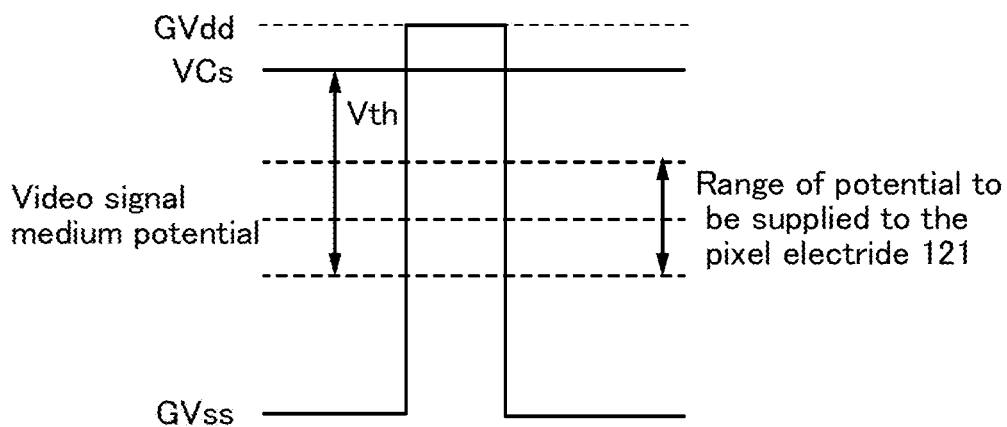

Despite having a structure which is the same as that of the semiconductor film 111, the semiconductor film 119 in the capacitor 105 functions as the electrode of the capacitor 105. This is because the pixel electrode 121 can function as a gate electrode, the insulating films 129, 131, and 132 can function as gate insulating films, and a capacitor line 315 can function as a source electrode or a drain electrode, so that the capacitor 105 can be operated in a manner similar to that of a transistor and the semiconductor film 119 can be made to be in a conductive state. In other words, the capacitor 105 can be a metal oxide semiconductor (MOS) capacitor. Power is supplied to a MOS capacitor when a voltage higher than the threshold voltage (Vth) is applied to one electrode of the MOS capacitor (the pixel electrode 121 of the capacitor 105) as shown in FIG. 38. In FIG. 38, the horizontal axis indicates voltage (V) applied to the pixel electrode, and the longitudinal axis indicates capacitance (C). In the case where the frequency of a voltage in capacitance-voltage measurement (CV measurement) is lower than frame frequency, a CV curve in FIG. 38 is obtained, i.e., the threshold voltage Vth is higher than or equal to 0 V. Further, the semiconductor film 119 can be made to be in a conductive state so that the semiconductor film 119 can function as one electrode of the capacitor by controlling a potential to be supplied to the capacitor line 115. In this case, the potential to be supplied to the capacitor line 115 is set as follows as in FIG. 39A. The potential of the pixel electrode 121 is changed in the positive direction and the negative direction relative to the medium potential of a video signal in order to operate the liquid crystal element 108 (see FIG. 1C). The potential (VCs) of the capacitor line 115 needs to be constantly lower than the potential to be supplied to the pixel electrode 121 by the threshold voltage (Vth) of the capacitor 105 (MOS capacitor) or more in order that the capacitor 105 (MOS capacitor) be constantly in a conductive state. In other words, since the semiconductor film 119 has the same structure as the semiconductor film 111, the potential (VCs) of the capacitor line 115 should be lower than the potential to be supplied to the pixel electrode 121 by the threshold voltage of the transistor 103 or more. In such a manner, the semiconductor film 119 can be made to be constantly in a conductive state. In FIGS. 39A and 39B, GVss refers to a low-level potential to be supplied to the gate electrode and GVdd refers to a high-level potential to be supplied to the gate electrode to turn on the transistor 103.

When an oxide insulating film through which oxygen penetrates and which has fewer interface states between the semiconductor film 111 and the oxide insulating film is used as the insulating film 129 over the semiconductor film 111 and an oxide insulating film which includes an oxygen excess region or an oxide insulating film in which the oxygen content is higher than that in the stoichiometric composition is used as the insulating film 131, oxygen can be easily supplied to the oxide semiconductor film as the semiconductor film 111, the release of oxygen from the oxide semiconductor film can be prevented, and the oxygen contained in the insulating film 131 can enter the oxide semiconductor film to reduce oxygen vacancies in the oxide semiconductor film. Thus, the transistor 103 can be prevented from being normally on and a potential to be supplied to the capacitor line 115 can be controlled so that the capacitor 105 (MOS capacitor) can be constantly in a conductive state; thus, the semiconductor device can have favorable electrical characteristics and high reliability.

The use of a nitride insulating film as the insulating film 132 over the insulating film 131 can suppress entry of impurities such as hydrogen and water into the semiconductor film 111 and the semiconductor film 119 from the outside. Moreover, the use of a nitride insulating film with a low hydrogen content as the insulating film 132 can minimize variations in electrical characteristics of the transistor 103 and the capacitor 105 (MOS capacitor).

Further, the capacitor 105 can be formed large (in a large area) in the pixel 101. Thus, the semiconductor device can have charge capacity increased while improving the aperture ratio. As a result, the semiconductor device can have an excellent display quality.

<Fabrication Method of Semiconductor Device>

Next, a formation method of the element portion over the substrate 102 in the semiconductor device described above will be described with reference to FIGS. 4A and 4B and FIGS. 5A and 5B.

First, the scan line 107 and the capacitor line 115 are formed over the substrate 102. An insulating film 126 which is to be processed into the gate insulating film 127 later is formed so as to cover the scan line 107 and the capacitor line 115. The semiconductor film 111 is formed over a portion of the insulating film 126 which overlaps with the scan line 107. The semiconductor film 119 is formed so as to overlap a region where the pixel electrode 121 is to be formed later (see FIG. 4A).

The scan line 107 and the capacitor line 115 can be formed in such a manner that a conductive film is formed using any of the materials given above, a mask is formed over the conductive film, and processing is performed using the mask. The conductive film can be formed by any of a variety of deposition methods such as an evaporation method, a CVD method, a sputtering method, and a spin coating method. Note that the thickness of the conductive film is not particularly limited and can be determined in consideration of formation time, desired resistivity, and the like. As the mask, a resist mask formed through a first photolithography process can be used. The conductive film can be processed by one of or both dry etching and wet etching.

The insulating film 126 can be formed using a material which can be used for the gate insulating film 127, by any of a variety of deposition methods such as a CVD method and a sputtering method.

In the case where a gallium oxide is used for the gate insulating film 127, the insulating film 126 can be formed by a metal organic chemical vapor deposition (MOCVD) method.

The semiconductor film 111 and the semiconductor film 119 can be formed in such a manner that any of the oxide semiconductor films given above is appropriately selected and formed, a mask is formed over the formed oxide semiconductor film, and processing is performed using the mask. Thus, the semiconductor film 111 and the semiconductor film 119 are formed using the same metal element. The oxide semiconductor film can be formed by a sputtering method, a coating method, a pulsed laser deposition method, a laser ablation method, or the like. Alternatively, when a printing method is employed, the semiconductor films 111 and 119 which are separate from each other can be formed directly on the insulating film 126. In the case where the oxide semiconductor film is formed by a sputtering method, an RF power supply device, an AC power supply device, a DC power supply device, or the like can be used as appropriate as a power supply device for generating plasma. As a sputtering as, a rare gas (typically argon), an oxygen gas, or a mixed gas of a rare gas and oxygen is used as appropriate. In the case of using the mixed gas of a rare gas and oxygen, the proportion of oxygen is preferably higher than that of the rare gas. Further, a target may be appropriately selected in accordance with the composition of an oxide semiconductor film which is to be formed. As the mask, a resist mask formed through a second photolithography process can be used. The oxide semiconductor film can be processed by one of or both dry etching and wet etching. Etching conditions (an etching gas, an etchant, etching time, temperature, and the like) are appropriately set in accordance with a material so that etching can be performed to form a desired shape.

Heat treatment is preferably performed after formation of the semiconductor films 111 and 119 to dehydrate or dehydrogenate the oxide semiconductor films as the semiconductor films 111 and 119. The temperature of the heat treatment is typically higher than or equal to 150° C. and lower than the strain point of the substrate, preferably higher than or equal to 200° C. and lower than or equal to 450° C., more preferably higher than or equal to 300° C. and lower than or equal to 450° C. Note that the heat treatment may be performed on the oxide semiconductor film which has not been processed into the semiconductor films 111 and 119.

A heat treatment apparatus used in the heat treatment is not limited to an electric furnace; as the heat treatment apparatus, an apparatus which heats an object using thermal conduction or thermal radiation given by a medium such as a heated gas may be used. For example, a rapid thermal annealing (RTA) apparatus such as a gas rapid thermal annealing (GRTA) apparatus or a lamp rapid thermal annealing (LRTA) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high-temperature gas.

The heat treatment may be performed in an atmosphere of nitrogen, oxygen, ultra-dry air (air in which the water content is less than or equal to 20 ppm, preferably less than or equal to 1 ppm, more preferably less than or equal to 10 ppb), or a rare gas (e.g., argon or helium). The atmosphere of nitrogen, oxygen, ultra-dry air, or a rare gas preferably does not contain hydrogen, water, and the like. Alternatively, heating may be performed in an inert gas atmosphere first, and then in an oxygen atmosphere. The treatment time is three minutes to 24 hours.

In the case where a base insulating film is provided between the substrate 102, and the scan line 107, the capacitor line 115, and the gate insulating film 127, the base insulating film can be formed using any of the following: silicon oxide, silicon oxynitride, silicon nitride, silicon nitride oxide, gallium oxide, hafnium oxide, yttrium oxide, aluminum oxide, aluminum oxynitride, and the like. The use of silicon nitride, gallium oxide, hafnium oxide, yttrium oxide, aluminum oxide, or the like for the base insulating film leads to suppression of diffusion of impurities typified by an alkali metal, water, and hydrogen into the semiconductor film 111 from the substrate 102. The base insulating film can be formed by a sputtering method or a CVD method.

After an opening 123 reaching the capacitor line 115 is formed in the insulating film 126 to form the gate insulating film 127, the signal line 109 including the source electrode of the transistor 103, the conductive film 113 including the drain electrode of the transistor 103, and the conductive film 125 which electrically connects the semiconductor film 119 and the capacitor line 115 are formed (see FIG. 4B).

The opening 123 can be formed so as to expose part of a portion of the insulating film 126 which overlaps with the capacitor line 115 in such a manner that a mask is formed through a third photolithography process and processing is performed using the mask. The formation of the mask and the processing can be performed in manners similar to those of the scan line 107 and the capacitor line 115.

The signal line 109, the conductive film 113, and the conductive film 125 can be formed in such a manner that a conductive film is formed using a material which can be used for the signal line 109, the conductive film 113, and the conductive film 125, a mask is formed over the conductive film through a fourth photolithography process, and processing is performed using the mask.

Then, an insulating film 128 is formed over the semiconductor film 111, the semiconductor film 119, the signal line 109, the conductive film 113, the conductive film 125, and the gate insulating film 127, an insulating film 130 is formed over the insulating film 128, and an insulating film 133 is formed over the insulating film 130 (see FIG. 5A). The insulating film 128, the insulating film 130, and the insulating film 133 are preferably formed successively, in which case entry of impurities into each interface can be suppressed.

The insulating film 128 can be formed using a material which can be used for the insulating film 129, by any of a variety of deposition methods such as a CVD method and a sputtering method. The insulating film 130 can be formed using a material which can be used for the insulating film 131. The insulating film 133 can be formed using a material which can be used for the insulating film 132.

In the case where an oxide insulating film which has fewer interface states between the semiconductor film 111 and the oxide insulating film is used as the insulating film 129, the insulating film 128 can be formed under the following formation conditions. Here, as the oxide insulating film, a silicon oxide film or a silicon oxynitride film is formed. As for the formation conditions, the substrate placed in a treatment chamber of a plasma CVD apparatus, which is vacuum-evacuated, is held at a temperature higher than or equal to 180° C. and lower than or equal to 400° C., preferably higher than or equal to 200° C. and lower than or equal to 370° C., a deposition gas containing silicon and an oxidizing gas are introduced as a source gas into the treatment chamber, the pressure in the treatment chamber is greater than or equal to 20 Pa and less than or equal to 250 Pa, preferably greater than or equal to 40 Pa and less than or equal to 200 Pa, and high-frequency power is supplied to an electrode provided in the treatment chamber.

Typical examples of the deposition gas containing silicon are silane, disilane, trisilane, and silane fluoride. Examples of the oxidizing gas are oxygen, ozone, dinitrogen monoxide, and nitrogen dioxide.

By setting the ratio of the amount of the oxidizing gas to the amount of the deposition gas containing silicon to 100 or higher, the hydrogen content in the insulating film 128 (the insulating film 129) can be reduced and dangling bonds in the insulating film 128 (the insulating film 129) can be reduced. Oxygen released from the insulating film 130 (the insulating film 131) is captured by the dangling bonds in the insulating film 128 (the insulating film 129) in some cases; thus, in the case where the dangling bonds in the insulating film 128 (the insulating film 129) are reduced, oxygen in the insulating film 130 (the insulating film 131) can enter the semiconductor film 111 and the semiconductor film 119 efficiently to reduce the oxygen vacancies in the oxide semiconductor films as the semiconductor film 111 and the semiconductor film 119. As a result, the amount of hydrogen which enters the oxide semiconductor films can be reduced and oxygen vacancies in the oxide semiconductor films can be reduced.

In the case where the above oxide insulating film which includes an oxygen excess region or the above oxide insulating film in which the oxygen content is higher than that in the stoichiometric composition is used as the insulating film 131, the insulating film 130 can be formed under the following formation conditions. Here, as the oxide insulating film, a silicon oxide film or a silicon oxynitride film is formed. As for the formation conditions, the substrate placed in a treatment chamber of a plasma CVD apparatus, which is vacuum-evacuated, is held at a temperature higher than or equal to 180° C. and lower than or equal to 260° C., preferably higher than or equal to 180° C. and lower than or equal to 230° C., a source gas is introduced into the treatment chamber, the pressure in the treatment chamber is greater than or equal to 100 Pa and less than or equal to 250 Pa, preferably greater than or equal to 100 Pa and less than or equal to 200 Pa, and high-frequency power that is higher than or equal to 0.17 W/cm$^2$ and lower than or equal to 0.5 W/cm$^2$, preferably, higher than or equal to 0.25 W/cm$^2$ and lower than or equal to 0.35 W/cm$^2$ is supplied is supplied to an electrode provided in the treatment chamber.

As the source gas of the insulating film 130, a source gas which can be used for the insulating film 128 can be used.

As for the formation conditions of the insulating film 130, the high-frequency power having the above power density is supplied to the treatment chamber having the above pressure, whereby the decomposition efficiency of the source gas in plasma is increased, oxygen radicals are increased, and oxidation of the source gas proceeds; therefore, the oxygen content in the insulating film 130 is higher than that in the stoichiometric composition. On the other hand, in the film formed at a substrate temperature within the above temperature range, the bond between silicon and oxygen is weak, and accordingly, part of oxygen in the film is released by heat treatment in a later step. Thus, it is possible to form an oxide insulating film in which the oxygen content is higher than that in the stoichiometric composition and from which part of oxygen is released by heating. The insulating film 128 is provided over the semiconductor film 111. Accordingly, in the process for forming the insulating film 130, the insulating film 128 serves as a protective film of the semiconductor film 111. Thus, even when the insulating film 130 is formed using the high-frequency power having a high power density, damage to the semiconductor film 111 is not significant.

By increasing the thickness of the insulating film 130, a larger amount of oxygen is released by heating; thus, the insulating film 130 is preferably formed thicker than the insulating film 128. Since the insulating film 128 is provided, favorable coverage can be achieved even when the insulating film 130 is formed thick.

In the case where a nitride insulating film with a low hydrogen content is used as the insulating film 132, the insulating film 133 can be formed under the following formation conditions. Here, as the nitride insulating film, a silicon nitride film is formed. As for the formation conditions, the substrate placed in a treatment chamber of a plasma CVD apparatus, which is vacuum-evacuated, is held at a temperature higher than or equal to 180° C. and lower than or equal to 400° C., preferably higher than or equal to 200° C. and lower than or equal to 370° C., a source gas is introduced into the treatment chamber, the pressure in the treatment chamber is greater than or equal to 100 Pa and less than or equal to 250 Pa, preferably greater than or equal to 100 Pa and less than or equal to 200 Pa, and high-frequency power is supplied to an electrode provided in the treatment chamber.

As the source gas of the insulating film 133, a deposition gas containing silicon, a nitrogen gas, and an ammonia gas are preferably used. Typical examples of the deposition gas containing silicon are silane, disilane, trisilane, and silane fluoride. Further, the flow ratio of nitrogen to ammonia is preferably higher than or equal to 5 and lower than or equal to 50, more preferably higher than or equal to 10 and lower than or equal to 50. The use of ammonia as the source gas facilitates decomposition of nitrogen and the deposition gas containing silicon. This is because ammonia is dissociated by plasma energy or heat energy, and energy generated by the dissociation contributes to decomposition of a bond of the deposition gas molecules containing silicon and a bond of nitrogen molecules. Under the above conditions, a silicon nitride film which has a low hydrogen content and can suppress entry of impurities such as hydrogen and water from the outside can be formed.

Note that a silicon oxide film may be formed between the insulating film 130 and the insulating film 133 by a CVD method using an organosilane gas.

It is preferable that heat treatment be performed at least after formation of the insulating film 130 so that excess oxygen contained in the insulating film 128 or the insulating film 130 enters the semiconductor film 111 to reduce oxygen vacancies in the oxide semiconductor film as the semiconductor film 111. The heat treatment can be appropriately performed according to the details of heat treatment for dehydration or dehydrogenation of the semiconductor film 111 and the semiconductor film 119.

In the case where a silicon oxide film is formed between the insulating film 130 and the insulating film 133 by a CVD method using an organosilane gas, an oxide insulating film in which the oxygen content is higher than that in the stoichiometric composition and from which part of oxygen is released by heating is formed as the insulating film 130 and then heat treatment is performed at 350° C. so that excess oxygen contained in the insulating film 130 enters the semiconductor film 111. After the silicon oxide film is formed by a CVD method using any of the organosilane gases given above at a substrate temperature of 350° C., a nitride insulating film with a low hydrogen content is formed as the insulating film 133 at a substrate temperature of 350° C.

Then, after a mask is formed over portions of the insulating film 128, the insulating film 130, and the insulating film 133 which overlap the conductive film 113 through a fifth photolithography process, the insulating film 128, the insulating film 130, and the insulating film 133 are etched to form the opening 117 reaching the conductive film 113 (see FIG. 5B). The opening 117 can be formed in a manner similar to that of the opening 123.

Finally, the pixel electrode 121 is formed, so that the element portion over the substrate 102 can be formed (see FIG. 3). The pixel electrode 121 is formed in such a manner that a conductive film is formed using any of the materials listed above in contact with the conductive film 113 through the opening 117, a mask is formed over the conductive film through a sixth photolithography process, and processing is performed using the mask. The formation of the mask and the processing can be performed in manners similar to those of the scan line 107 and the capacitor line 115.

Modification Example 1

Figure 6:
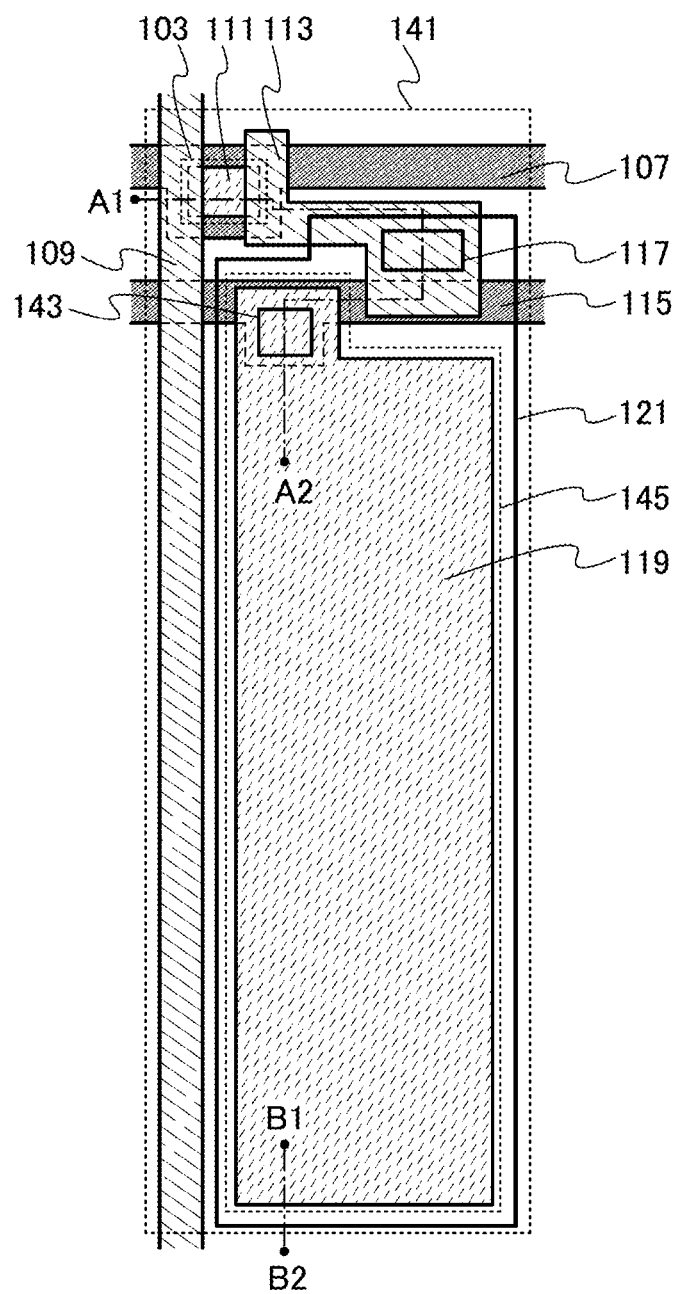
FIG. 6 is a top view illustrating a semiconductor device of one embodiment of the present invention.

In the semiconductor device of one embodiment of the present invention, connection of the capacitor line and the semiconductor film serving as one electrode of the capacitor can be changed as appropriate. For example, to improve the aperture ratio, a structure where the semiconductor film is in direct contact with the capacitor line without the conductive film interposed therebetween can be employed. Specific examples of the structure will be described with reference to FIG. 6 and FIG. 7. Here, only a capacitor 145 different from the capacitor 105 described with reference to FIG. 2 and FIG. 3 will be described. FIG. 6 is a top view of a pixel 141, and FIG. 7 is a cross-sectional view taken along dashed-dotted lines A1-A2 and B1-B2 in FIG. 6.

In the pixel 141, the semiconductor film 119 functioning as one electrode of the capacitor 145 is in direct contact with the capacitor line 115 through an opening 143. Unlike in the capacitor 105 in FIG. 3, the semiconductor film 119 is in direct contact with the capacitor line 115 without the conductive film 125 interposed therebetween and the conductive film 125 serving as a light-blocking film is not formed, so that a higher aperture ratio of the pixel 141 can be achieved. To obtain the above structure, an opening exposing the capacitor line 115 is formed before the semiconductor films 111 and 119 are formed in FIG. 4A.

Figure 7:
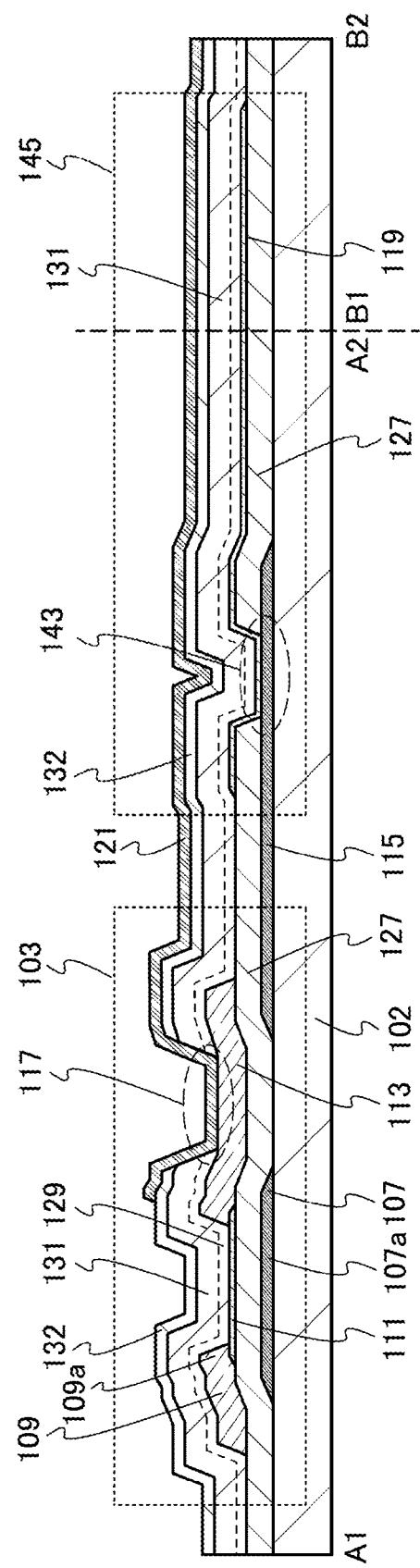
FIG. 7 is a cross-sectional view illustrating a semiconductor device of one embodiment of the present invention.
Figure 8:
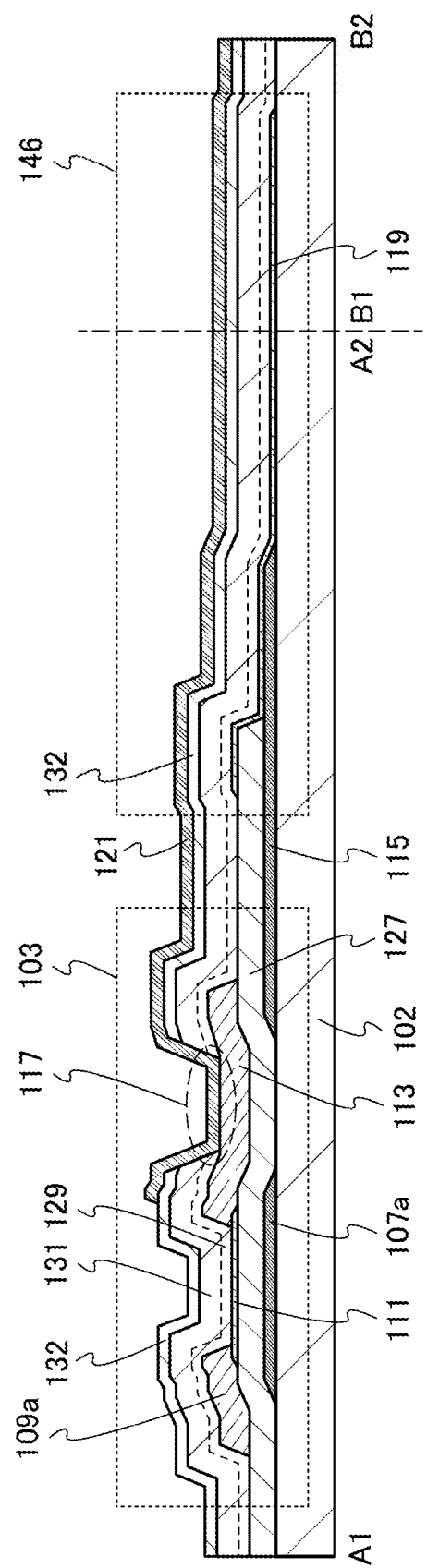
FIG. 8 is a cross-sectional view illustrating a semiconductor device of one embodiment of the present invention.

Although the opening 143 is formed only over the capacitor line 115 in FIG. 7, an opening may be formed so as to expose part of the capacitor line 115 and part of the substrate 102 and the semiconductor film 119 may be formed over the capacitor line 115 and the substrate 102 as illustrated in FIG. 8, in order to increase the area where the semiconductor film 119 is in contact with the capacitor line 115. To obtain the above structure, an opening exposing part of the capacitor line 115 and part of the substrate 102 is formed before the semiconductor films 111 and 119 are formed in FIG. 4A, so that the aperture ratio can be improved and a capacitor 146 can be easily made to be in a conductive state.

Modification Example 2

Figure 9:
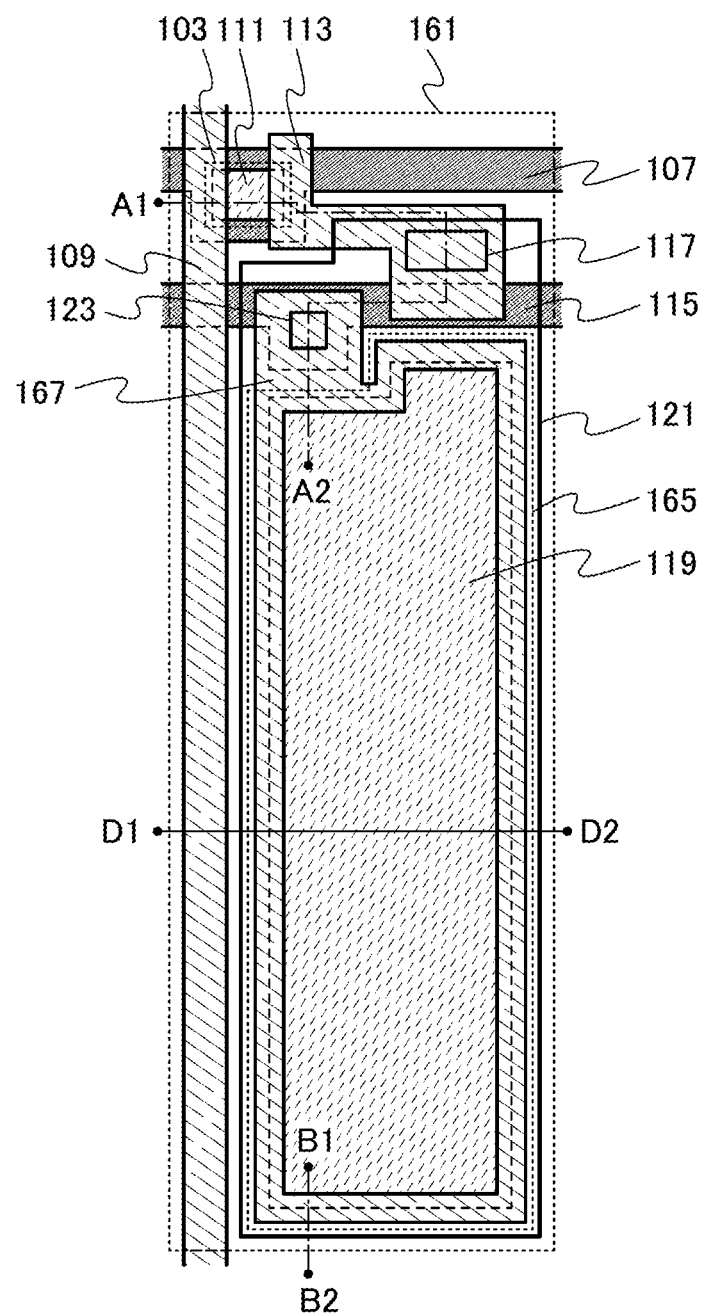
FIG. 9 is a top view illustrating a semiconductor device of one embodiment of the present invention.

In the semiconductor device of one embodiment of the present invention, the conductive film which electrically connects the capacitor line and the semiconductor film serving as one electrode of the capacitor can be changed as appropriate. For example, to reduce contact resistance between the semiconductor film and the conductive film, the conductive film can be provided in contact with the semiconductor film along the outer periphery thereof. Specific examples of the structure will be described with reference to FIG. 9 and FIGS. 10A and 10B. Here, only a conductive film 167 different from the conductive film 125 described with reference to FIG. 2 and FIG. 3 will be described. FIG. 9 is a top view of a pixel 161, FIG. 10A is a cross-sectional view taken along dashed-dotted lines A1-A2 and B1-B2 in FIG. 9, and FIG. 10B is a cross-sectional view taken along dashed-dotted line D1-D2 in FIG. 9.

In the pixel 161, the conductive film 167 is in contact with the semiconductor film 119 along the outer periphery thereof and is in contact with the capacitor line 115 through the opening 123 (see FIG. 9). The conductive film 167 is formed in the same formation process as the signal line 109 including the source electrode of the transistor 103 and the conductive film 113 including the drain electrode of the transistor 103 and thus may have a light-blocking property; for this reason, the conductive film 167 is preferably formed into a loop shape. The structure of the pixel 161 in FIG. 9 is similar to that in FIG. 2, except for the conductive film 167.

As illustrated in FIGS. 10A and 10B, in the pixel 161, the conductive film 167 is provided so as to cover an end portion of the semiconductor film 119 of a capacitor 165 and be along the end portion.

In the structure illustrated in FIG. 9 and FIGS. 10A and 10B, the conductive film 167 is formed into a loop shape when seen from above; however, a portion of the conductive film 167 which is in contact with the semiconductor film 119 does not have to be entirely electrically connected to the capacitor line 115. In other words, a conductive film formed in the same formation process as the conductive film 167 may be provided in contact with the semiconductor film 119 so as to be separate from the conductive film 167.

Modification Example 3

Figure 11:
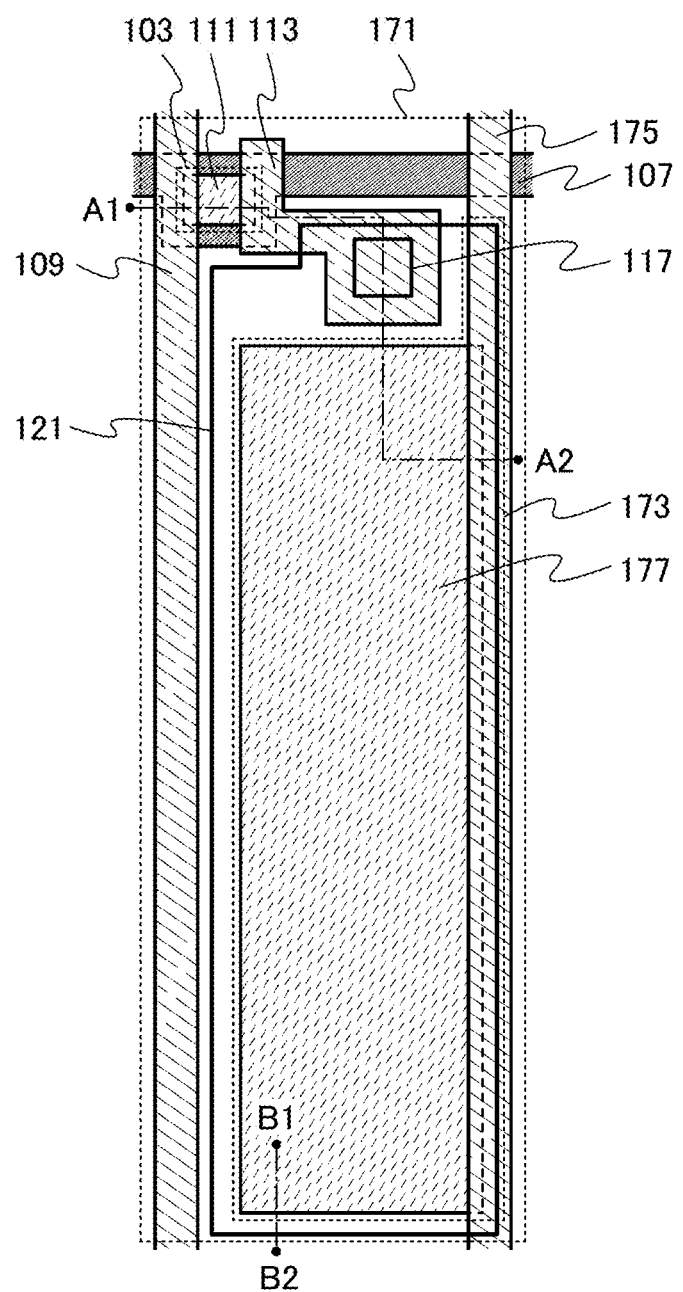
FIG. 11 is a top view illustrating a semiconductor device of one embodiment of the present invention.

In the semiconductor device of one embodiment of the present invention, the structures of the semiconductor film included in the capacitor and the capacitor line can be changed as appropriate. Specific examples of the structures will be described with reference to FIG. 11 and FIG. 12. Here, only a semiconductor film 177 and a capacitor line 175 different from the semiconductor film 119 and the capacitor line 115 described with reference to FIG. 2 and FIG. 3 will be described. FIG. 11 is a top view of a pixel 171 where the capacitor line 175 is provided so as to extend in the direction parallel with the signal line 109. The signal line 109 and the capacitor line 175 are electrically connected to the signal line driver circuit 106 (see FIG. 1A).

A capacitor 173 is connected to the capacitor line 175 provided so as to extend in the direction parallel with the signal line 109. The capacitor 173 includes the semiconductor film 177 including an oxide semiconductor and formed similarly to the semiconductor film 111, the pixel electrode 121, and an insulating film (not illustrated in FIG. 11) which is formed as a dielectric film over the transistor 103. The semiconductor film 177, the pixel electrode 121, and the dielectric film transmit light; accordingly, the capacitor 173 transmits light.

Figure 12:
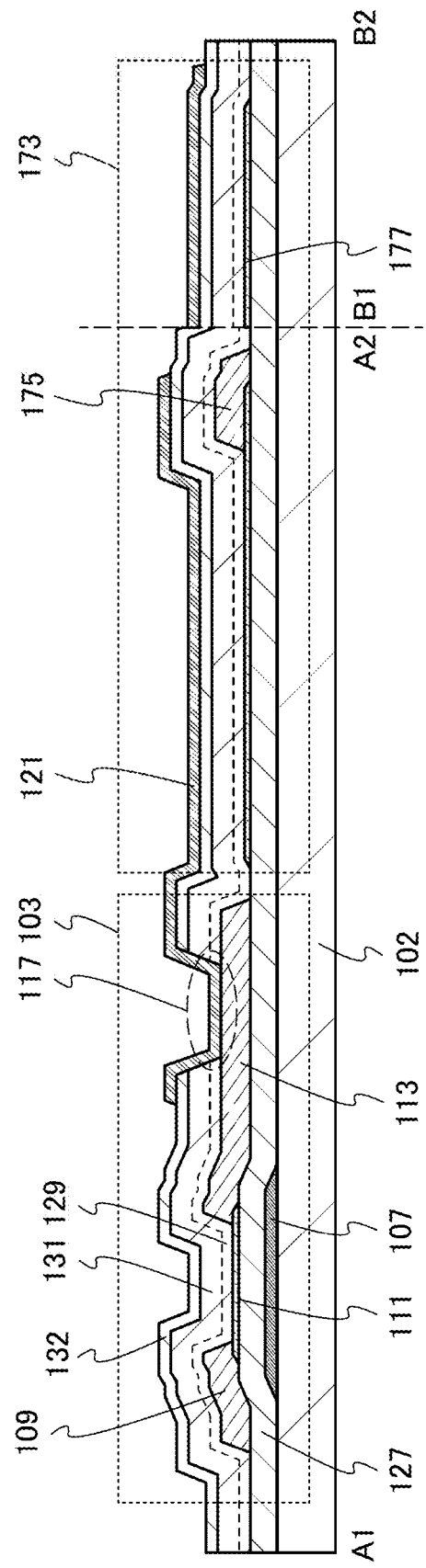
FIG. 12 is a cross-sectional view illustrating the semiconductor device of one embodiment of the present invention.

Next, FIG. 12 is a cross-sectional view taken along dashed-dotted lines A1-A2 and B1-B2 in FIG. 11.

In the capacitor 173, the semiconductor film 177 formed in a manner similar to that of the semiconductor film 111 serves as one of a pair of electrodes, the pixel electrode 121 serves as the other of the pair of electrodes, and the insulating film 129, the insulating film 131, and the insulating film 132 serve as a dielectric film provided between the pair of electrodes.

The capacitor line 175 can be formed concurrently with the signal line 109 and the conductive film 113. When the capacitor line 175 is provided in contact with the semiconductor film 177, the area where the semiconductor film 177 and the capacitor line 175 are in contact with each other can be increased.

Figure 13:
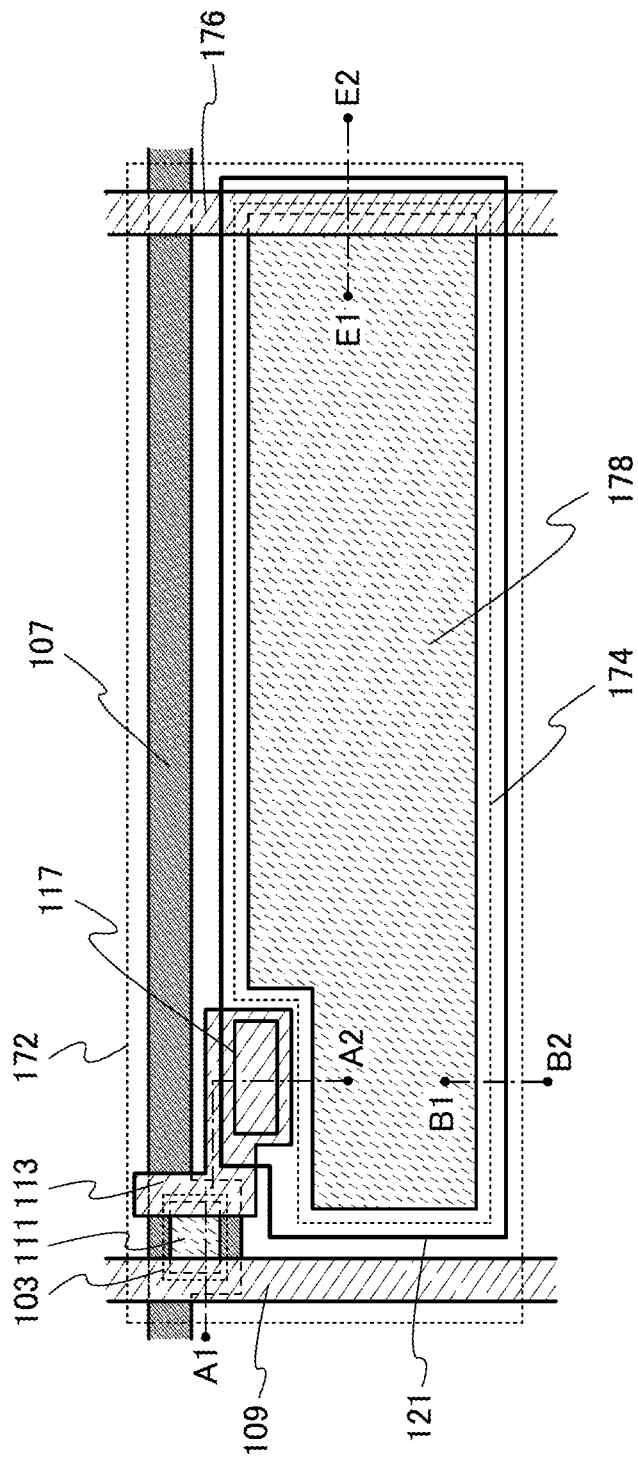
FIG. 13 is a top view illustrating a semiconductor device of one embodiment of the present invention.

The pixel 171 illustrated in FIG. 11 has a shape with a side parallel with the signal line 109 is longer than a side parallel with the scan line 107; however, like a pixel 172 illustrated in FIG. 13, the pixel 171 may have a shape with a side parallel with the scan line 107 is longer than a side parallel with the signal line 109, and a capacitor line 176 may be provided so as to extend in the direction parallel with the signal line 109. The signal line 109 and the capacitor line 176 are electrically connected to the signal line driver circuit 106 (see FIG. 1A).

A capacitor 174 is connected to the capacitor line 176 provided so as to extend in the direction parallel with the signal line 109. The capacitor 174 includes a semiconductor film 178 including an oxide semiconductor and formed similarly to the semiconductor film 111, the pixel electrode 121, and an insulating film (not illustrated in FIG. 13) which is formed over the transistor 103, as a dielectric film. The semiconductor film 178, the pixel electrode 121, and the dielectric film transmit light; accordingly, the capacitor 174 transmits light.

Figure 14:
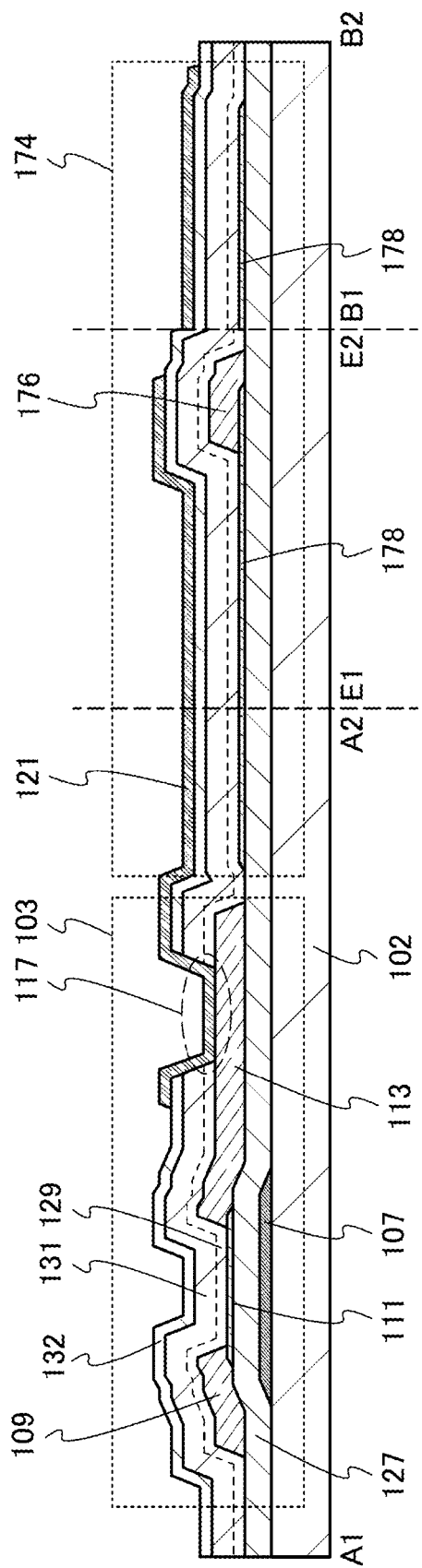
FIG. 14 is a cross-sectional view illustrating a semiconductor device of one embodiment of the present invention.

Next, FIG. 14 is a cross-sectional view taken along dashed-dotted lines A1-A2 and B1-B2 in FIG. 13.

In the capacitor 174, the semiconductor film 178 formed in a manner similar to that of the semiconductor film 111 serves as one of a pair of electrodes, the pixel electrode 121 serves as the other of the pair of electrodes, and the insulating film 129, the insulating film 131, and the insulating film 132 serve as a dielectric film provided between the pair of electrodes.

The capacitor line 176 can be formed concurrently with the signal line 109 and the conductive film 113. When the capacitor line 176 is provided in contact with the semiconductor film 178, the area where the semiconductor film 178 and the capacitor line 176 are in contact with each other can be increased. The pixel 172 has a shape with a side parallel with the signal line 109 is shorter than a side parallel with the scan line 107; thus, the area where the pixel electrode 121 overlaps with the capacitor line 176 can be small as compared with the case of the pixel 171 illustrated in FIG. 11, resulting in a higher aperture ratio.

Modification Example 4

Figure 37:
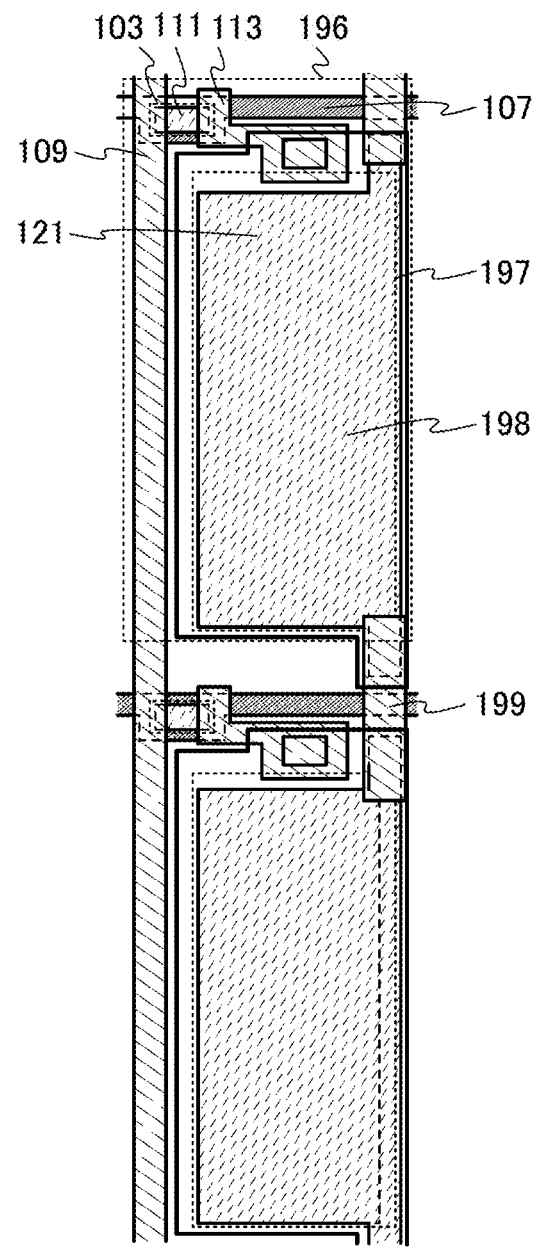
FIG. 37 is a top view illustrating a semiconductor device of one embodiment of the present invention.

In the semiconductor device of one embodiment of the present invention, one electrode of the capacitor and the capacitor line can be formed using a semiconductor film (specifically, an oxide semiconductor film). A specific example will be described with reference to FIG. 37. Here, only a semiconductor film 198 different from the semiconductor film 119 and the capacitor line 115 described with reference to FIG. 2 will be described. FIG. 37 is a top view of a pixel 196 where the semiconductor film 198 serving as one electrode of a capacitor 197 and the capacitor line is provided in the pixel 196. The semiconductor film 198 has a region which extends in the direction parallel with the signal line 109 and the region functions as the capacitor line. In the semiconductor film 198, a region which overlaps with the pixel electrode 121 functions as one electrode of the capacitor 197. The semiconductor film 198 can be formed concurrently with the semiconductor film 111 of the transistor 103 provided in the pixel 196.

In the case where a continuous oxide semiconductor film is provided as the semiconductor film 198 for the pixels 196 in one row, the semiconductor film 198 overlaps with the scan lines 107. For this reason, the semiconductor film 198 does not function as the capacitor line and one electrode of the capacitor 197 due to an effect of a change in the potential of the scan line 107 in some cases. Thus, the semiconductor films 198 are provided for the respective pixels 196 so as to be separate from each other as illustrated in FIG. 37. Further, the semiconductor films 198 provided so as to be separate from each other are preferably electrically connected to each other using a conductive film 199 which can be formed concurrently with the signal line 109 and the conductive film 113. With the above structure, a portion of the semiconductor film 198 which is not connected to the conductive film 199 overlaps with the pixel electrode 121, whereby the resistance of the semiconductor film 198 in the region can be low and thus the semiconductor film 198 functions as the capacitor line and one electrode of the capacitor 197.

Although not illustrated, one oxide semiconductor film can be provided as the semiconductor film 198 for the pixels 196 so as to overlap the scan lines 107 in the case where a portion of the semiconductor film 198 which overlaps with the scan line 107 is not influenced by a change in the potential of the scan line 107. In other words, a continuous oxide semiconductor film can be provided as the semiconductor film 198 for the pixels 196 in one row.

In FIG. 37, a portion of the semiconductor film 198 which functions as the capacitor line extends in the direction parallel with the signal line 109; however, the region which functions as the capacitor line may extend in the direction parallel with the scan line 107. In the case where the portion of the semiconductor film 198 which functions as the capacitor line extends in the direction parallel with the scan line 107, it is necessary that the semiconductor film 111 and the semiconductor film 198 be electrically insulated from the signal line 109 and the conductive film 113 by providing an insulating film between the semiconductor film 111 and the semiconductor film 198, and the signal line 109 and the conductive film 113, in the transistor 103 and the capacitor 197.

According to the above description, when a light-transmitting oxide semiconductor film is provided for one electrode of a capacitor provided in a pixel and a capacitor line as in the pixel 196, the pixel can have a higher aperture ratio.

Modification Example 5

Figure 35:
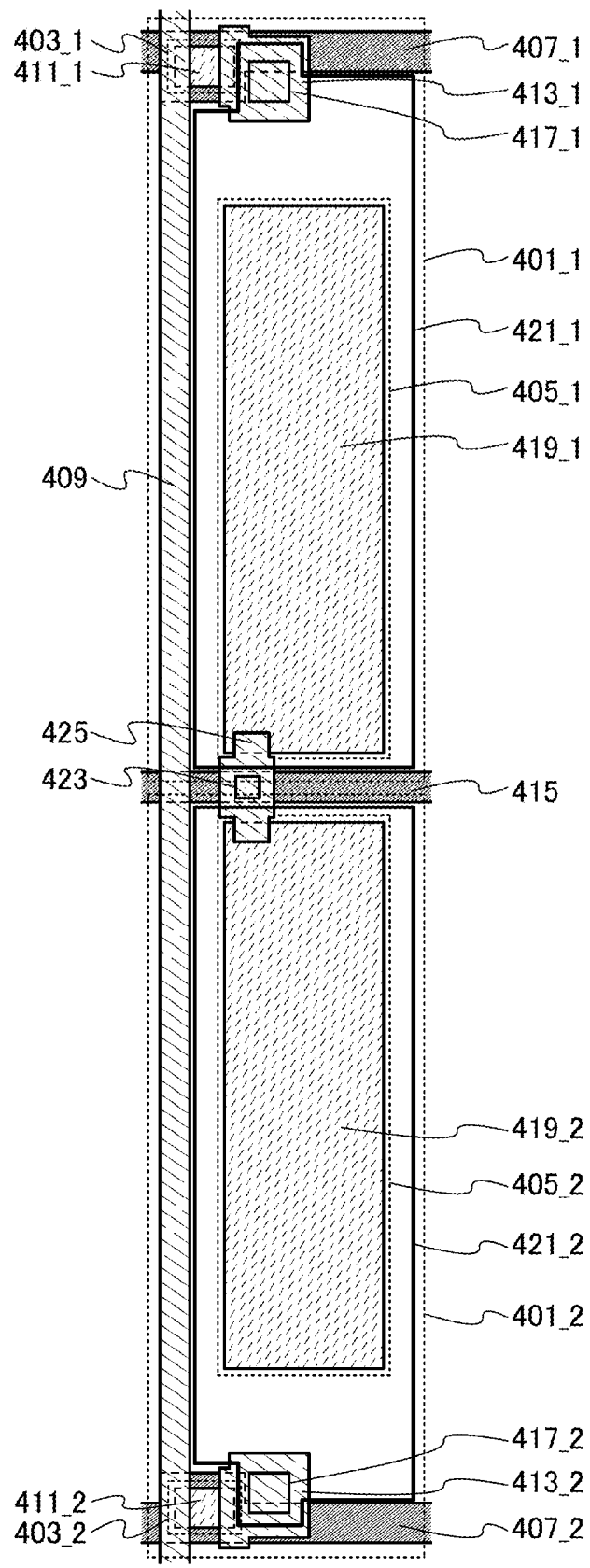
FIG. 35 is a top view illustrating a semiconductor device of one embodiment of the present invention.

In the semiconductor device of one embodiment of the present invention, the structure of the capacitor line can be changed as appropriate. This structure will be described with reference to FIG. 35. In FIG. 35, unlike the capacitor line 115 described with reference to FIG. 2, a capacitor line is located between adjacent two pixels.

Figure 48:
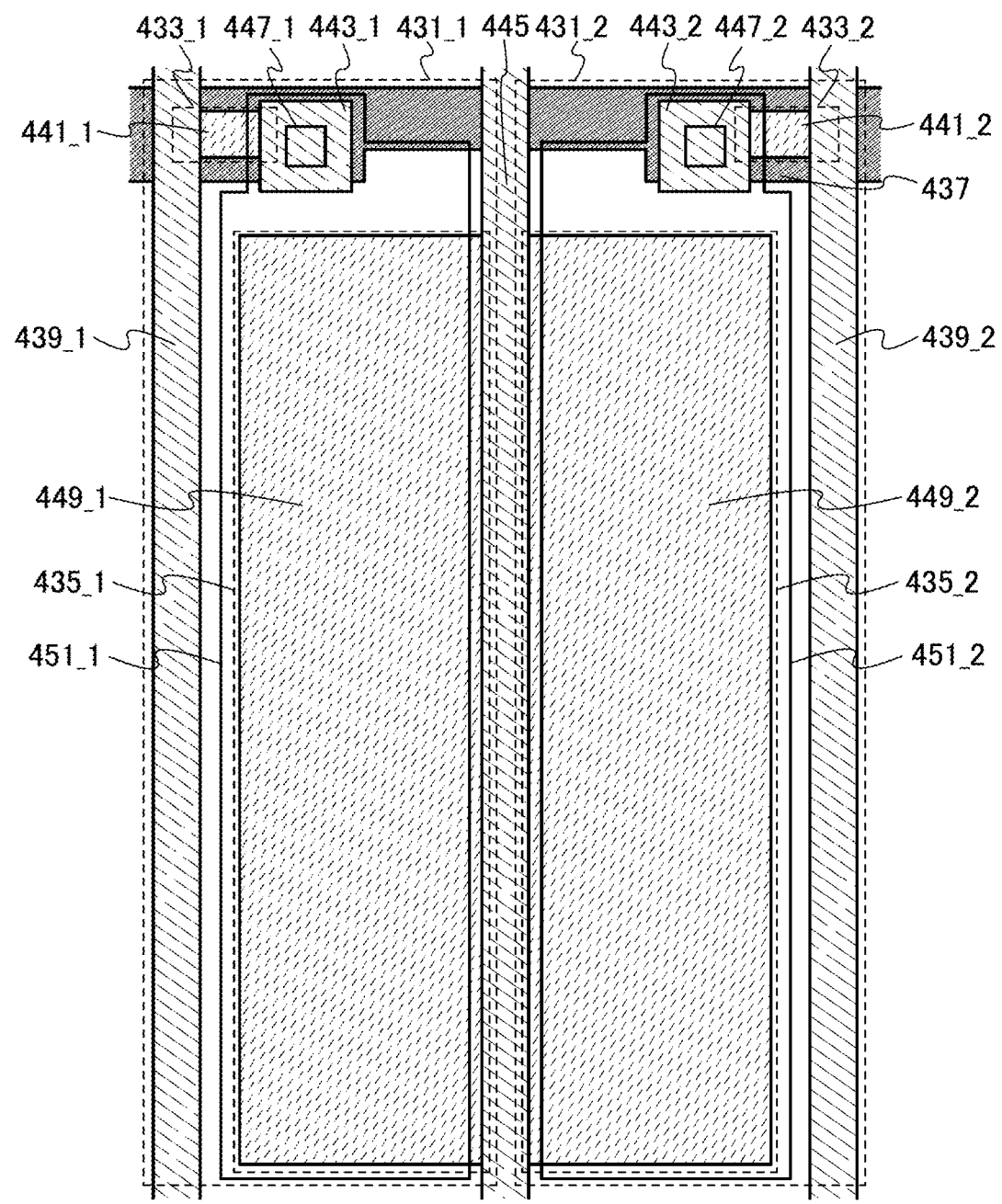
FIG. 48 is a top view illustrating a semiconductor device of one embodiment of the present invention.

FIG. 35 illustrates a structure where the capacitor line is provided between the pixels adjacent to each other in the direction in which a signal line 409 extends. FIG. 48 illustrates a structure where a capacitor line is provided between pixels adjacent to each other in the direction in which a scan line 437 extends.

FIG. 35 is a top view of pixels 401_1 and 4012 adjacent to each other in the direction in which the signal line 409 extends.

Scan lines 407_1 and 407_2 are provided so as to extend in parallel with each other in the direction perpendicular to or substantially perpendicular to the signal line 409. A capacitor line 415 is provided between the scan lines 407_1 and 4072 so as to be parallel with the scan lines 407_1 and 407_2. The capacitor line 415 is connected to a capacitor 405_1 provided in the pixel 401_1 and a capacitor 405_2 provided in the pixel 4012. Top surface shape and the positions of components of the pixel 401_1 and those of the pixel 401_2 are symmetric with respect to the capacitor line 415.

The pixel 401_1 is provided with a transistor 403_1, a pixel electrode 421_1 connected to the transistor 403_1, and the capacitor 405_1.

The transistor 403_1 is provided in a region where the scan line 407_1 and the signal line 409 cross each other. The transistor 403_1 includes at least a semiconductor film 411_1 including a channel formation region, a gate electrode, a gate insulating film (not illustrated in FIG. 35), a source electrode, and a drain electrode. A portion of the scan line 407_1 which overlaps with the semiconductor film 411_1 functions as the gate electrode of the transistor 403_1. A portion of the signal line 409 which overlaps with the semiconductor film 411_1 functions as the source electrode of the transistor 403_1. A portion of the conductive film 413_1 which overlaps with the semiconductor film 411_1 functions as the drain electrode of the transistor 403_1. The conductive film 413_1 and the pixel electrode 421_1 are connected to each other through an opening 417_1.

The capacitor 405_1 is electrically connected to the capacitor line 415 through the conductive film 425 provided in and over the opening 423. The capacitor 405_1 includes a semiconductor film 419_1 including an oxide semiconductor, the pixel electrode 421_1, and an insulating film (not illustrated in FIG. 35) which is formed as a dielectric film over the transistor 403_1. The semiconductor film 419_1, the pixel electrode 421_1, and the dielectric film transmit light; accordingly, the capacitor 405_1 transmits light.

The pixel 401_2 is provided with a transistor 403_2, a pixel electrode 421_2 connected to the transistor 403_2, and a capacitor 405_2.

The transistor 403_2 is provided in a region where the scan line 407_2 and the signal line 409 cross each other. The transistor 403_2 includes at least a semiconductor film 411_2 including a channel formation region, a gate electrode, a gate insulating film (not illustrated in FIG. 35), a source electrode, and a drain electrode. A portion of the scan line 407_2 which overlaps with the semiconductor film 411_2 functions as the gate electrode of the transistor 403_2. A portion of the signal line 409 which overlaps with the semiconductor film 411_2 functions as the source electrode of the transistor 403_2. A portion of the conductive film 413_2 which overlaps with the semiconductor film 411_2 functions as the drain electrode of the transistor 403_2. The conductive film 413_2 and the pixel electrode 421_2 are connected to each other through an opening 417_2.

The capacitor 405_2 is electrically connected to the capacitor line 415 through the conductive film 425 provided in and over the opening 423 similarly to the capacitor 405_1. The capacitor 4052 includes a semiconductor film 419_2 including an oxide semiconductor, the pixel electrode 421_2, and an insulating film (not illustrated in FIG. 35) which is formed over the transistor 403_2 and serves as a dielectric film. The semiconductor film 419_2, the pixel electrode 421_2, and the dielectric film transmit light; accordingly, the capacitor 405_2 transmits light.

Cross-sectional structures of the transistors 403_1 and 403_2 and the capacitors 405_1 and 405_2 are similar to those of the transistor 103 and the capacitor 105 illustrated in FIG. 3 and thus descriptions thereof are omitted here.

Although the capacitor line is provided between the pixels adjacent to each other in the direction in which the signal line 409 extends in FIG. 35, the capacitor line may be provided between the pixels adjacent to each other in the direction in which the scan line 437 extends as in FIG. 48.

FIG. 48 is a top view of pixels 431_1 and 431_2 adjacent to each other in the direction in which the scan line 437 extends.

Signal lines 439_1 and 439_2 are provided so as to extend in parallel with each other in the direction perpendicular to or substantially perpendicular to the scan line 437. A capacitor line 445 is provided between the signal lines 439_1 and 439_2 so as to be parallel with the signal lines 439_1 and 439_2. The capacitor line 445 is connected to a capacitor 435_1 provided in the pixel 431_1 and a capacitor 435_2 provided in the pixel 431_2. Top surface shape and the positions of components of the pixel 431_1 and those of the pixel 431_2 are symmetric with respect to the capacitor line 445.

The pixel 431_1 is provided with a transistor 433_1, the pixel electrode 451_1 connected to the transistor 433_1, and the capacitor 435_1.

The transistor 433_1 is provided in a region where the scan line 437 and the signal line 439_1 cross each other. The transistor 433_1 includes at least a semiconductor film 441_1 including a channel formation region, a gate electrode, a gate insulating film (not illustrated in FIG. 48), a source electrode, and a drain electrode. A portion of the scan line 437 which overlaps with the semiconductor film 441_1 functions as the gate electrode of the transistor 433_1. A portion of the signal line 439_1 which overlaps with the semiconductor film 441_1 functions as the source electrode of the transistor 433_1. A portion of the conductive film 443_1 which overlaps with the semiconductor film 441_1 functions as the drain electrode of the transistor 433_1. The conductive film 443_1 and the pixel electrode 421_1 are connected to each other through an opening 447_1.

The capacitor 435_1 is connected to the capacitor line 445. The capacitor 435_1 includes the semiconductor film 449_1 including an oxide semiconductor, the pixel electrode 451_1, and an insulating film (not illustrated in FIG. 48) which is formed as a dielectric film over the transistor 433_1. The semiconductor film 449_1, the pixel electrode 451_1, and the dielectric film transmit light; accordingly, the capacitor 435_1 transmits light.

The pixel 431_2 is provided with a transistor 433_2, a pixel electrode 451_2 connected to the transistor 433_2, and a capacitor 4352.

The transistor 433_2 is provided in a region where the scan line 437 and the signal line 439_2 cross each other. The transistor 433_2 includes at least a semiconductor film 441_2 including a channel formation region, a gate electrode, a gate insulating film (not illustrated in FIG. 48), a source electrode, and a drain electrode. A portion of the scan line 437 which overlaps with the semiconductor film 441_2 functions as the gate electrode of the transistor 433_2. A portion of the signal line 439_2 which overlaps with the semiconductor film 441_2 functions as the source electrode of the transistor 433_2. A portion of the conductive film 443_2 which overlaps with the semiconductor film 441_2 functions as the drain electrode of the transistor 433_2. The conductive film 443_2 and the pixel electrode 451_2 are connected to each other through an opening 447_2.

The capacitor 435_2 is electrically connected to the capacitor line 445 similarly to the capacitor 435_1. The capacitor 435_2 includes the semiconductor film 449_2 including an oxide semiconductor, the pixel electrode 451_2, and an insulating film (not illustrated in FIG. 48) which is formed as a dielectric film over the transistor 433_2. The semiconductor film 449_2, the pixel electrode 4512, and the dielectric film transmit light; accordingly, the capacitor 435_2 transmits light.

Cross-sectional structures of the transistors 433_1 and 433_2 and the capacitors 435_1 and 435_2 are similar to those of the transistor 103 and the capacitor 105 illustrated in FIG. 3 and thus descriptions thereof are omitted here.

In a structure seen from above, a capacitor line is provided between adjacent two pixels so that capacitors included in the pixels and the capacitor line are connected, whereby the number of capacitor lines can be reduced. As a result, the aperture ratio of the pixel can be high as compared with the case of a structure where each pixel is provided with a capacitor line.

Modification Example 6

Figure 15:
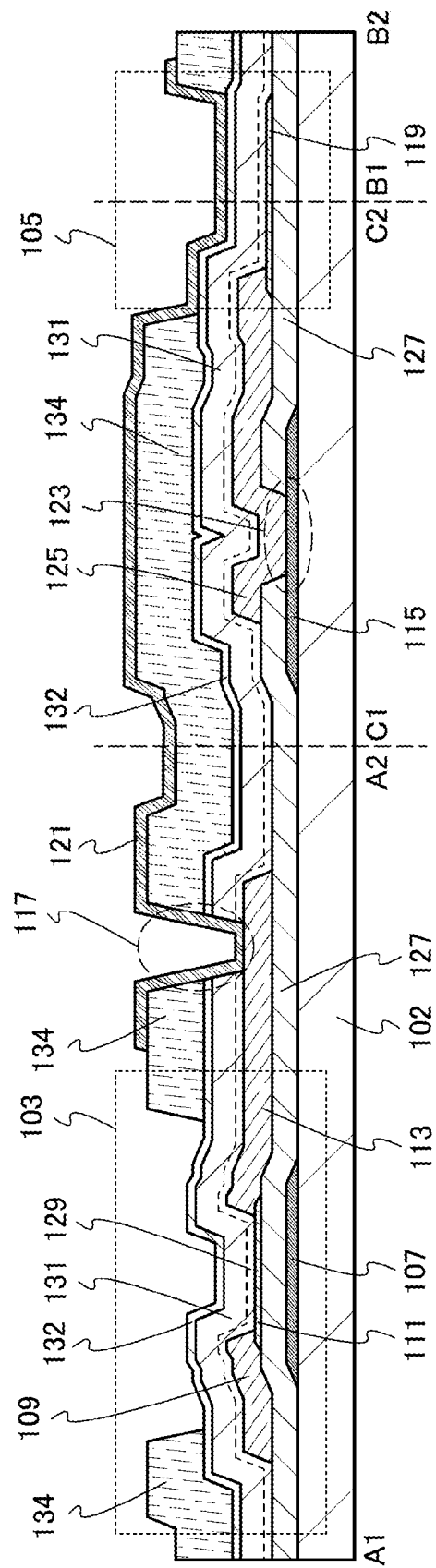
FIG. 15 is a cross-sectional view illustrating a semiconductor device of one embodiment of the present invention.

To reduce parasitic capacitance generated between the pixel electrode 121 and the conductive film 113 and parasitic capacitance generated between the pixel electrode 121 and the conductive film 125 in the pixels 101, 141, 151, 161, 171, 172, 401_1, and 401_2, an organic insulating film 134 can be provided in a region where the parasitic capacitance is generated as illustrated in a cross-sectional view in FIG. 15. The structure in FIG. 15 is the same as that in FIG. 3 except for the organic insulating film 134. Here, only the organic insulating film 134 not included in the structure in FIG. 3 will be described.

For the organic insulating film 134, a photosensitive organic resin or a non-photosensitive organic resin can be used; for example, an acrylic resin, a benzocyclobutene resin, an epoxy resin, a siloxane resin, or the like can be used. Alternatively, polyamide can be used for the organic insulating film 134.

The organic insulating film 134 can be formed in such manner that an organic resin film is formed using any of the materials listed above and processed. When a photosensitive organic resin is used for the organic insulating film 134, a resist mask is unnecessary in formation of the organic insulating film 134 and thus a process can be simplified. Note that a formation method of the organic insulating film is not particularly limited and can be selected as appropriate in accordance with a material which is used. For example, spin coating, dipping, spray coating, a droplet discharge method (e.g., an ink-jet method), screen printing, offset printing, or the like can be employed.

In general, an organic resin contains much hydrogen and water; thus, when an organic resin is provided over the transistor 103 (in particular, the semiconductor film 111), hydrogen and water contained in the organic resin diffuses into the transistor 103 (in particular, the semiconductor film 111) and might degrade the electrical characteristics of the transistor 103. For this reason, it is preferable that the organic insulating film 134 be not provided at least over a portion of the insulating film 132 which overlaps with the semiconductor film 111. In other words, it is preferable that a portion of the organic resin film which is over a region overlapping at least the semiconductor film 111 be removed.

Figure 16:
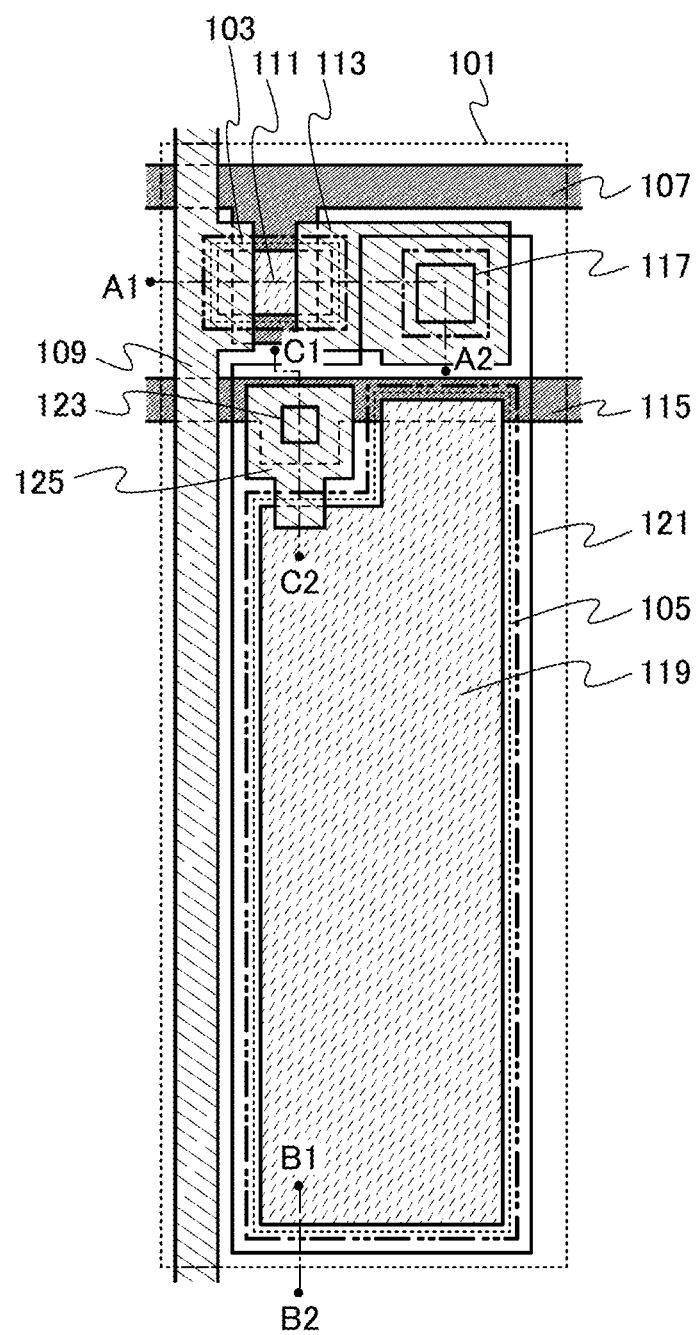
FIG. 16 is a top view illustrating a semiconductor device of one embodiment of the present invention.

FIG. 16 is a top view of the pixel 101 shown in FIG. 15. The cross-sectional view in FIG. 15 corresponds to cross sections taken along dashed-dotted lines A1-A2, B1-B2, and C1-C2 in FIG. 16. In FIG. 16, the organic insulating film 134 is not illustrated for simplification; however, a region indicated by dashed-two dotted lines is a region where the organic insulating film 134 is not provided.

Modification Example 7

Figure 17:
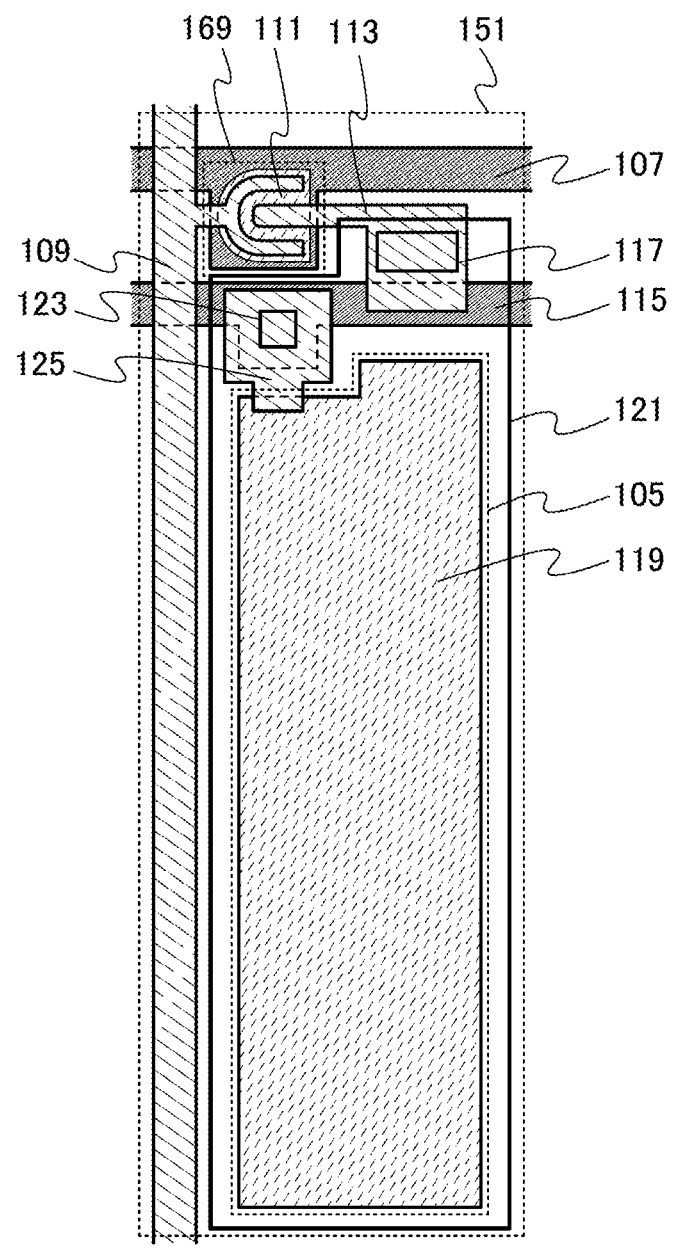
FIG. 17 is a top view illustrating a semiconductor device of one embodiment of the present invention.

In the semiconductor device of one embodiment of the present invention, the shape of a transistor provided in a pixel is not limited to the shape of the transistor illustrated in FIG. 2 and FIG. 3 and can be changed as appropriate. For example, as illustrated in FIG. 17, in the pixel 151, a transistor 169 may be different from the transistor 103 in that a source electrode included in the signal line 109 has a U shape (or a C shape, a square-bracket-like shape, or a horseshoe shape) which partly surrounds the conductive film 113 including a drain electrode. With such a shape, a sufficient channel width can be ensured even when the area of the transistor is small, and accordingly, the amount of drain current flowing at the time of conduction of the transistor (also referred to as an on-state current) can be increased. The structure of the pixel 151 in FIG. 17 is similar to that in FIG. 2, except for the transistor 169.

Modification Example 8

Figure 18:
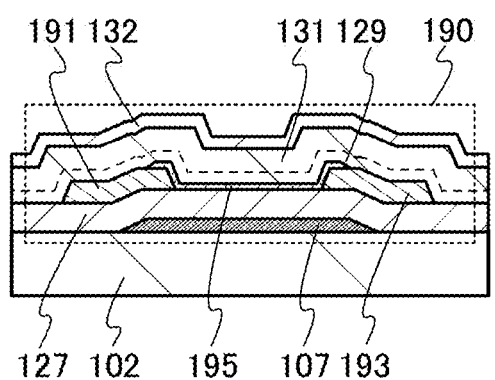
FIG. 18 is a cross-sectional view illustrating a semiconductor device of one embodiment of the present invention.

Although in the pixels 101, 141, 151, 161, 171, 172, 401_1, and 401_2 described above, a transistor where the oxide semiconductor film is provided between the signal line 109 including the gate insulating film and the source electrode and the conductive film 113 including the drain electrode is used, instead of the transistor, a transistor 190 where a semiconductor film 195 is provided between the insulating film 129, and a signal line 191 including a source electrode and a conductive film 193 including a drain electrode as illustrated in FIG. 18 can be used. The structure in FIG. 18 is the same as that in FIG. 3 except for the position of the semiconductor film 195.

In the transistor 190 illustrated in FIG. 18, the signal line 191 and the conductive film 193 are formed and then the semiconductor film 195 is formed. Thus, a surface of the semiconductor film 195 is not exposed to an etchant or an etching gas used in a formation process of the signal line 191 and the conductive film 193, so that impurities between the semiconductor film 195 and the insulating film 129 can be reduced. Accordingly, a leakage current flowing between the source electrode and the drain electrode of the transistor 190 can be reduced.

Modification Example 9

Figure 19:
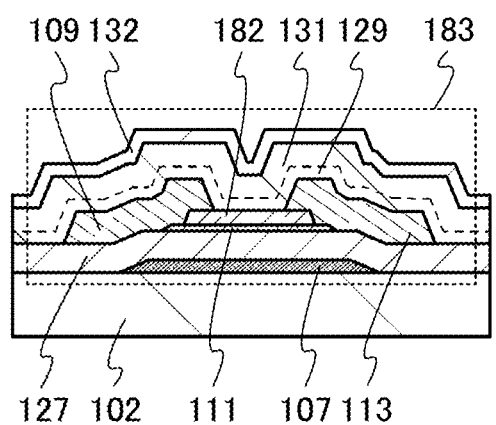
FIG. 19 is a cross-sectional view illustrating a semiconductor device of one embodiment of the present invention.

Although in the pixels 101, 141, 151, 161, 171, 172, 401_1, and 401_2 described above, a channel-etched transistor is used as the transistor, instead of the transistor, a channel protective transistor 183 can be used as illustrated in FIG. 19. The structure in FIG. 19 is the same as that in FIG. 3 except that a channel protective film 182 is provided between the semiconductor film 111, and the signal line 109 including the source electrode and the conductive film 113 including the drain electrode.

In the transistor 183 in FIG. 19, the channel protective film 182 is formed over the semiconductor film 111 and then the signal line 109 and the conductive film 113 are formed. The channel protective film 182 can be formed using the material of the insulating film 129 formed over the transistor 103, in which case it is not necessary to additionally provide an insulating film corresponding to the insulating film 129 formed over the transistor 103 in the transistor 183. Further, when the channel protective film 182 is provided, a surface of the semiconductor film 111 is not exposed to an etchant or an etching gas used in a formation process of the signal line 109 and the conductive film 113, so that impurities between the semiconductor film 111 and the channel protective film 182 can be reduced. Accordingly, a leakage current flowing between the source electrode and the drain electrode of the transistor 183 can be reduced.

Modification Example 10

Figure 36A:
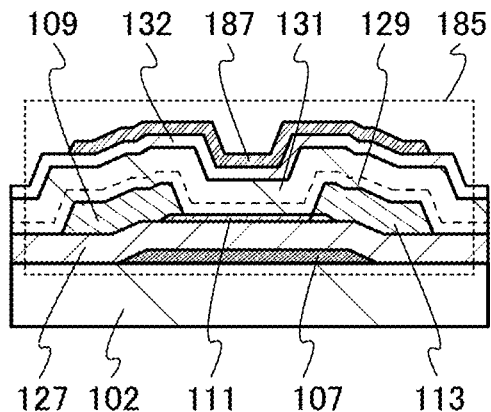
FIGS. 36A and 36B are cross-sectional view each illustrating a semiconductor device of one embodiment of the present invention.

Although in the pixels 101, 141, 151, 161, 171, 172, 401_1, and 401_2 described above, a transistor having one gate electrode is used, instead of the transistor, a transistor 185 having two gate electrodes facing each other with the semiconductor film 111 interposed therebetween as illustrated in FIG. 36A can be used.

The transistor 185 is different from the transistors 103, 169, and 190 described in this embodiment in that a conductive film 187 is provided over the insulating film 132 over the transistor. The conductive film 187 overlaps with at least a channel formation region of the semiconductor film 111. It is preferable that the conductive film 187 be provided in a position overlapping the channel formation region of the semiconductor film 111 so that the potential of the conductive film 187 is equal to the minimum potential of a video signal input to the signal line 109. In that case, a current flowing between the source electrode and the drain electrode in the surface portion of the semiconductor film 111 facing the conductive film 187 can be controlled, and variations in the electrical characteristics of the transistors can be reduced. Further, when the conductive film 187 is provided, an influence of a change in ambient electric field on the semiconductor film 111 can be reduced, leading to an improvement in reliability of the transistor.

The conductive film 187 can be formed using a material and a method similar to those of the scan line 107, the signal line 109, the pixel electrode 121, or the like.

Figure 36B:
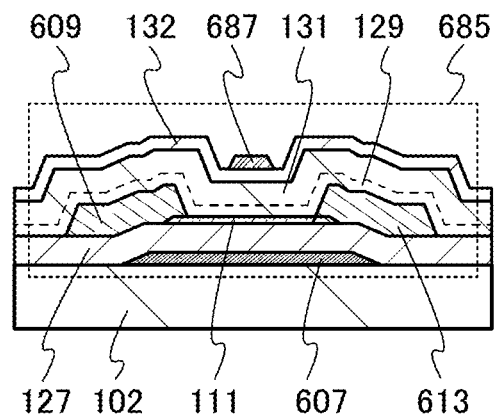

The conductive film 187 illustrated in FIG. 36A partly overlaps with source and drain electrodes; however, a structure where a conductive film 687 overlaps with a gate electrode 307 and does not overlap either a source electrode 309 or a drain electrode 613 as in a transistor 685 illustrated in FIG. 36B may be employed.

As described above, the use of the semiconductor film formed in the same formation step as the semiconductor film included in the transistor, for one electrode of the capacitor, allows fabrication of a semiconductor device including the capacitor whose charge capacity is increased while improving the aperture ratio. As a result, the semiconductor device can have excellent display quality.

Further, oxygen vacancies and impurities such as hydrogen in the oxide semiconductor film, which is a semiconductor film included in the transistor, are reduced, so that the semiconductor device of one embodiment of the present invention has favorable electrical characteristics.

Note that the structures and the like described in this embodiment can be combined as appropriate with any of the structures and the like described in the other embodiments and example.

Embodiment 2

In this embodiment, a semiconductor device of one embodiment of the present invention which has a structure different from that in the above embodiment will be described with reference to drawings. A semiconductor device of one embodiment of the present invention will be described taking a liquid crystal display device as an example in this embodiment. In the semiconductor device described in this embodiment, the structure of a capacitor is different from that of the capacitor in the above embodiment. The above embodiment can be referred to for components in the semiconductor device in this embodiment which are similar to those of the semiconductor device in the above embodiment.

<Structure of Semiconductor Device>

Figure 20:
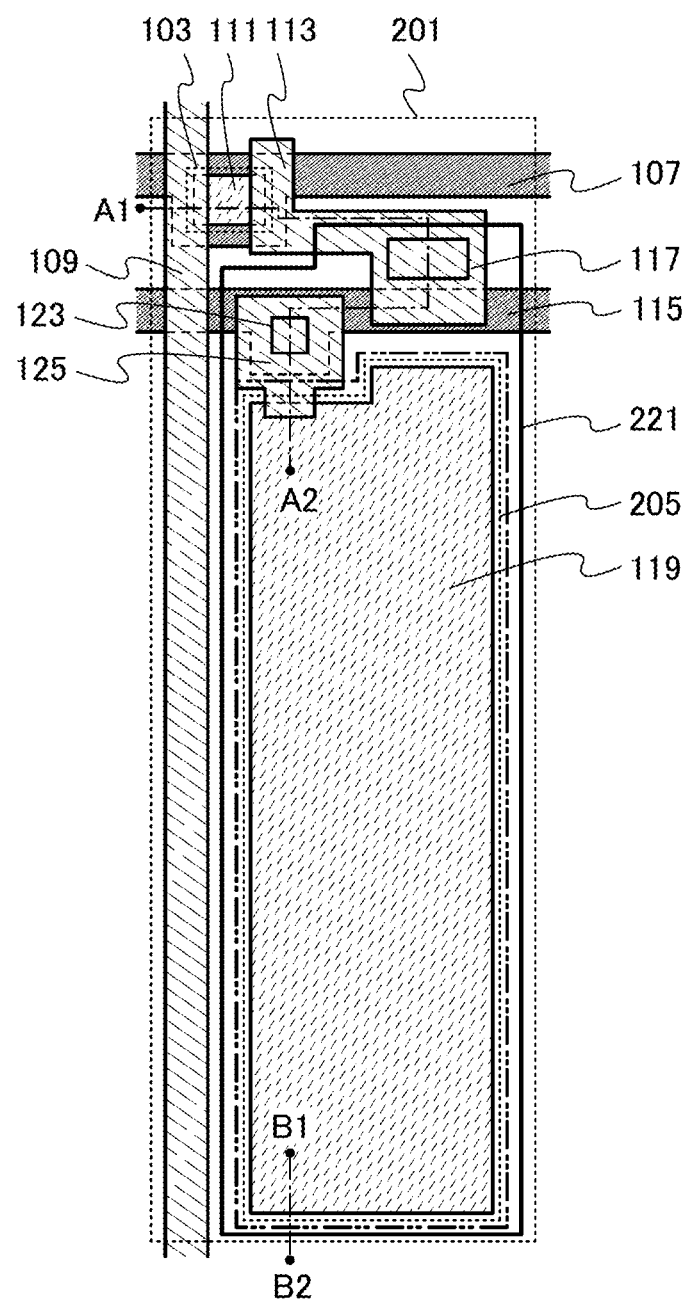
FIG. 20 is a top view illustrating a semiconductor device of one embodiment of the present invention.

FIG. 20 is a top view of a pixel 201 in this embodiment. In the pixel 201 in FIG. 20, an insulating film 229 (not illustrated) and an insulating film 231 (not illustrated) are not provided in a region indicated by dashed-two dotted lines. Thus, a capacitor 205 in the pixel 201 in FIG. 20 includes the semiconductor film 119 serving as one electrode, a pixel electrode 221 serving as the other electrode, and an insulating film 232 (not illustrated) serving as a dielectric film.

Figure 21:
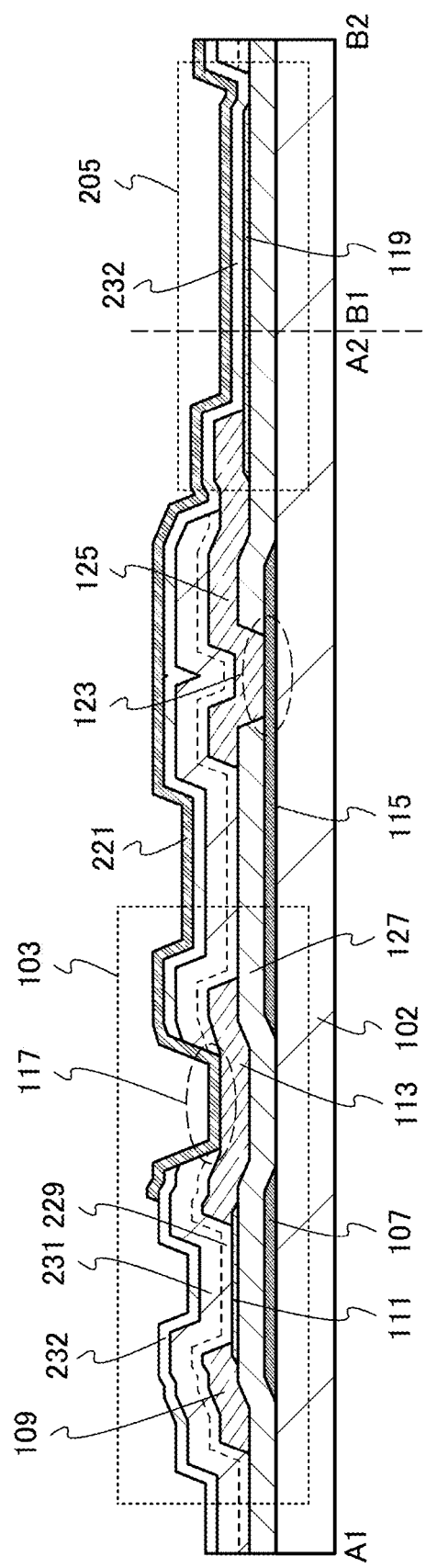
FIG. 21 is a cross-sectional view illustrating a semiconductor device of one embodiment of the present invention.

Next, FIG. 21 is a cross-sectional view taken along dashed-dotted lines A1-A2 and B1-B2 in FIG. 20.

A cross-sectional structure of the pixel 201 in this embodiment is as follows. The scan line 107 including a gate electrode of the transistor 103 and the capacitor line 115 over the same surface as the scan line 107 are provided over the substrate 102. A gate insulating film 127 is provided over the scan line 107 and the capacitor line 115. The semiconductor film 111 is provided over a portion of the gate insulating film 127 which overlaps with the scan line 107, and the semiconductor film 119 is provided over the gate insulating film 127. The signal line 109 including a source electrode of the transistor 103 and the conductive film 113 including a drain electrode of the transistor 103 are provided over the semiconductor film 111 and the gate insulating film 127. The opening 123 reaching the capacitor line 115 is formed in the gate insulating film 127, and the conductive film 125 is provided in and over the opening 123 and over the gate insulating film 127 and the semiconductor film 119. The insulating film 229, the insulating film 231, and the insulating film 232 functioning as protective insulating films of the transistor 103 are provided over the gate insulating film 127, the signal line 109, the semiconductor film 111, the conductive film 113, the conductive film 125, and the semiconductor film 119. The insulating film 232 is provided at least over a portion of the semiconductor film 119 which serves as the capacitor 205. The opening 117 reaching the conductive film 113 is formed in the insulating film 229, the insulating film 231, and the insulating film 232, and the pixel electrode 221 is provided in and over the opening 117 and over the insulating film 232. Note that a base insulating film may be provided between the substrate 102, and the scan line 107, the capacitor line 115, and the gate insulating film 127.

The insulating film 229 is similar to the insulating film 129 described in Embodiment 1. The insulating film 231 is similar to the insulating film 131 described in Embodiment 1. The insulating film 232 is similar to the insulating film 132 described in Embodiment 1. The pixel electrode 221 is similar to the pixel electrode 121 described in Embodiment 1.

When the insulating film 232 serves as a dielectric film between the semiconductor film 119 serving as one electrode and the pixel electrode 221 serving as the other electrode as in the capacitor 205 in this embodiment, the thickness of the dielectric film can be thinner than that of the dielectric film of the capacitor 105 in Embodiment 1. Thus, the capacitor 205 in this embodiment can have larger charge capacity than the capacitor 205 in Embodiment 1.

The insulating film 232 is preferably a nitride insulating film similarly to the insulating film 132 in Embodiment 1. The insulating film 232 is in contact with the semiconductor film 119, so that nitrogen or hydrogen contained in the nitride insulating film can enter the semiconductor film 119 and thus the semiconductor film 119 can be an n-type semiconductor film and have higher conductivity. Further, when the insulating film 232 is formed using a nitride insulating film and is subjected to heat treatment while it is in contact with the semiconductor film 119, nitrogen or hydrogen contained in the nitride insulating film can be released to the semiconductor film 119.

The semiconductor film 119 has a region with higher conductivity than that of the semiconductor film 111. With this structure, a portion of the semiconductor film 119 which is in contact with the insulating film 232 is n-type and has higher conductivity than a portion of the semiconductor film 111 which is in contact with the insulating film 229.

Figure 46:
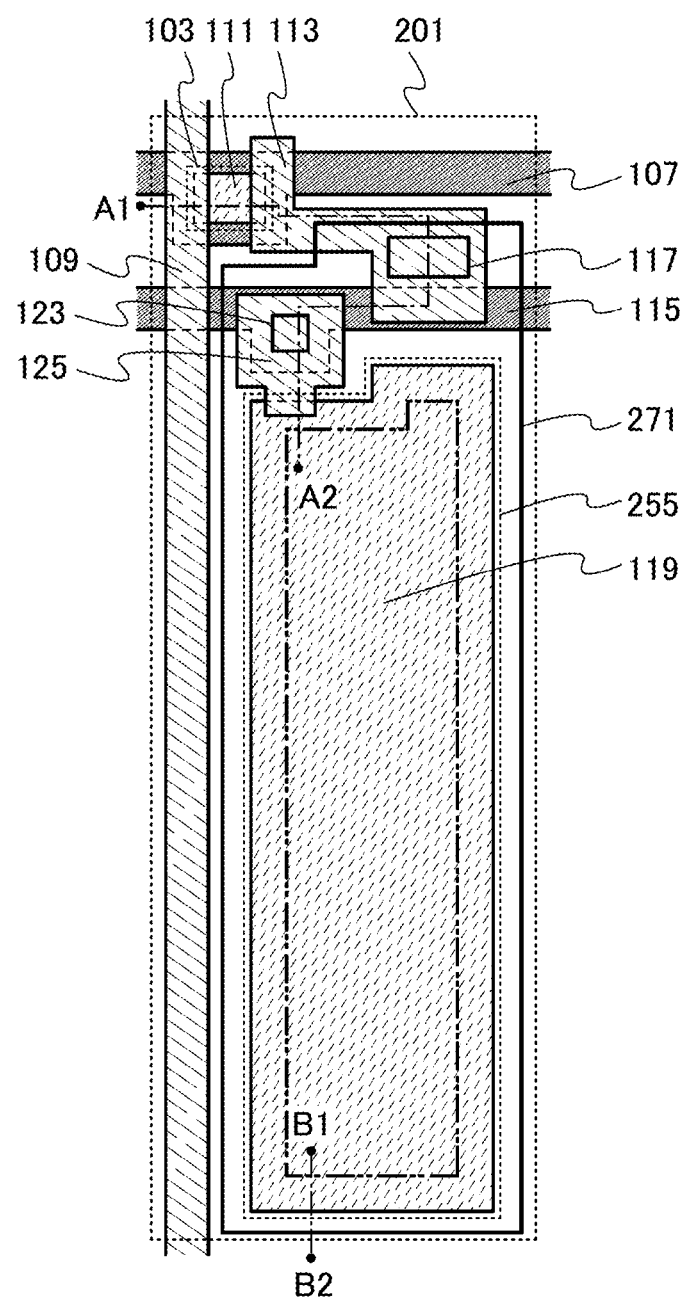
FIG. 46 is a top view illustrating a semiconductor device of one embodiment of the present invention.

Note that in FIG. 20, an edge of a region (indicated by dashed-two dotted lines) where the insulating film 229 (not illustrated) and the insulating film 231 (not illustrated) are not provided is on the outer side than the semiconductor film 119; however, an edge of a region (indicated by dashed-two dotted lines) where an insulating film 279 (not illustrated) and the insulating film 281 (not illustrated) are not provided may be over the semiconductor film 119 as illustrated in FIG. 46.

Figure 47:
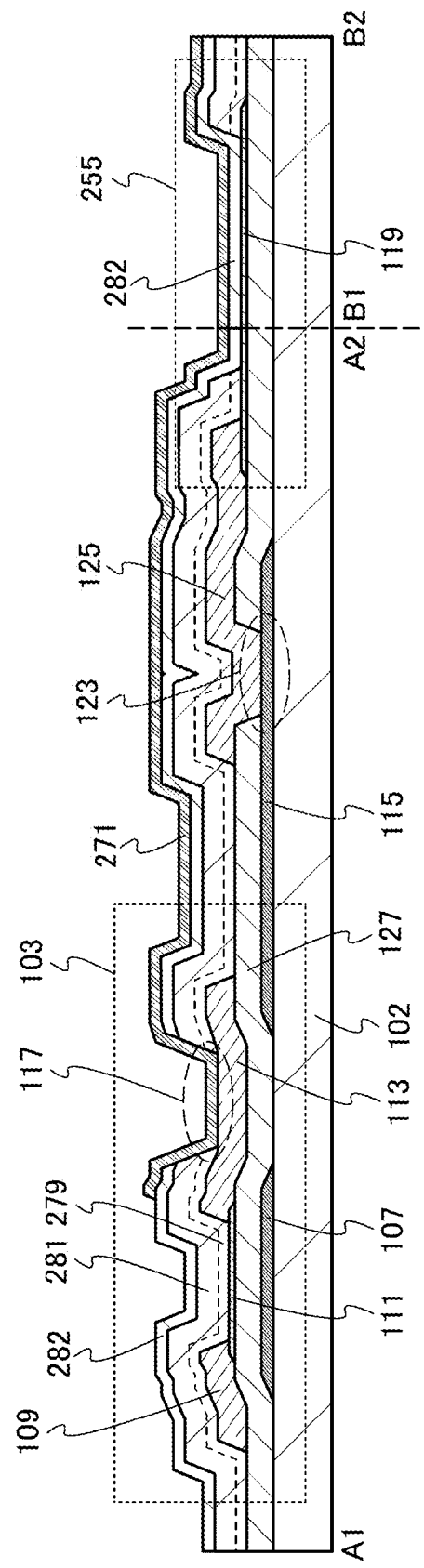
FIG. 47 is a cross-sectional view illustrating a semiconductor device of one embodiment of the present invention.

FIG. 47 is a cross-sectional view taken along dashed-dotted lines A1-A2 and B1-B2 in FIG. 46.

In FIG. 47, the insulating film 279, the insulating film 281, and an insulating film 282 functioning as protective insulating films of the transistor 103 are provided over the gate insulating film 127, the signal line 109, the semiconductor film 111, the conductive film 113, the conductive film 125, and the semiconductor film 119. Edges of the insulating film 279 and the insulating film 281 overlap the semiconductor film 119. A capacitor 255 includes the semiconductor film 119, the insulating film 282, and a pixel electrode 271. The insulating film 279, the insulating film 281, and the insulating film 282 are similar to the insulating film 129, the insulating film 131, and the insulating film 132 described in Embodiment 1. The pixel electrode 271 is similar to the pixel electrode 121 described in Embodiment 1. As illustrated in FIG. 47, edges of the insulating film 279 and the insulating film 281 overlap the semiconductor film 119, so that the gate insulating film 127 can be prevented from being excessively etched in etching of the insulating film 279 and the insulating film 281.

In an operation method of the capacitor 205 in the semiconductor device of this embodiment, the potential of the semiconductor film 119 (in other words, the potential of the capacitor line 115) is constantly lower than the potential of the pixel electrode 121 by greater than or equal to the threshold voltage (Vth) of the capacitor 205 (MOS capacitor) in a period when the capacitor 205 is operated, as in the operation method of the capacitor 105 in Embodiment 1. However, in the capacitor 205, the semiconductor film 119 serving as one electrode is n-type and has high conductivity, so that the threshold voltage (Vth) is shifted in the negative direction as shown by a dashed line in FIG. 38. The potential of the semiconductor film 119 (in other words, the potential of the capacitor line 115) can be raised in accordance with the shift amount of the threshold voltage (Vth) of the capacitor 205 in the negative direction, from the lowest potential of the pixel electrode 121. Therefore, in the case where the threshold voltage of the capacitor 205 is a larger negative value, the potential of the capacitor line 115 can be higher than the potential of the pixel electrode 121 as in FIG. 39B.

When the semiconductor film 119 serving as one electrode of the capacitor 205 is n-type and has high conductivity as in this embodiment, the threshold voltage can be shifted in the negative direction, so that the range of the potential needed for operating the capacitor 205 can be made large as compared with the case of the capacitor 105 in Embodiment 1. Thus, in this embodiment, the capacitor 205 can be constantly operated with stability in an operation period of the capacitor 205, which is preferable.

Further, since the semiconductor film 119 included in the capacitor 205 is n-type and has high conductivity, enough charge capacity can be obtained even when the plane area of the capacitor 205 is reduced. An oxide semiconductor included in the semiconductor film 119 transmits 80% to 90% of light; thus, when the area of the semiconductor film 119 is reduced and a region where the semiconductor film 119 is not formed is provided in the pixel, the transmissivity with respect to light emitted from a light source such as a backlight can be increased.

<Fabrication Method of Semiconductor Device>

Next, a fabrication method of the semiconductor device of this embodiment will be described with reference to FIGS. 22A and 22B and FIGS. 23A and 23B.

First, the scan line 107 and the capacitor line 115 are formed over the substrate 102. An insulating film which is to be processed into the gate insulating film 127 is formed over the substrate 102, the scan line 107, and the capacitor line. The semiconductor film 111 and the semiconductor film 119 are formed over the insulating film. The opening 123 reaching the capacitor line 115 is formed in the insulating film to form the gate insulating film 127 and then the signal line 109, the conductive film 113, and the semiconductor film 125 are formed. The insulating film 128 is formed over the gate insulating film 127, the signal line 109, the conductive film 113, the conductive film 125, and the semiconductor film 119. The insulating film 130 is formed over the insulating film 128 (see FIG. 22A). The above steps can be performed with reference to Embodiment 1.

Then, a mask is formed over a portion of the insulating film 130 which overlaps with at least the semiconductor film 119. Processing is performed to form an insulating film 228 and an insulating film 230 with the use of the mask and expose the semiconductor film 119. An insulating film 233 is formed over the exposed region and the insulating film 130 (see FIG. 22B). As the mask, a resist mask formed through a photolithography process can be used, and the processing can be performed by one of or both dry etching and wet etching. The insulating film 233 is similar to the insulating film 133 described in Embodiment 1. Note that heat treatment may be performed while the insulating film 233 is in contact with the semiconductor film 119, for example, after formation of the insulating film 233. The above steps can also be performed with reference to Embodiment 1.

Then, the opening 117 reaching the conductive film 113 is formed in the insulating film 228, the insulating film 230, and the insulating film 233 to form the insulating film 229, the insulating film 231, and the insulating film 232 (see FIG. 23A). The pixel electrode 221 in contact with the conductive film 113 through the opening 117 is formed (see FIG. 23B). The above steps can also be performed with reference to Embodiment 1.

Through the above steps, the semiconductor device of this embodiment can be fabricated.

Modification Example

In the semiconductor device of one embodiment of the present invention, the structure of the capacitor can be changed as appropriate. A specific example of the structure will be described with reference to FIG. 24. Here, only a capacitor 245 different from the capacitor 105 described with reference to FIG. 2 and FIG. 3 will be described.

In order that the semiconductor film 119 be n-type and have higher conductivity, the gate insulating film 227 has a layered structure of the insulating film 225 formed of a nitride insulating film and the insulating film 226 formed of an oxide insulating film and only the insulating film 225 is provided in a region where at least the semiconductor film 119 is provided. With such a structure, the nitride insulating film forming the insulating film 225 is in contact with the bottom surface of the semiconductor film 119, so that the semiconductor film 119 can be n-type and have higher conductivity (see FIG. 24). In this case, a dielectric film of the capacitor 245 is the insulating film 129, the insulating film 131, and the insulating film 132. As the insulating film 225 and the insulating film 226, insulating films which can be used as the gate insulating film 127 can be used as appropriate, and the insulating film 225 may be formed using an insulating film similar to the insulating film 132. Further, to obtain this structure, the insulating film 226 is processed as appropriate with reference to Embodiment 1. The structure illustrated in FIG. 24 can prevent a reduction in the thickness of the semiconductor film 119 due to etching of the insulating film 129 and the insulating film 131, so that the yield is increased as compared with the semiconductor device illustrated in FIG. 21.

Figure 24:
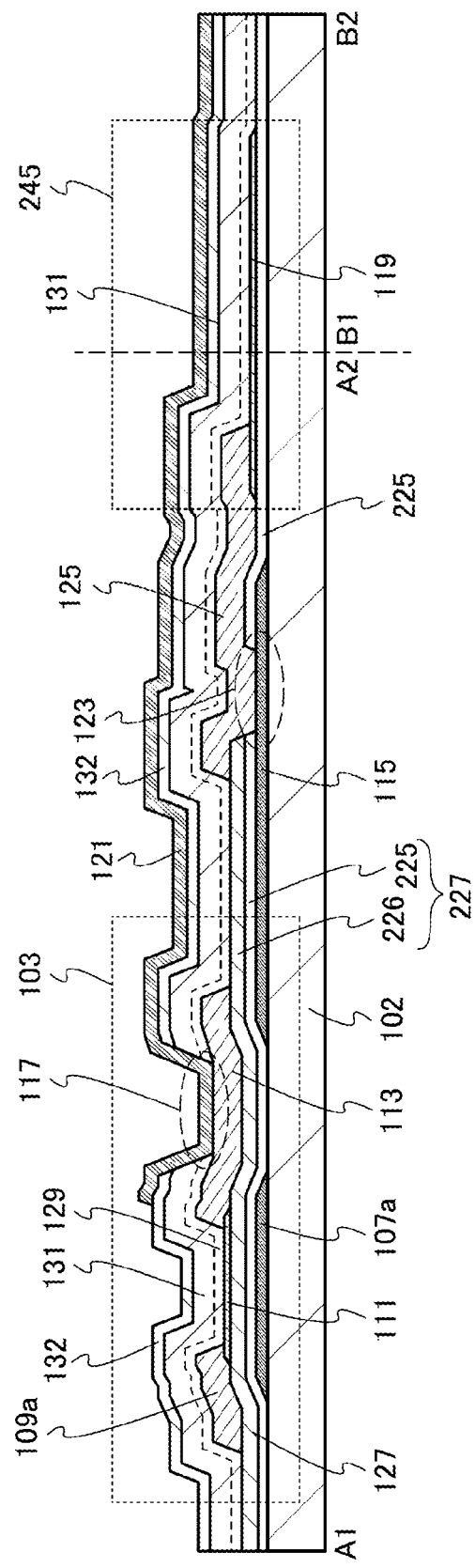
FIG. 24 is a cross-sectional view illustrating a semiconductor device of one embodiment of the present invention.

In the structure illustrated in FIG. 24, the top surface of the semiconductor film 119 may be in contact with the insulating film 132. That is, portions of the insulating film 129 and the insulating film 131 in FIG. 24 which are in contact with the semiconductor film 119 may be removed. In that case, a dielectric film of the capacitor 245 is the insulating film 132. When the top and bottom surfaces of the semiconductor film 119 are in contact with the nitride insulating film, the semiconductor film 119 can be n-type and have higher conductivity more efficiently and sufficiently than the semiconductor film 119 which is in contact with only one of surfaces of the nitride insulating film.

As described above, the use of the semiconductor film formed through the same formation step as the semiconductor film included in the transistor, for one electrode of the capacitor, allows fabrication of a semiconductor device including the capacitor whose charge capacity is increased while improving the aperture ratio to typically 55% or more, preferably 60% or more. As a result, the semiconductor device can have excellent display quality.

Further, oxygen vacancies and impurities such as hydrogen in the oxide semiconductor film, which is a semiconductor film included in the transistor, are reduced, so that the semiconductor device of one embodiment of the present invention has favorable electrical characteristics.

Note that the structures and the like described in this embodiment can be combined as appropriate with any of the structures and modification examples thereof described in the other embodiments and example.

Embodiment 3

In this embodiment, a semiconductor device of one embodiment of the present invention which has a structure different from that in the above embodiment will be described with reference to the drawings. A semiconductor device of one embodiment of the present invention will be described taking a liquid crystal display device as an example in this embodiment. In the semiconductor device described in this embodiment, a semiconductor film included in a capacitor is different from that in the capacitor in the above embodiment. The above embodiment can be referred to for components in the semiconductor device in this embodiment which are similar to those of the semiconductor device in the above embodiment.

<Structure of Semiconductor Device>

Figure 25:
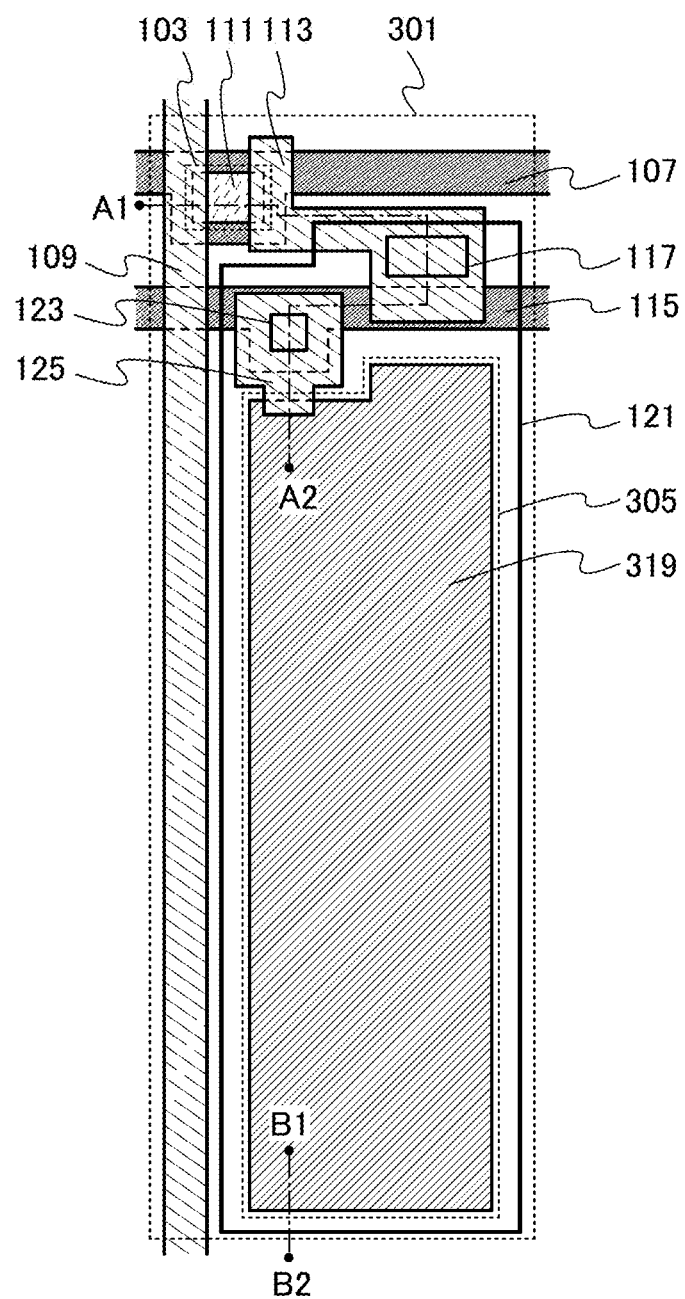
FIG. 25 is a top view illustrating a semiconductor device of one embodiment of the present invention.

Next, a specific example of the structure of the pixel 301 provided in a pixel portion of the liquid crystal display device described in this embodiment will be described. FIG. 25 is a top view of the pixel 301. The pixel 301 in FIG. 25 is provided with a capacitor 305 provided in a region surrounded by the capacitor lines 115 and the signal lines 109 in the pixel 301. The capacitor 305 is electrically connected to the capacitor line 115 through the conductive film 125 provided in and over the opening 123. The capacitor 305 includes a semiconductor film 319 including an oxide semiconductor and having higher conductivity than the semiconductor film 111, the pixel electrode 121, and an insulating film (not illustrated in FIG. 25) which is formed as a dielectric film over the transistor 103. The semiconductor film 319, the pixel electrode 121, and the dielectric film transmit light; accordingly, the capacitor 305 transmits light.

In the case where the semiconductor film 319 is an oxide semiconductor film, the conductivity of the oxide semiconductor film is greater than or equal to 10 S/cm and less than or equal to 1000 S/cm, preferably greater than or equal to 100 S/cm and less than or equal to 1000 S/cm.

As described above, the semiconductor film 319 transmits light. That is to say, the capacitor 305 can be formed large (in a large area) in the pixel 301. Therefore, the semiconductor device can have charge capacity increased while improving the aperture ratio to typically 55% or more, preferably 60% or more. As a result, the semiconductor device can have excellent display quality. Further, since the semiconductor film 319 included in the capacitor 305 is n-type and has high conductivity, enough charge capacity can be obtained even when the plane area of the capacitor 305 is reduced. An oxide semiconductor included in the semiconductor film 319 transmits 80 to 90% of light; thus, when the area of the semiconductor film 319 is reduced and a region where the semiconductor film 319 is not formed is provided in the pixel, the transmissivity with respect to light emitted from a light source such as a backlight can be increased.

Figure 26:
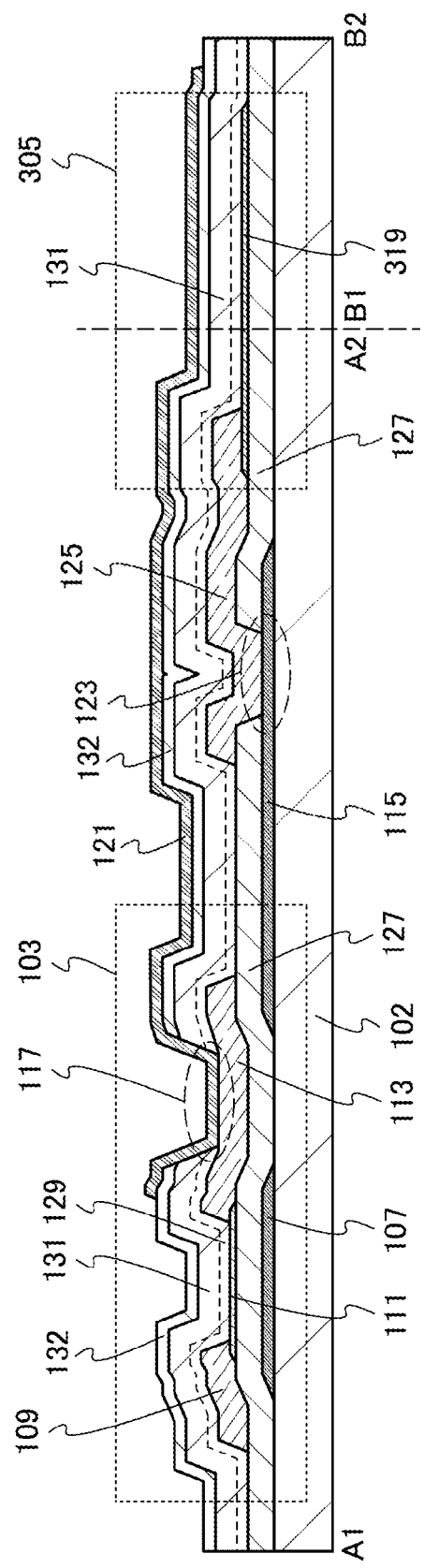
FIG. 26 is a cross-sectional view illustrating a semiconductor device of one embodiment of the present invention.

Next, FIG. 26 is a cross-sectional view taken along dashed-dotted lines A1-A2 and B1-B2 in FIG. 25.

A cross-sectional structure of the pixel 301 of a liquid crystal display device is as follows. The scan line 107 including the gate electrode of the transistor 103 is provided over the substrate 102. The gate insulating film 127 is provided over the scan line 107. The semiconductor film 111 is provided over a portion of the gate insulating film 127 which overlaps with the scan line 107, and the semiconductor film 319 is provided over the gate insulating film 127. The signal line 109 including the source electrode of the transistor 103 and the conductive film 113 including the drain electrode of the transistor 103 are provided over the semiconductor film 111 and the gate insulating film 127. Further, the capacitor line 115 is provided over the gate insulating film 127 and the semiconductor film 319. The insulating film 129, the insulating film 131, and the insulating film 132 functioning as protective insulating films of the transistor 103 are provided over the gate insulating film 127, the signal line 109, the semiconductor film 111, the conductive film 113, the semiconductor film 319, and the capacitor line 115. The opening 117 reaching the conductive film 113 is formed in the insulating film 129, the insulating film 131, and the insulating film 132, and the pixel electrode 121 is provided in the opening 117 and over the insulating film 132. Note that a base insulating film may be provided between the substrate 102, and the scan line 107 and the gate insulating film 127.

In the capacitor 105 in this example, the semiconductor film 319 which is n-type and has higher conductivity than the semiconductor film 111 serves as one of a pair of electrodes, the pixel electrode 121 serves as the other of the pair of electrodes, and the insulating film 129, the insulating film 131, and the insulating film 132 serve as a dielectric film provided between the pair of electrodes.

For the semiconductor film 319, an oxide semiconductor which can be used for the semiconductor film 111 can be used. The semiconductor film 319 can be formed concurrently with the semiconductor film 111 and thus contains a metal element of an oxide semiconductor included in the semiconductor film 111. Further, the semiconductor film 319 preferably has higher conductivity than the semiconductor film 111 and thus preferably contains an element (dopant) which increases the conductivity. Specifically, the semiconductor film 319 contains one or more selected from boron, nitrogen, fluorine, aluminum, phosphorus, arsenic, indium, tin, antimony, and a rare gas element. The concentration of a dopant contained in the semiconductor film 319 is preferably greater than or equal to $1 \times 10^{19}$ atoms/cm$^3$ and less than or equal to $1 \times 10^{22}$ atoms/cm$^3$, in which case the conductivity of the semiconductor film 319 can be greater than or equal to 10 S/cm and less than or equal to 1000 S/cm, preferably greater than or equal to 100 S/cm and less than or equal to 1000 S/cm, so that the semiconductor film 319 can sufficiently function as one electrode of the capacitor 305. The semiconductor film 319 has a region with higher conductivity than that of the semiconductor film 111. With this structure, a portion of the semiconductor film 319 which is in contact with the insulating film 132 has higher conductivity than a portion of the semiconductor film 111 which is in contact with the insulating film 129.

<Fabrication Method of Semiconductor Device>

Next, a fabrication method of the semiconductor device of this embodiment will be described with reference to FIGS. 27A and 27B and FIGS. 28A and 28B.

First, the scan line 107 and the capacitor line 115 are formed over the substrate 102. An insulating film which is to be processed into the gate insulating film 127 is formed over the substrate 102, the scan line 107, and the capacitor line. The semiconductor film 111 and the semiconductor film 119 are formed over the insulating film (see FIG. 27A). The above steps can be performed with reference to Embodiment 1.

After that, the semiconductor film 119 is doped with a dopant to form the semiconductor film 319, the opening 123 reaching the capacitor line 115 is formed in the insulating film 126 to form the gate insulating film 127, and then the signal line 109 including the source electrode of the transistor 103, the conductive film 113 including the drain electrode of the transistor 103, and the conductive film 125 which electrically connects the semiconductor film 319 and the capacitor line 115 are formed (see FIG. 27B).

A method of doping the semiconductor film 119 with a dopant is as follows: a mask is provided in a region except the semiconductor film 119 and the semiconductor film 119 is doped with one or more dopants selected from boron, nitrogen, fluorine, aluminum, phosphorus, arsenic, indium, tin, antimony, and a rare gas element by an ion implantation method, an ion doping method, or the like. Alternatively, the semiconductor film 119 may be exposed to plasma containing the dopant to dope the semiconductor film 119 with the dopant, instead of employing an ion implantation method or an ion doping method. Note that heat treatment may be performed after the semiconductor film 119 is doped with the dopant. The heat treatment can be performed as appropriate with reference to the details of heat treatment for dehydration or dehydrogenation of the semiconductor film 111 and the semiconductor film 119.

The step of doping with the dopant may be performed after formation of the signal line 109, the conductive film 113, and the conductive film 125, in which case a portion of the semiconductor film 319 which is in contact with the signal line 109, the conductive film 113, and the conductive film 125 is not doped with the dopant.

Then, the insulating film 128 is formed over the gate insulating film 127, the signal line 109, the semiconductor film 111, the conductive film 113, the conductive film 125, and the semiconductor film 319. The insulating film 130 is formed over the insulating film 128, and the insulating film 133 is formed over the insulating film 130 (see FIG. 28A). The above steps can be performed with reference to Embodiment 1.

Then, the opening 117 reaching the conductive film 113 is formed in the insulating film 128, the insulating film 130, and the insulating film 133 to form the insulating film 129, the insulating film 131, and the insulating film 132 (see FIG. 28A). The pixel electrode 121 in contact with the conductive film 113 through the opening 117 is formed (see FIG. 26). The above steps can also be performed with reference to Embodiment 1.

Through the above steps, the semiconductor device of this embodiment can be fabricated.

As described above, the use of the semiconductor film formed in the same formation step as the semiconductor film included in the transistor, for one electrode of the capacitor, allows fabrication of a semiconductor device including the capacitor whose charge capacity is increased while improving the aperture ratio. As a result, the semiconductor device can have an excellent display quality.

Further, oxygen vacancies and impurities such as hydrogen in the oxide semiconductor film, which is a semiconductor film included in the transistor, are reduced, so that the semiconductor device of one embodiment of the present invention has favorable electrical characteristics.

Note that the structures and the like described in this embodiment can be combined as appropriate with any of the structures and the like described in the other embodiments and example.

Embodiment 4

In this embodiment, a semiconductor device of one embodiment of the present invention will be described taking, as an example, a fringe field switching (FFS) mode liquid crystal display device in which liquid crystal molecules are oriented with a lateral electric field. Note that the above embodiment can be referred to for components in the semiconductor device described in this embodiment which are similar to those of the semiconductor device described in the above embodiment.

<Structure of Semiconductor Device>

FIGS. 40A and 40B are top views of a pixel 501 described in this embodiment. FIG. 40A is a top view of the pixel 501 where a common electrode 521 is not provided, and FIG. 40B is a top view of the pixel 501 where the common electrode 521 is provided in FIG. 40A.

The pixel 501 in FIGS. 40A and 40B includes the transistor 103 and a capacitor 505 connected to the transistor 103. The capacitor 505 includes a semiconductor film 519 having higher conductivity than the semiconductor film 111, a common electrode 521 formed using a light-transmitting conductive film, and a light-transmitting insulating film (not illustrated in FIGS. 40A and 40B) included in the transistor 103. That is to say, the capacitor 505 has a light-transmitting property. Further, the semiconductor film 519 having higher conductivity than the semiconductor film 111 is connected to the conductive film 113 in the transistor 103 and functions as a pixel electrode. The common electrode 521 has openings (slits). By application of an electric field between the common electrode and the pixel electrode, a region where the semiconductor film 519, the light-transmitting insulating film, and the common electrode 521 overlap one another functions as a capacitor and the liquid crystals can be controlled so as to be oriented in the direction parallel with a substrate. Thus, an FFS mode liquid crystal display device achieves a wide viewing angle and high image quality.

Figure 41:
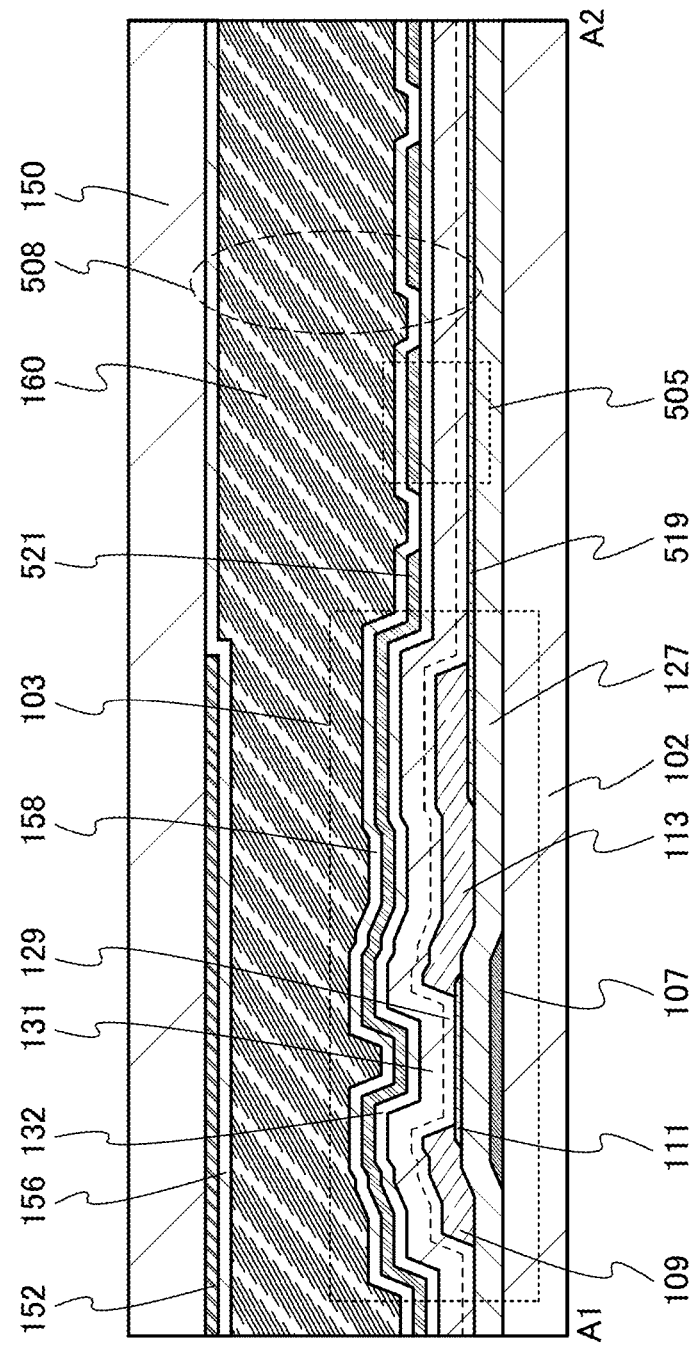
FIG. 41 is a cross-sectional view illustrating a semiconductor device of one embodiment of the present invention.

FIG. 41 is a cross-sectional view of the substrate 102 along dashed-dotted line A1-A2 in FIG. 40B.

A cross-sectional structure of the pixel 501 of this embodiment is as follows. A scan line 107 including the gate electrode of the transistor 103 is provided over the substrate 102. The gate insulating film 127 is provided over the scan line 107. The semiconductor film 111 is provided over a portion of the gate insulating film 127 which overlaps with the scan line 107, and the semiconductor film 519 having higher conductivity than the semiconductor film 111 is provided over the gate insulating film 127. The signal line 109 including the source electrode of the transistor 103 and the conductive film 113 including the drain electrode of the transistor 103 are provided over the semiconductor film 111 and the gate insulating film 127. The conductive film 113 including the drain electrode is connected to the semiconductor film 519, and the semiconductor film 519 having higher conductivity than the semiconductor film 111 functions as a pixel electrode. The insulating film 129, the insulating film 131, and the insulating film 132 functioning as protective insulating films of the transistor 103 are provided over the gate insulating film 127, the signal line 109, the semiconductor film 111, the conductive film 113, and the semiconductor film 519. The common electrode 521 is provided over the insulating film 129, the insulating film 131, and the insulating film 132. The common electrode 521 is provided continuously without being separated between pixels in the pixel portion. Note that a base insulating film may be provided between the substrate 102, and the scan line 107 and the gate insulating film 127.

The semiconductor film 519 having higher conductivity than the semiconductor film 111 can be formed of a semiconductor film similar to the semiconductor film 119 described in Embodiment 2 and the semiconductor film 319 described in Embodiment 3, as appropriate. The common electrode 521 can be formed using a material similar to that of the pixel electrode 121 described in Embodiment 1.

One electrode of the capacitor 505 of this embodiment is formed using a semiconductor film having higher conductivity than the semiconductor film 111 and connected to the conductive film 113 of the transistor, whereby the conductive film 113 and the semiconductor film 519 can be directly connected to each other without forming an opening, and the planarity of the transistor 103 and the capacitor 505 can be improved. Further, a capacitor line is not provided and the common electrode 521 having a light-transmitting property is made to function as a capacitor line, so that the aperture ratio of the pixel 501 can be further increased.

Embodiment 5

In this embodiment, transistors which can be used in the scan line driver circuit 104 and the signal line driver circuit 106 will be described with reference to FIG. 36B, FIG. 42, FIGS. 43A and 43B, and FIGS. 44A and 44B.

A transistor 685 illustrated in FIG. 36B includes a gate electrode 607 over the substrate 102, the gate insulating film 127 over the gate electrode 607, the semiconductor film 111 over a portion of the gate insulating film 127 which overlaps with the gate electrode 607, and a source electrode 609 and the drain electrode 613 over the semiconductor film 111 and the gate insulating film 127. Further, the insulating film 129, the insulating film 131, and the insulating film 132 serving as protective insulating films of the transistor 685 are provided over the gate insulating film 127, the source electrode 609, the semiconductor film 111, and the drain electrode 613. The conductive film 687 is provided over the insulating film 132. The conductive film 687 overlaps with the gate electrode 607 with the semiconductor film 111 interposed therebetween.

In the transistor 685, the conductive film 687 overlapping the gate electrode 607 with the semiconductor film 111 interposed therebetween is provided, whereby a variation in gate voltage at which an on-current rises at different drain voltages can be reduced. Further, a current flowing between the source electrode and the drain electrode in a side of the semiconductor film 111 facing the conductive film 687 can be controlled and thus variations in electrical characteristics between different transistors can be reduced. In addition, the provision of the conductive film 687 leads to a reduction in effect of a change in ambient electric field on the semiconductor film 111; therefore, the reliability of the transistor can be improved. Further, when the potential of the conductive film 687 is the same or substantially the same as the minimum potential (Vss; for example, the potential of the source electrode 609 in the case where the potential of the source electrode 609 is a reference potential), a variation in threshold voltage of the transistor can be reduced and the reliability of the transistor can be improved.

Note that it is preferable that the length of the width of the conductive film 687 between the source electrode 609 and the drain electrode 613 be smaller than the distance between the source electrode 609 and the drain electrode 613. In other words, it is preferable that the conductive film 687 be provided in a position overlapping part of a channel formation region in the semiconductor film 111 of the transistor 685. When the conductive film 687 is provided in such a manner and the distance between the semiconductor film 111 and the conductive film 687 is small, that is, the insulating film 129, the insulating film 131, and the insulating film 132 serving as protective insulating films are thin, an effect of an electric field on the conductive film 687 can be reduced and the range of variation in threshold voltage of the transistor 685 can be reduced.

Calculation results of voltages applied to the conductive film 687 in the transistor 685 and operations of the transistor will be described with reference to FIG. 42, FIGS. 43A and 43B, and FIGS. 44A and 44B.

Figure 42:
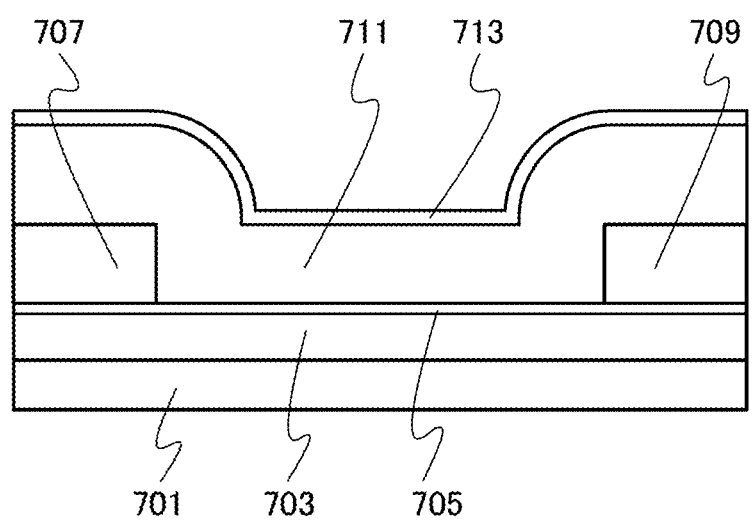
FIG. 42 is a cross-sectional view illustrating the structure of a transistor used for calculation.

FIG. 42 illustrates the structure of a transistor used for the simulation. Note that device simulation software "Atlas" produced by Silvaco Inc. was used for the calculation.

In the transistor in FIG. 42, a gate insulating film 703 is provided over a gate electrode 701; an oxide semiconductor film 705 is provided as a semiconductor film over the gate insulating film 703; a source electrode 707 and a drain electrode 709 are provided over the oxide semiconductor film 705; an insulating film 711 serving as a protective insulating film is provided over the gate insulating film 703, the oxide semiconductor film 705, the source electrode 707, and the drain electrode 709; and a conductive film 713 is provided over the insulating film 711.

Note that in the calculation, the work function ϕM of the gate electrode 701 was set to 5.0 eV. The gate insulating film 703 had a layered structure of a 400-nm-thick film with a dielectric constant of 7.5 and a 50-nm-thick film with a dielectric constant of 4.1. The oxide semiconductor film 705 was a single IGZO (111) layer. The band gap Eg of the IGZO layer was 3.15 eV, the electron affinity χ was 4.6 eV, the dielectric constant was 15, the electron mobility was 10 cm$^2$/Vs, and the donor density Nd was $1 \times 10^{13}$/cm$^3$. The work function ϕsd of the source electrode 707 and the drain electrode 709 was 4.6 eV and the ohmic contact between the oxide semiconductor film 705 and the source electrode 707 and the drain electrode 709 was obtained. The dielectric constant of the insulating film 711 was 3.9 and the thickness thereof was 550 nm. The work function ϕM of the conductive film 713 was 4.8 eV. Note that defect levels, surface scattering, and the like in the oxide semiconductor film 705 were not considered. The channel length and the channel width of the transistor were 3 μm and 50 μm, respectively.

Figure 43A:
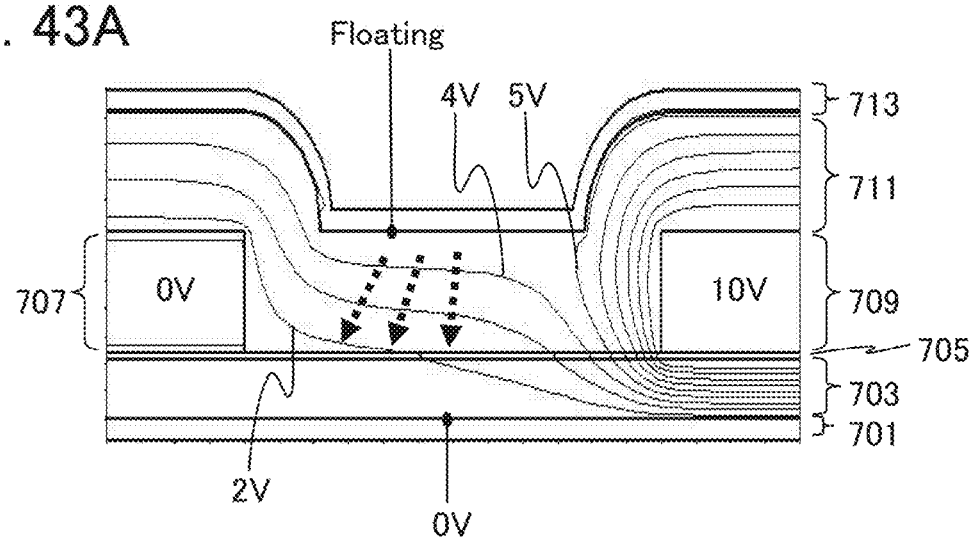
FIGS. 43A and 43B are cross-sectional views each illustrating equipotential curves of a transistor which are obtained by calculation.
Figure 43B:
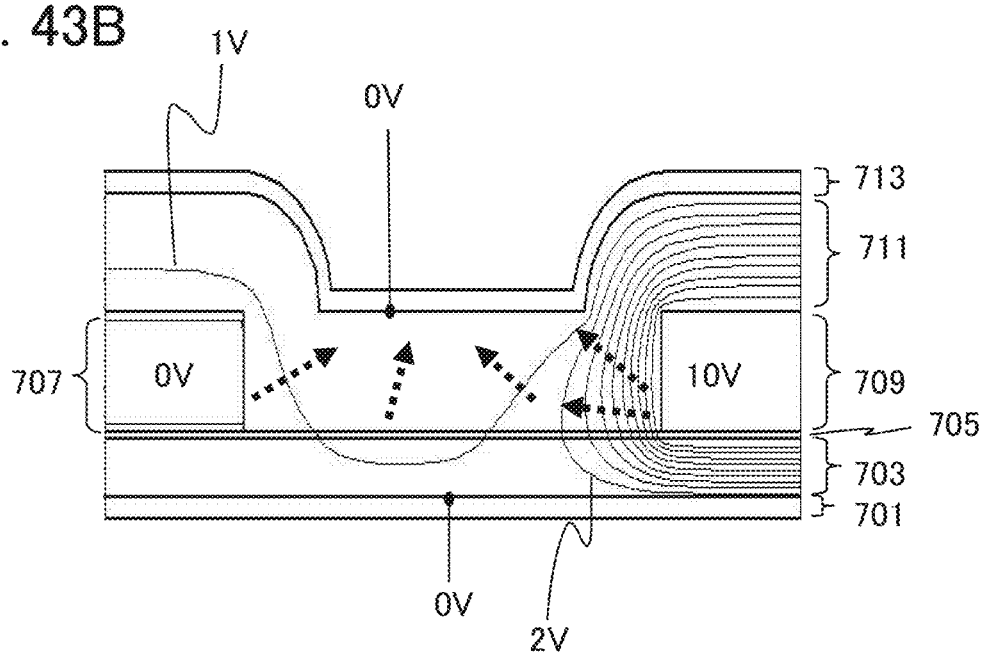

Next, FIGS. 43A and 43B show calculation results of the Id-Vg characteristics of a transistor where the potential of the conductive film 713 is floating and a transistor where the potential of the conductive film 713 is fixed to 0 V.

FIG. 43A shows equipotential curves in the case where the gate electrode 701 of the transistor is supplied with a potential of 0 V, the source electrode 707 is supplied with a potential of 0 V, the drain electrode 709 is supplied with a potential of 10 V, and the conductive film 713 is floating. FIG. 43B shows equipotential curves in the case where the gate electrode 701 of the transistor is supplied with a potential of 0 V, the source electrode 707 is supplied with a potential of 0 V, the drain electrode 709 is supplied with a potential of 10 V, and the conductive film 713 is supplied with the potential equal to that of the source electrode 707, here, a potential of 0 V.

Figure 44A:
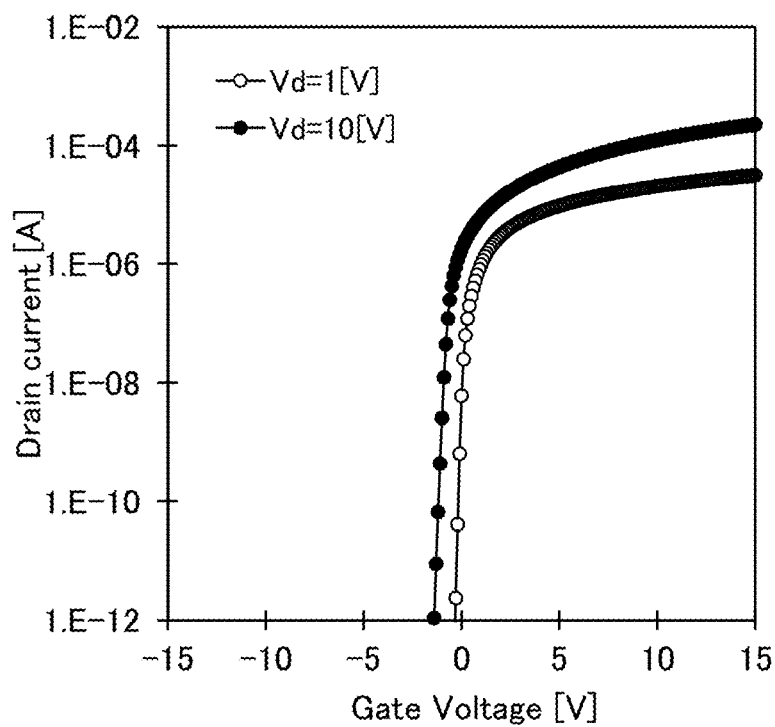
FIGS. 44A and 44B are graphs each showing current-voltage curves of a transistor which are obtained by calculation.
Figure 44B:
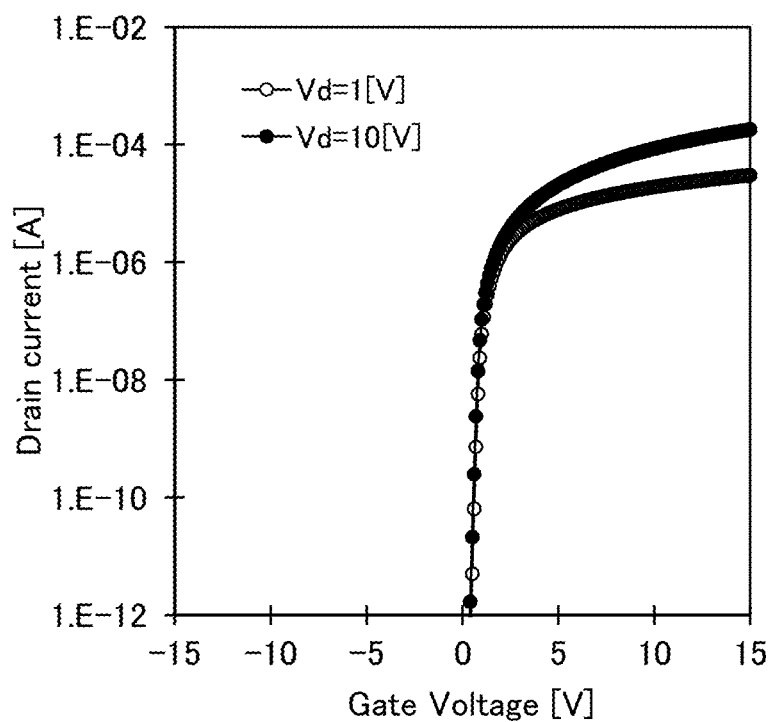

In FIGS. 43A and 43B, dashed arrows indicate the direction of an electric field in the insulating film 711. The electric field is generated from the high potential side to the low potential side in the direction perpendicular to the equipotential curves. FIGS. 44A and 44B show current-voltage curves of the transistors illustrated in FIGS. 43A and 43B. The horizontal axis represents voltage of the gate electrode and the longitudinal axis represents current of the drain electrode. In FIGS. 44A and 44B, curves obtained by plotting black dots is a current-voltage curve in the case where the drain voltage (Vd) is 1 V, and curves obtained by plotting white dots is a current-voltage curve in the case where the drain voltage (Vd) is 10 V.

The current-voltage curves in FIG. 44A show that in the case where the conductive film 713 is floating, the gate voltage at which the on-state current starts to flow is more on the negative side when the drain voltage Vd is 10 V than when the drain voltage Vd is 1 V. That is to say, the gate voltage at which the on-state current starts to flow depends on the drain voltage.

When the gate voltage is 0 V and the drain voltage is 10 V, an electric field from the conductive film 713 to a back channel of the oxide semiconductor film 705 is generated as shown by the dashed arrows in FIG. 43A. The potential of the conductive film 713 is raised to approximately 5 V because a drain voltage (Vd) of 10 V is applied. Further, the conductive film 713 is close to the oxide semiconductor film 705; thus, the potential of the conductive film 713 effectively serves as a positive potential. Therefore, electrons are excessively induced to the back channel side and a current flowing through the back channel increases and accordingly, the threshold voltage of the current-voltage characteristics is shifted in the negative direction.

On the other hand, the gate voltage at which the on-state current starts to flow of one of the current-voltage curves in FIG. 44B corresponds to that of the other regardless of the drain voltage.

As in FIG. 43B, in the insulating film 711, an electric field is generated from the drain electrode 709 to the conductive film 713, which implies that the conductive film 713 functions so that electrons on the back channel side are substantially excluded. Thus, the gate voltage at which the on-state current starts to flow is slightly more on the positive side than that of the curves in FIG. 44A.

From the above description, when a conductive film is provide so as to overlap a channel formation region of an oxide semiconductor film and the potential of the conductive film is fixed to 0 V, variations in gate voltage at which the on-state current starts to flow at different drain voltages can be reduced.

Embodiment 6

In this embodiment, one embodiment which can be applied to an oxide semiconductor film, which is a semiconductor film, in the transistor and the capacitor included in the semiconductor device described in the above embodiment will be described.

The oxide semiconductor film is preferably formed using any of an amorphous oxide semiconductor, a single crystal oxide semiconductor, a polycrystalline oxide semiconductor, and an oxide semiconductor including a crystalline portion (a c-axis aligned crystalline oxide semiconductor (CAAC-OS).

The CAAC-OS film is one of oxide semiconductor films including a plurality of crystal parts, and most of the crystal parts each fit inside a cube whose one side is less than 100 nm. Thus, there is a case where a crystal part included in the CAAC-OS film fits inside a cube whose one side is less than 10 nm, less than 5 nm, or less than 3 nm. The density of defect states of the CAAC-OS film is lower than that of the microcrystalline oxide semiconductor film. The CAAC-OS film will be described in detail below.

In a transmission electron microscope (TEM) image of the CAAC-OS film, a boundary between crystal parts, that is, a grain boundary is not clearly observed. Thus, in the CAAC-OS film, a reduction in electron mobility due to the grain boundary is less likely to occur.

According to the TEM image of the CAAC-OS film observed in a direction substantially parallel with a sample surface (cross-sectional TEM image), metal atoms are arranged in a layered manner in the crystal parts. Each metal atom layer has a morphology reflected by a surface over which the CAAC-OS film is formed (hereinafter, a surface over which the CAAC-OS film is formed is referred to as a formation surface) or a top surface of the CAAC-OS film, and is arranged in parallel with the formation surface or the top surface of the CAAC-OS film.

On the other hand, according to the TEM image of the CAAC-OS film observed in a direction substantially perpendicular to the sample surface (plan TEM image), metal atoms are arranged in a triangular or hexagonal configuration in the crystal parts. However, there is no regularity of arrangement of metal atoms between different crystal parts.

From the results of the cross-sectional TEM image and the plan TEM image, alignment is found in the crystal parts in the CAAC-OS film.

A CAAC-OS film is subjected to structural analysis with an X-ray diffraction (XRD) apparatus. For example, when the CAAC-OS film including an $InGaZnO_4$ crystal is analyzed by an out-of-plane method, a peak appears frequently when the diffraction angle (2θ) is around 31°. This peak is derived from the (009) plane of the $InGaZnO_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in a direction substantially perpendicular to the c-axis, a peak appears frequently when 2θ is around 56°. This peak is derived from the (110) plane of the $InGaZnO_4$ crystal. Here, analysis (φ scan) is performed under conditions where the sample is rotated around a normal vector of a sample surface as an axis (φ axis) with 2θ fixed at around 56°. In the case where the sample is a single-crystal oxide semiconductor film of $InGaZnO_4$, six peaks appear. The six peaks are derived from crystal planes equivalent to the (110) plane. On the other hand, in the case of a CAAC-OS film, a peak is not clearly observed even when 0 scan is performed with 2θ fixed at around 56°.

According to the above results, in the CAAC-OS film having c-axis alignment, while the directions of a-axes and b-axes are different between crystal parts, the c-axes are aligned in a direction parallel with a normal vector of a formation surface or a normal vector of a top surface. Thus, each metal atom layer arranged in a layered manner observed in the cross-sectional TEM image corresponds to a plane parallel with the a-b plane of the crystal.

Note that the crystal part is formed concurrently with deposition of the CAAC-OS film or is formed through crystallization treatment such as heat treatment. As described above, the c-axis of the crystal is aligned with a direction parallel with a normal vector of a formation surface or a normal vector of a top surface. Thus, for example, in the case where a shape of the CAAC-OS film is changed by etching or the like, the c-axis might not be necessarily parallel with a normal vector of a formation surface or a normal vector of a top surface of the CAAC-OS film.

Further, the degree of crystallinity in the CAAC-OS film is not necessarily uniform. For example, in the case where crystal growth leading to the CAAC-OS film occurs from the vicinity of the top surface of the film, the degree of the crystallinity in the vicinity of the top surface is higher than that in the vicinity of the formation surface in some cases. Further, when an impurity is added to the CAAC-OS film, the crystallinity in a region to which the impurity is added is changed, and the degree of crystallinity in the CAAC-OS film varies depending on regions.

Note that when the CAAC-OS film with an $InGaZnO_4$ crystal is analyzed by an out-of-plane method, a peak of 2θ may also be observed at around 36°, in addition to the peak of 2θ at around 31°. The peak of 2θ at around 36° indicates that a crystal having no c-axis alignment is included in part of the CAAC-OS film. It is preferable that in the CAAC-OS film, a peak of 2θ appear at around 31° and a peak of 2θ do not appear at around 36°.

There are three methods for forming a CAAC-OS film.

The first method is to form an oxide semiconductor film at a temperature in the range of 100° C. to 450° C. to form, in the oxide semiconductor film, crystal parts in which the c-axes are aligned in the direction parallel with a normal vector of a surface where the oxide semiconductor film is formed or a normal vector of a surface of the oxide semiconductor film.

The second method is to form an oxide semiconductor film with a small thickness and then heat it at a temperature in the range of 200° C. to 700° C., to form, in the oxide semiconductor film, crystal parts in which the c-axes are aligned in the direction parallel with a normal vector of a surface where the oxide semiconductor film is formed or a normal vector of a surface of the oxide semiconductor film.

The third method is to form a first oxide semiconductor film with a small thickness, then heat it at a temperature in the range of 200° C. to 700° C., and form a second oxide semiconductor film to form, in the second oxide semiconductor film, crystal parts in which the c-axes are aligned in the direction parallel with a normal vector of the surface where the second oxide semiconductor film is formed or to a normal vector of the top surface of the second oxide semiconductor film.

In a transistor using the CAAC-OS film as the oxide semiconductor film, change in electrical characteristics due to irradiation with visible light or ultraviolet light is small. Thus, the transistor using the CAAC-OS film as the oxide semiconductor film has high reliability.

Further, it is preferable that the CAAC-OS film be formed by a sputtering method using a polycrystalline oxide semiconductor sputtering target. When ions collide with the sputtering target, a crystal region included in the sputtering target may be separated from the target along an a-b plane; in other words, a flat-plate-like or pellet-like sputtered particle having a plane parallel with an a-b plane may flake off from the sputtering target. In this case, the flat-plate-like or pellet-like sputtered particle reaches a surface where the CAAC-OS film is to be deposited while maintaining its crystal state, whereby the CAAC-OS film can be deposited.

For the deposition of the CAAC-OS film, the following conditions are preferably used.

By reducing the mixing of impurities during the deposition, the crystal state can be prevented from being broken by the impurities. For example, the concentration of impurities (e.g., hydrogen, water, carbon dioxide, or nitrogen) which exist in the deposition chamber may be reduced. Furthermore, the concentration of impurities in a deposition gas may be reduced. Specifically, a deposition gas whose dew point is −80° C. or lower, preferably −100° C. or lower is used.

By increasing the heating temperature of the surface where the CAAC-OS film is formed (for example, the substrate heating temperature) during the deposition, migration of a sputtered particle is likely to occur after the sputtered particle reaches the surface where the CAAC-OS film is formed. Specifically, the temperature of the surface where the CAAC-OS film is formed during the deposition is higher than or equal to 100° C. and lower than or equal to 740° C., preferably higher than or equal to 150° C. and lower than or equal to 500° C. By increasing the temperature of the surface where the CAAC-OS film is formed during the deposition, when the flat-plate-like or pellet-like sputtered particle reaches the surface where the CAAC-OS film is formed, migration occurs on the surface, so that flat planes of the sputtered particles are attached to the surface.

Furthermore, it is preferable that the proportion of oxygen in the deposition gas be increased and the power be optimized in order to reduce plasma damage at the deposition. The proportion of oxygen in the deposition gas is 30 vol % or higher, preferably 100 vol %.

As an example of the sputtering target, an In—Ga—Zn-based oxide target is described below.

The polycrystalline In—Ga—Zn-based oxide target is made by mixing $InO_X$ powder, $GaO_Y$ powder, and $ZnO_Z$ powder in a predetermined molar ratio, applying pressure, and performing heat treatment at a temperature higher than or equal to 1000° C. and lower than or equal to 1500° C. This pressure treatment may be performed while cooling is performed or may be performed while heating is performed. X, Y, and Z are each a given positive number. Here, the predetermined molar ratio of $InO_X$ powder to $GaO_Y$ powder and $ZnO_Z$ powder is, for example, 2:2:1, 8:4:3, 3:1:1, 1:1:1, 4:2:3, or 3:1:2. The kinds of powders and the molar ratio for mixing the powders may be determined as appropriate depending on the desired sputtering target.

Further, the oxide semiconductor film may have a structure in which a plurality of oxide semiconductor films are stacked. For example, the oxide semiconductor film may have a layered structure of a first oxide semiconductor film and a second oxide semiconductor film which are formed using metal oxides with different atomic ratios. For example, the first oxide semiconductor film may be formed using one of an oxide containing two kinds of metals, an oxide containing three kinds of metals, and an oxide containing four kinds of metals, and the second oxide semiconductor film may be formed using one of the above which is different from the one used for the first oxide semiconductor film.

Alternatively, the oxide semiconductor film may have a two-layer structure where the constituent elements of the first oxide semiconductor film and the second oxide semiconductor film are the same while the atomic ratios of the constituent elements of the first oxide semiconductor film and the second oxide semiconductor film are different. For example, the first oxide semiconductor film may contain In, Ga, and Zn at an atomic ratio of 3:1:2, and the second oxide semiconductor film may contain In, Ga, and Zn at an atomic ratio of 1:1:1. Alternatively, the first oxide semiconductor film may contain In, Ga, and Zn at an atomic ratio of 2:1:3, and the second oxide semiconductor film may contain In, Ga, and Zn at an atomic ratio of 1:3:2. Note that a proportion of each atom in the atomic ratio of the oxide semiconductor film varies within a range of ±20% as an error.

In this case, in one of the first oxide semiconductor film and the second oxide semiconductor film, which is closer to the gate electrode (the oxide semiconductor film on the channel side), the atomic ratio of In to Ga is preferably as follows: In≥Ga. In the other oxide semiconductor film, which is farther from the gate electrode (the oxide semiconductor film on the back channel side), the atomic ratio of In to Ga is preferably as follows: In<Ga. With a layered structure of these oxide semiconductor films, a transistor having high field-effect mobility can be formed. On the other hand, the atomic ratio of In to Ga in the oxide semiconductor film closer to the gate electrode (the oxide semiconductor film on the channel side) satisfies the relation In<Ga and the atomic ratio of In to Ga in the oxide semiconductor film on the back channel side satisfies the relation In≥Ga, whereby a variation in threshold voltage of a transistor due to a change over time or a reliability test can be reduced.

The first oxide semiconductor film containing In, Ga, and Zn at an atomic ratio of 1:3:2 can be formed by a sputtering method using an oxide target with an atomic ratio of 1:3:2 under the conditions where the substrate temperature is room temperature and a sputtering gas is argon or a mixed gas of argon and oxygen. The second oxide semiconductor film containing In, Ga, and Zn at an atomic ratio of 3:1:2 can be formed by a sputtering method using an oxide target with an atomic ratio of 3:1:2 in a manner similar to that of the first oxide semiconductor film.

Alternatively, the oxide semiconductor film may have a three-layer structure of a first oxide semiconductor film, a second oxide semiconductor film, and a third oxide semiconductor film, in which the constituent elements thereof are the same and the atomic ratios of the constituent elements of the first oxide semiconductor film, the second oxide semiconductor film, and the third oxide semiconductor film are different. The case where the oxide semiconductor film has a three-layer structure will be described with reference to FIG. 29.

Figure 29:
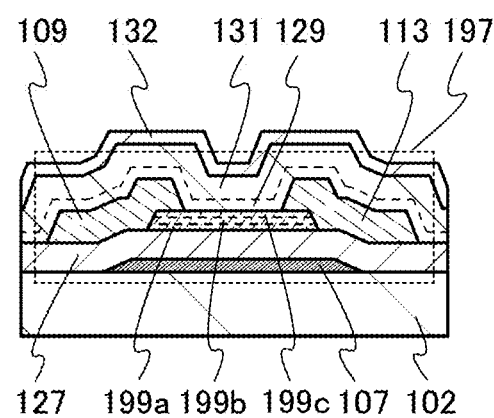
FIG. 29 is a cross-sectional view illustrating a semiconductor device of one embodiment of the present invention.

In a transistor illustrated in FIG. 29, a first oxide semiconductor film 199a, a second oxide semiconductor film 199b, and a third oxide semiconductor film 199c are stacked in this order from the gate insulating film 127 side. As a material of the first oxide semiconductor film 199a and the third oxide semiconductor film 199c, a material represented by $InM1_xZn_yO_z$ (x≥1, y>1, z>0, M1=Ga, Hf, or the like) is used. Note that in the case where a material of the first oxide semiconductor film 199a and the third oxide semiconductor film 199c contains Ga, a material containing a large proportion of Ga, specifically, a material which can be represented by $InM1_xZn_yO_z$ where x is larger than 10 is unsuitable because powder might be generated in deposition.

As a material of the second oxide semiconductor film 199b, a material which can be represented by $InM2_xZn_yO_z$ (x≥1, y≥x, z>0, M2=Ga, Sn, or the like) is used.

Materials of the first to third oxide semiconductor films 199a to 199c are appropriately selected so that a well structure is formed in which the conduction band of the second oxide semiconductor film 199b is deeper from the vacuum level than the conduction bands of the first and third oxide semiconductor films 199a and 199c.

Note that silicon and carbon, which are Group 14 elements, are donor supply sources in an oxide semiconductor film, so that silicon or carbon contained in an oxide semiconductor film makes it n-type. Thus, the concentration of silicon contained in an oxide semiconductor film and the concentration of carbon contained in an oxide semiconductor film are each less than or equal to $3 \times 10^{18}/cm^3$, preferably less than or equal to $3 \times 10^{17}/cm^3$. It is particularly preferable to employ a structure where the first and third oxide semiconductor films 199a and 199c sandwich or surround the second oxide semiconductor film 199b serving as a carrier path so that a large number of Group 14 elements do not enter the second oxide semiconductor film 199b. That is to say, the first and third oxide semiconductor films 199a and 199c can also be called barrier films which prevent Group 14 elements such as silicon and carbon from entering the second oxide semiconductor film 199b.

For example, the atomic ratio of In to Ga and Zn in the first oxide semiconductor film 199a may be 1:3:2, the atomic ratio of In to Ga and Zn in the second oxide semiconductor film 199b may be 3:1:2, and the atomic ratio of In to Ga and Zn in the third oxide semiconductor film 199c may be 1:1:1. Note that the third oxide semiconductor film 199c can be formed by a sputtering method using an oxide target containing In, Ga, and Zn at an atomic ratio of 1:1:1.

Alternatively, a three-later structure may be employed in which the first oxide semiconductor film 199a contains In, Ga, and Zn at an atomic ratio of 1:3:2, the second oxide semiconductor film 199b contains In, Ga, and Zn at an atomic ratio of 1:1:1 or 1:3:2, and the third oxide semiconductor film 199c contains In, Ga, and Zn at an atomic ratio of 1:3:2.

Since the constituent elements of the first to third oxide semiconductor films 199a to 199c are the same, the second oxide semiconductor film 199b has fewer defect states (trap levels) at the interface with the first oxide semiconductor film 199a. Specifically, the defect states (trap levels) are fewer than those at the interface between the gate insulating film 127 and the first oxide semiconductor film 199a. For this reason, when the oxide semiconductor films are stacked in the above manner, a variation in the threshold voltage of a transistor due to a change over time or a reliability test can be reduced.

Further, when materials of the first to third oxide semiconductor films 199a to 199c are appropriately selected so that a well structure is formed in which the conduction band of the second oxide semiconductor film 199b is deeper from the vacuum level than the conduction bands of the first and third oxide semiconductor films, the field-effect mobility of the transistor can be increased and a variation in the threshold voltage of the transistor due to a change over time or a reliability test can be reduced.

Further, the first to third oxide semiconductor films 199a to 199c may be formed using oxide semiconductor films having different crystallinities. That is, the first to third oxide semiconductor films may be formed using any of a single crystal oxide semiconductor film, a polycrystalline oxide semiconductor film, a microcrystalline oxide semiconductor film, an amorphous oxide semiconductor film, and a CAAC-OS film, as appropriate. When an amorphous oxide semiconductor film is used as any one of the first to third oxide semiconductor films 199a to 199c, internal stress or external stress of the oxide semiconductor film is relieved, variations in characteristics of a transistor is reduced and a variation in the threshold voltage of the transistor due to a change over time or a reliability test can be reduced.

At least the second oxide semiconductor film 199b, which can serve as a channel formation region, is preferably a CAAC-OS film. An oxide semiconductor film on the back channel side, in this embodiment, the third oxide semiconductor film 199c is preferably an amorphous oxide semiconductor film or a CAAC-OS film. With such a structure, a variation in the threshold voltage of a transistor due to a change over time or a reliability test can be reduced.

Note that the structures and the like described in this embodiment can be combined as appropriate with any of the structures and the like described in the other embodiments and example.

Embodiment 7

A semiconductor device (also referred to as a display device) having a display function can be fabricated using a transistor and a capacitor examples of which are described in the above embodiments. Further, part or all of a driver circuit which includes a transistor can be formed over a substrate where a pixel portion is formed, whereby a system-on-panel can be formed. In this embodiment, examples of display devices using the transistor examples which are shown in the above embodiments will be described with reference to FIGS. 30A to 30C, FIGS. 31A and 31B, and FIGS. 32A to 32C. FIGS. 31A and 31B are cross-sectional views illustrating cross-sectional structures taken along dashed-dotted line M-N in FIG. 30B. Note that FIGS. 31A and 31B each illustrate only part of the structure of a pixel portion.

Figure 30A:
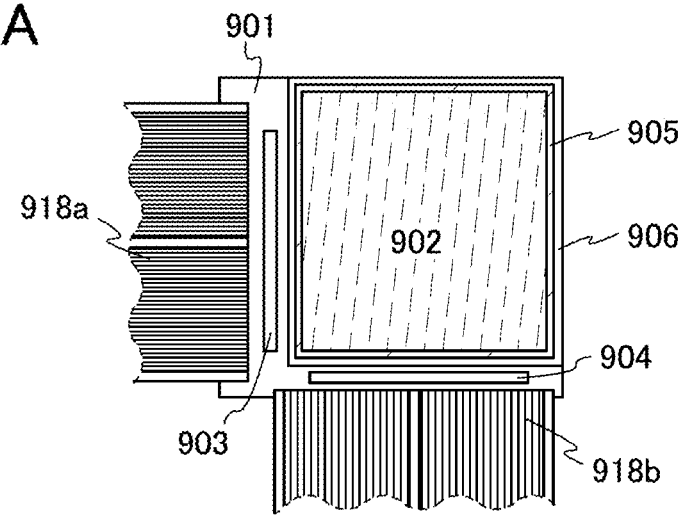
FIGS. 30A to 30C are top views each illustrating a semiconductor device of one embodiment of the present invention.

In FIG. 30A, a sealant 905 is provided so as to surround a pixel portion 902 provided over a first substrate 901, and the pixel portion 902 is sealed with the sealant 905 and a second substrate 906. In FIG. 30A, a signal line driver circuit 903 and a scan line driver circuit 904 each are formed using a single-crystal semiconductor or a polycrystalline semiconductor over a substrate prepared separately, and mounted in a region different from the region surrounded by the sealant 905 over the first substrate 901. Further, various signals and potentials are supplied to the signal line driver circuit 903, the scan line driver circuit 904, and the pixel portion 902 from flexible printed circuits (FPCs) 918a and 918b.

Figure 30B:
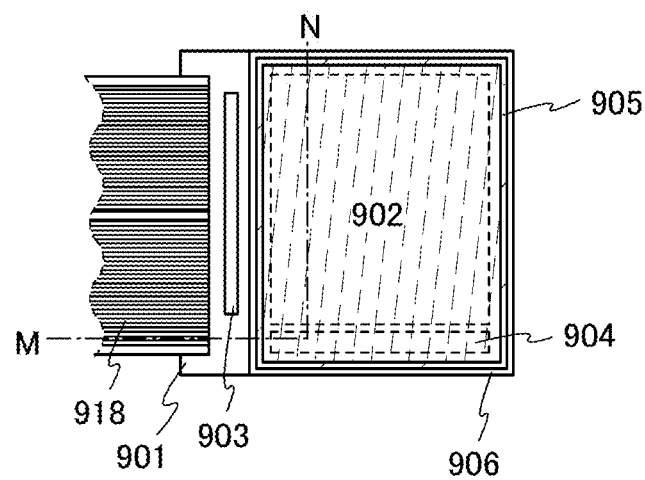
Figure 30C:
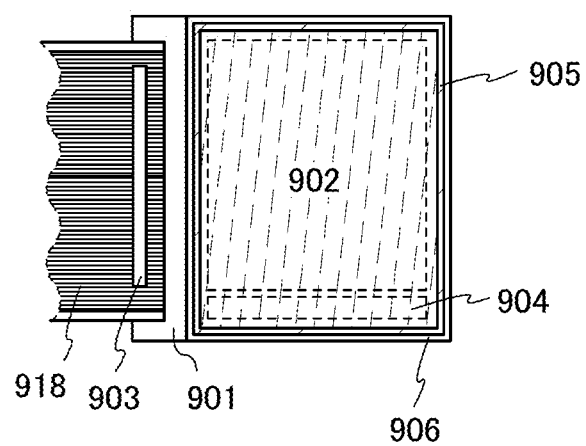

In FIGS. 30B and 30C, the sealant 905 is provided so as to surround the pixel portion 902 and the scan line driver circuit 904 which are provided over the first substrate 901. The second substrate 906 is provided over the pixel portion 902 and the scan line driver circuit 904. Thus, the pixel portion 902 and the scan line driver circuit 904 are sealed together with a display element, with the first substrate 901, the sealant 905, and the second substrate 906. In FIGS. 30B and 30C, a signal line driver circuit 903 formed using a single crystal semiconductor or a polycrystalline semiconductor over a substrate separately prepared is mounted in a region different from the region surrounded by the sealant 905 over the first substrate 901. In FIGS. 30B and 30C, various signals and potentials are supplied to the signal line driver circuit 903, the scan line driver circuit 904, and the pixel portion 902 from an FPC 918.

Although FIGS. 30B and 30C each illustrate an example in which the signal line driver circuit 903 is formed separately and mounted on the first substrate 901, this structure is not necessarily employed. The scan line driver circuit may be separately formed and then mounted, or only part of the signal line driver circuit or part of the scan line driver circuit may be separately formed and then mounted.

Note that a connection method of a separately formed driver circuit is not particularly limited, and a chip on glass (COG) method, a wire bonding method, a tape automated bonding (TAB) method, or the like can be used. FIG. 30A illustrates an example in which the signal line driver circuit 903 and the scan line driver circuit 904 are mounted by a COG method. FIG. 30B illustrates an example in which the signal line driver circuit 903 is mounted by a COG method. FIG. 30C illustrates an example in which the signal line driver circuit 903 is mounted by a TAB method.

The display device includes in its category a panel in which a display element is sealed, and a module in which an IC and the like including a controller are mounted on the panel.

Note that the display device in this specification refers to an image display device or a display device. The display device may serve as a light source (including a lighting device). Furthermore, the display device also includes all the following modules in its category: a module to which a connector such as an FPC or a TCP is attached; a module having a TCP at the tip of which a printed wiring board is provided; and a module in which an integrated circuit (IC) is directly mounted on a display element by a COG method.

The pixel portion and the scan line driver circuit which are provided over the first substrate include a plurality of transistors; any of the transistors described in the above embodiments can be used therein.

As the display element provided in the display device, a liquid crystal element (also referred to as a liquid crystal display element) or a light-emitting element (also referred to as a light-emitting display element) can be used. The light-emitting element includes, in its category, an element whose luminance is controlled by current or voltage, and specifically includes, in its category, an inorganic electroluminescent (EL) element and an organic EL element. Furthermore, a display medium whose contrast is changed by an electric effect of electronic ink or the like can be used. FIGS. 31A and 31B each illustrates an example of a liquid crystal display device including a liquid crystal element as a display element.

The liquid crystal display device illustrated in FIG. 31A is a vertical electric field mode liquid crystal display device. The liquid crystal display device includes a connection terminal electrode 915 and a terminal electrode 916. The connection terminal electrode 915 and the terminal electrode 916 are electrically connected to a terminal included in the FPC 918 through an anisotropic conductive agent 919.

The connection terminal electrode 915 is formed using the same conductive film as a first electrode 930. The terminal electrode 916 is formed using the same conductive film as source and drain electrodes of transistors 910 and 911.

Further, the pixel portion 902 and the scan line driver circuit 904 which are provided over the first substrate 901 each include a plurality of transistors, and the transistor 910 included in the pixel portion 902 and the transistor 911 included in the scan line driver circuit 904 are illustrated as an examples. An insulating film 924 corresponding to the insulating film 129, the insulating film 131, and the insulating film 132 in Embodiment 1 is provided over the transistor 910 and the transistor 911. Note that an insulating film 923 serves as a base film.

In this embodiment, the transistor described in Embodiment 1 can be used as the transistor 910. Further, the transistor described in Embodiment 5 in which the conductive film 917 is provided in a position overlapping part of the channel formation region in the oxide semiconductor film of the transistor 911 can be used as the transistor 911. A capacitor 926 is formed using an oxide semiconductor film 927, the insulating film 924, and the first electrode 930. The oxide semiconductor film 927 is connected to a capacitor line 929 through an electrode 928. The electrode 928 is formed using the same materials and steps as the source and drain electrodes of the transistors 910 and 911. The capacitor line 929 is formed using the same materials and steps as gate electrodes of the transistors 910 and 911. Although the capacitor described in Embodiment 1 is illustrated as the capacitor 926 here, any of the capacitors in the other embodiments may be used as appropriate.

The transistor 910 included in the pixel portion 902 is electrically connected to a display element so that a display panel is formed. There is no particular limitation on the display element as long as display can be performed, and any of various kinds of display elements can be used.

A liquid crystal element 913 serving as a display element includes the first electrode 930, a second electrode 931, and a liquid crystal layer 908. An insulating film 932 and an insulating film 933 each serving as an alignment film are provided so that the liquid crystal layer 908 is interposed therebetween. The second electrode 931 is provided on the second substrate 906 side, and the first electrode 930 overlaps with the second electrode 931 with the liquid crystal layer 908 interposed therebetween.

The first electrode and the second electrode (each of which is also referred to as a pixel electrode, a common electrode, a counter electrode, or the like) for applying voltage to the display element may have light-transmitting properties or light-reflecting properties, which depends on the direction in which light is extracted, the position where the electrode is provided, and the pattern structure of the electrode.

The first electrode 930 and the second electrode 931 can be formed using materials similar to those of the pixel electrode 121 and the counter electrode 154 in Embodiment 1 as appropriate.

A spacer 935 is a columnar spacer obtained by selectively etching an insulating film and is provided in order to control the distance (cell gap) between the first electrode 930 and the second electrode 931. Alternatively, a spherical spacer may be used.

In the case where a liquid crystal element is used as the display element, thermotropic liquid crystal, low-molecular liquid crystal, high-molecular liquid crystal, polymer dispersed liquid crystal, ferroelectric liquid crystal, anti-ferroelectric liquid crystal, or the like can be used. Such a liquid crystal material exhibits a cholesteric phase, a smectic phase, a cubic phase, a chiral nematic phase, an isotropic phase, or the like depending on a condition.

Alternatively, liquid crystal which exhibits a blue phase and for which an alignment film is unnecessary may be used. A blue phase is one of liquid crystal phases, which is generated just before a cholesteric phase changes into an isotropic phase while temperature of cholesteric liquid crystal is increased. The blue phase appears only in a narrow temperature range; therefore, a liquid crystal composition into which a chiral material is mixed in order to widen the temperature range is used for the liquid crystal layer. Note that the alignment film is formed using an organic resin containing hydrogen, water, or the like, which might degrade the electrical characteristics of the transistor in the semiconductor device of one embodiment of the present invention. In view of the above, the use of liquid crystal which exhibits a blue phase for the liquid crystal layer 160 enables fabrication of the semiconductor device of one embodiment of the present invention without an organic resin, so that the semiconductor device can be highly reliable.

The first substrate 901 and the second substrate 906 are fixed in place by the sealant 925. As the sealant 925, an organic resin such as a thermosetting resin or a photocurable resin can be used. The sealant 925 is in contact with the insulating film 924. The sealant 925 corresponds to the sealant 905 illustrated in FIGS. 30A to 30C.

In the liquid crystal display device, a black matrix (light-blocking film), an optical member (an optical substrate) such as a polarizing member, a retardation member, or an antireflection member, and the like are provided as appropriate. For example, circular polarization may be obtained by using a polarizing substrate and a retardation substrate. In addition, a backlight, a side light, or the like may be used as a light source.

Since the transistor is easily broken owing to static electricity or the like, a protective circuit for protecting the driver circuit is preferably provided. The protective circuit is preferably formed using a nonlinear element.

Next, a transverse electric field mode liquid crystal display device will be described with reference to FIG. 31B. FIG. 31A is an FFS mode liquid crystal display device which is one example of transverse electric field mode liquid crystal display devices. A structure different from that of the transverse electric field mode liquid crystal display device described in Embodiment 4 will be described.

In the liquid crystal display device illustrated in FIG. 31B, the connection terminal electrode 915 is formed using the same material and steps as a first electrode 940, and the terminal electrode 916 is formed using the same material and steps as the source and drain electrodes of the transistors 910 and 911.

A liquid crystal element 943 includes the first electrode 940, a second electrode 941, and the liquid crystal layer 908 which are formed over the insulating film 924. The first electrode 940 can be formed using the material of the first electrode 930 illustrated in FIG. 31A as appropriate. The planar shape of the first electrode 940 is a comb-like shape, a staircase-like shape, a ladder-like shape, or the like. The second electrode 941 functions as a common electrode and can be formed in a manner similar to that of the semiconductor film 119 described in Embodiment 1. The insulating film 924 is provided between the first electrode 940 and the second electrode 941.

The second electrode 941 is connected to a common wiring 946 through an electrode 945. Note that the electrode 945 is formed using the same conductive film as the source and drain electrodes of the transistors 910 and 911. The common wiring 946 is formed using the same material and steps as the gate electrodes of the transistors 910 and 911. Although the description is made using the capacitor described in Embodiment 1 as the liquid crystal element 943 here, any of the capacitors described in the other embodiments can be used as appropriate.

Figure 32A:
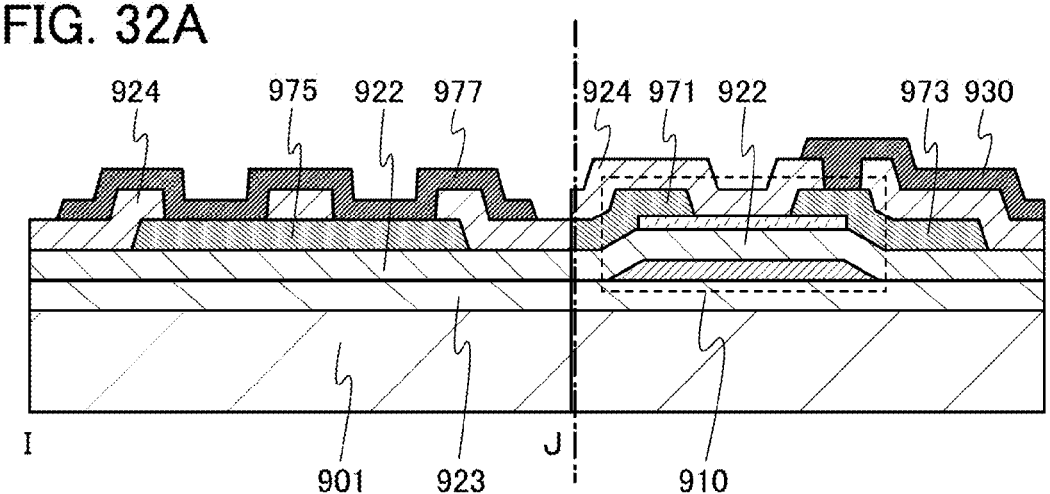
FIGS. 32A and 32B are a cross-sectional view and a top view illustrating a semiconductor device of one embodiment of the present invention.
Figure 32B:
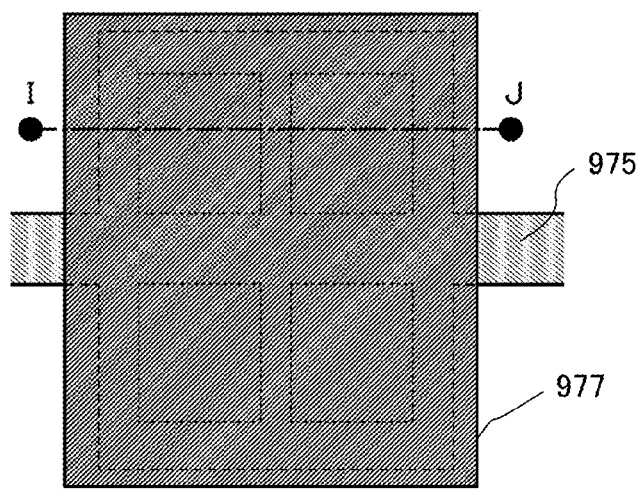
Figure 32C:
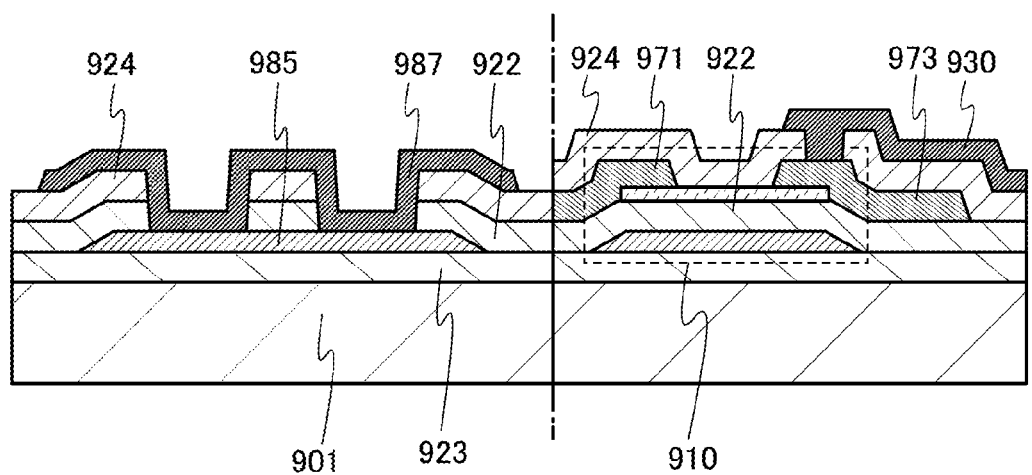
FIG. 32C is a cross-sectional view illustrating a semiconductor device of one embodiment of the present invention.

FIGS. 32A to 32C illustrate examples of the liquid crystal display device in FIG. 31A in which a common connection portion (pad portion) for being electrically connected to the second electrode 931 provided over the substrate 906 is formed over the substrate 901.

The common connection portion is provided in a position overlapping the sealant 925 for bonding the substrate 901 and the substrate 906 and is electrically connected to the second electrode 931 through conductive particles contained in the sealant 925. Alternatively, the common connection portion is provided in a position which does not overlap the sealant (except for the pixel portion) and a paste containing conductive particles is provided separately from the sealant 925 so as to overlap the common connection portion, whereby the common connection portion is electrically connected to the second electrode 931.

FIG. 32A is a cross-sectional view of the common connection portion taken along I-J in the top view in FIG. 32B.

A common potential line 975 is provided over a gate insulating film 922 and is formed using the same material and steps as source and drain electrodes 971 and 973 of the transistor 910 illustrated in FIGS. 32A and 32C.

Further, the common potential line 975 is covered with the insulating film 924, and a plurality of openings are formed in the insulating film 924 at positions overlapping the common potential line 975. These openings are formed through the same steps as a contact hole which connects the first electrode 930 and one of the source electrode 971 and the drain electrode 973 of the transistor 910.

Further, the common potential line 975 is connected to the common electrode 977 through the openings. The common electrode 977 is provided over the insulating film 924 and formed using the same material and steps as the connection terminal electrode 915 and the first electrode 930 in the pixel portion.

In this manner, the common connection portion can be formed in the same process as the switching element in the pixel portion 902.

The common electrode 977 is in contact with the conductive particles contained in the sealant and is electrically connected to the second electrode 931 of the substrate 906.

Alternatively, as illustrated in FIG. 32C, a common potential line 985 may be formed using the same material and steps as the gate electrode of the transistor 910.

In the common connection portion in FIG. 32C, the common potential line 985 is provided under the gate insulating film 922 and the insulating film 924, and a plurality of openings are formed in the gate insulating film 922 and the insulating film 924 at positions overlapping the common potential line 985. These openings are formed by etching the insulating film 924 and further selectively etching the gate insulating film 922, through the same steps as a contact hole which connects the first electrode 930 and one of the source electrode 971 and the drain electrode 973 of the transistor 910.

Further, the common potential line 985 is connected to the common electrode 987 through the openings. The common electrode 987 is provided over the insulating film 924 and formed using the same material and steps as the connection terminal electrode 915 and the first electrode 930 in the pixel portion.

As described above, the use of the transistor and capacitor described in the above embodiment allows fabrication of a semiconductor device including the capacitor whose charge capacity is increased while improving the aperture ratio. As a result, the semiconductor device can have an excellent display quality.

Further, oxygen vacancies and impurities such as hydrogen in the oxide semiconductor film, which is a semiconductor film included in the transistor, are reduced, so that the semiconductor device of one embodiment of the present invention has favorable electrical characteristics.

Note that the structures and the like described in this embodiment can be combined as appropriate with any of the structures and the like described in the other embodiments and example.

Embodiment 8

Figure 33A:
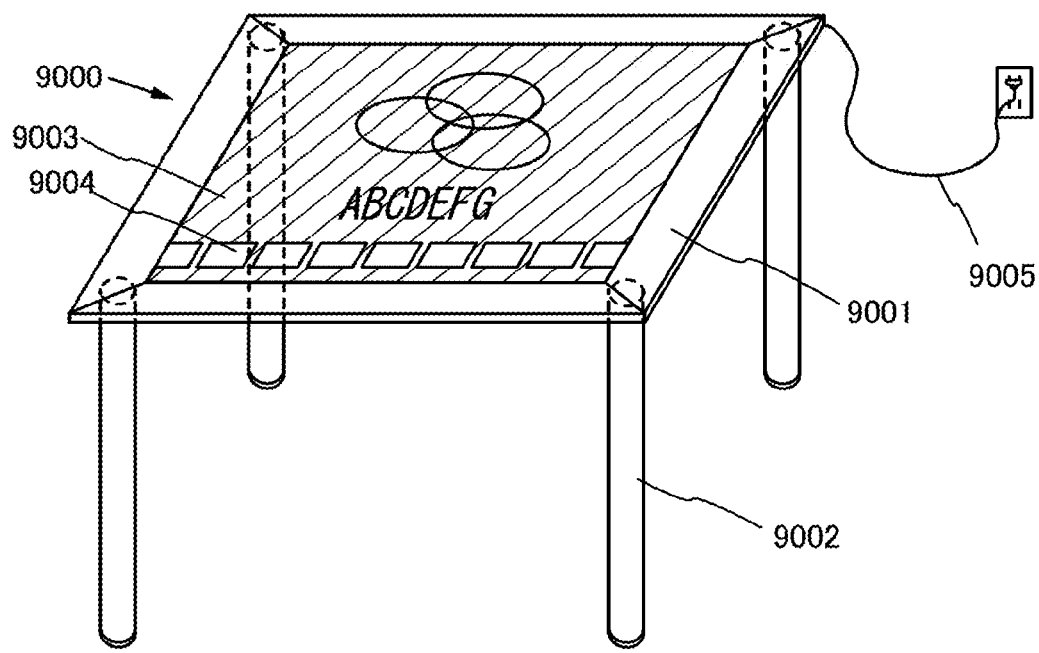
FIGS. 33A to 33C illustrate electronic devices in each of which a semiconductor device of one embodiment of the present invention is used.
Figure 33B:
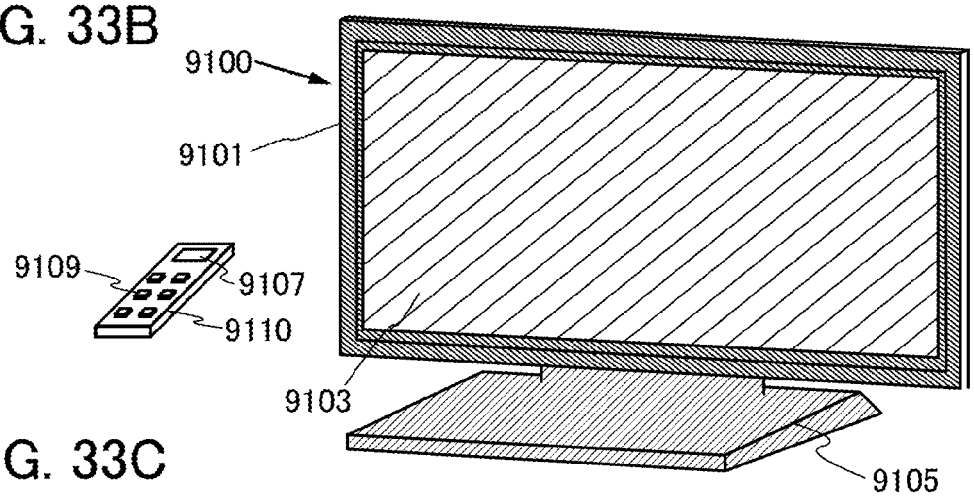
Figure 33C:
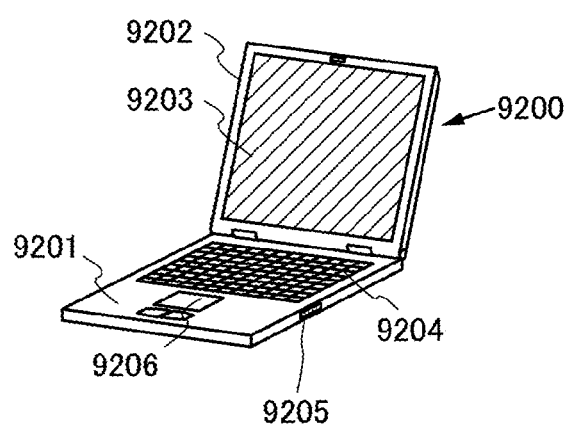

The semiconductor device of one embodiment of the present invention can be used in various electronic devices (including game machines). Examples of electronic devices are a television set (also referred to as a television or a television receiver), a monitor of a computer or the like, cameras such as a digital camera and a digital video camera, a digital photo frame, a mobile phone, a portable game machine, a portable information terminal, an audio reproducing device, game machines (e.g., a pachinko machine and a slot machine), and a game console. FIGS. 33A to 33C illustrate examples of these electronic devices.

FIG. 33A illustrates a table 9000 having a display portion. In the table 9000, a display portion 9003 is incorporated in a housing 9001 and an image can be displayed on the display portion 9003. Note that the housing 9001 is supported by four leg portions 9002. Further, a power cord 9005 for supplying power is provided for the housing 9001.

Any of the semiconductor devices described in the above embodiments can be used for the display portion 9003. Thus, the display portion 9003 can have high display quality.

The display portion 9003 functions as a touch panel. When a user touches displayed buttons 9004 which are displayed on the display portion 9003 of the table 9000 with his/her finger or the like, the user can carry out operation on the screen and data input. Further, when the table may be made to communicate with home appliances or control the home appliances, the table 9000 may function as a control device which controls the home appliances by operation on the screen. For example, with the use of a semiconductor device having an image sensor function, the display portion 9003 can function as a touch panel.

Further, the screen of the display portion 9003 can be placed perpendicular to a floor with a hinge provided for the housing 9001; thus, the table 9000 can also be used as a television set. When a television set having a large screen is set in a small room, an open space is reduced; however, when a display portion is incorporated in a table, a space in the room can be efficiently used.

FIG. 33B illustrates a television set 9100. In the television set 9100, a display portion 9103 is incorporated in a housing 9101 and an image can be displayed on the display portion 9103. Note that the housing 9101 is supported by a stand 9105 here.

The television set 9100 can be operated with an operation switch of the housing 9101 or a separate remote controller 9110. Channels and volume can be controlled with an operation key 9109 of the remote controller 9110 so that an image displayed on the display portion 9103 can be controlled. Furthermore, the remote controller 9110 may be provided with a display portion 9107 for displaying data output from the remote controller 9110.

The television set 9100 illustrated in FIG. 33B is provided with a receiver, a modem, and the like. With the use of the receiver, the television set 9100 can receive general television broadcasts. Moreover, when the television set 9100 is connected to a wired or wireless communication network via the modem, one-way (from a sender to a receiver) or two-way (between a sender and a receiver or between receivers) data communication can be performed.

Any of the semiconductor devices described in the above embodiments can be used for the display portions 9103 and 9107. Thus, the television set can have high display quality.

FIG. 33C illustrates a computer 9200 including a main body 9201, a housing 9202, a display portion 9203, a keyboard 9204, an external connection port 9205, and a pointing device 9206.

Any of the semiconductor devices described in the above embodiments can be used for the display portion 9203. Thus, the computer 9200 can have high display quality.

Figure 34A:
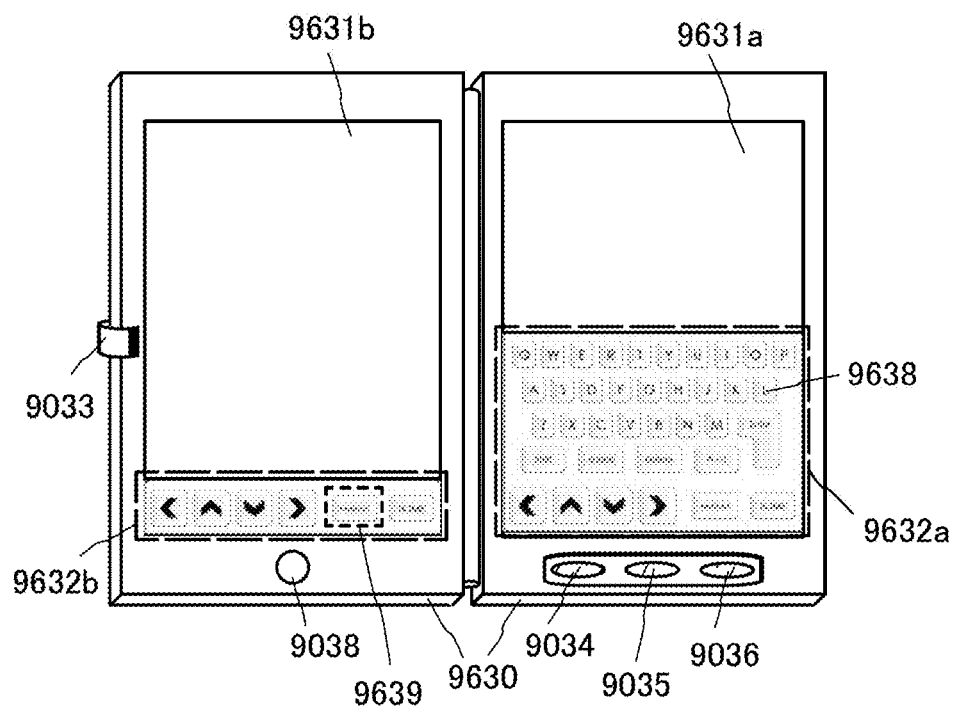
FIG. 34A to 34C illustrate an electronic device in which a semiconductor device of one embodiment of the present invention is used.
Figure 34B:
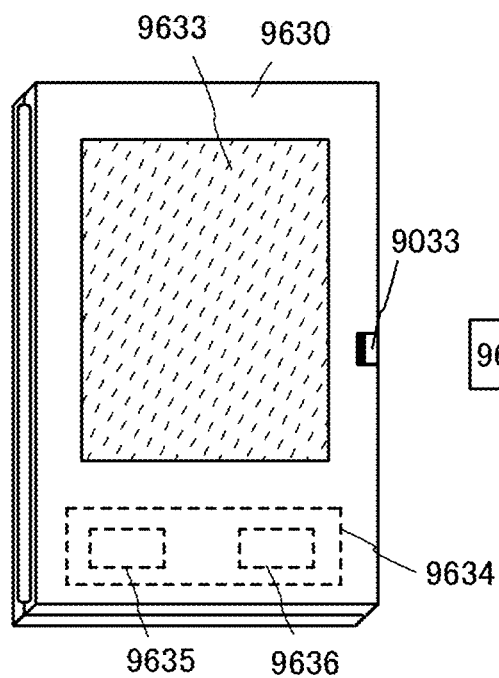

FIGS. 34A and 34B illustrate a foldable tablet terminal. FIG. 34A illustrates the tablet terminal in the state of being unfolded. The tablet terminal includes a housing 9630, a display portion 9631a, a display portion 9631b, a display-mode switching button 9034, a power button 9035, a power-saving-mode switching button 9036, a fastener 9033, and an operation button 9038.

Any of the semiconductor devices described in the above embodiments can be used for the display portion 9631a and the display portion 9631b, so that the tablet terminal can have high reliability.

A touch panel area 9632a can be provided in part of the display portion 9631a, in which area, data can be input by touching displayed operation keys 9638. Note that half of the display portion 9631a has only a display function and the other half has a touch panel function. However, the structure of the display portion 9631a is not limited to this, and all the area of the display portion 9631a may have a touch panel function. For example, a keyboard can be displayed on the whole display portion 9631a to be used as a touch panel, and the display portion 9631b can be used as a display screen.

A touch panel area 9632b can be provided in part of the display portion 9631b like in the display portion 9631a. When a keyboard display switching button 9639 displayed on the touch panel is touched with a finger, a stylus, or the like, a keyboard can be displayed on the display portion 9631b.

The touch panel area 9632a and the touch panel area 9632b can be controlled by touch input at the same time.

The display-mode switching button 9034 allows switching between a landscape mode and a portrait mode, color display and black-and-white display, and the like. The power-saving-mode switching button 9036 allows optimizing the display luminance in accordance with the amount of external light in use which is detected by an optical sensor incorporated in the tablet terminal. In addition to the optical sensor, other detecting devices such as sensors for determining inclination, such as a gyroscope or an acceleration sensor, may be incorporated in the tablet terminal.

Although the display area of the display portion 9631a is the same as that of the display portion 9631b in FIG. 34A, one embodiment of the present invention is not particularly limited thereto. The display area of the display portion 9631a may be different from that of the display portion 9631b, and further, the display quality of the display portion 9631a may be different from that of the display portion 9631b. For example, one of the display portions 9631a and 9631b may display higher definition images than the other.

FIG. 34B illustrates the tablet terminal in the state of being closed. The tablet terminal includes the housing 9630, a solar cell 9633, and a charge and discharge control circuit 9634. FIG. 34B illustrates an example where the charge and discharge control circuit 9634 includes a battery 9635 and a DC-DC converter 9636.

Since the tablet terminal can be folded, the housing 9630 can be closed when the tablet terminal is not in use. Thus, the display portions 9631a and 9631b can be protected, which permits the tablet terminal to have high durability and improved reliability for long-term use.

The tablet terminal illustrated in FIGS. 34A and 34B can also have a function of displaying various kinds of data (e.g., a still image, a moving image, and a text image), a function of displaying a calendar, a date, the time, or the like on the display portion, a touch-input function of operating or editing data displayed on the display portion by touch input, a function of controlling processing by various kinds of software (programs), and the like.

The solar cell 9633, which is attached on a surface of the tablet terminal, can supply electric power to a touch panel, a display portion, an image signal processor, and the like. Note that the solar cell 9633 can be provided on one or both surfaces of the housing 9630 and thus the battery 9635 can be charged efficiently. The use of a lithium-ion battery as the battery 9635 has advantages such as a reduction in size.

Figure 34C:
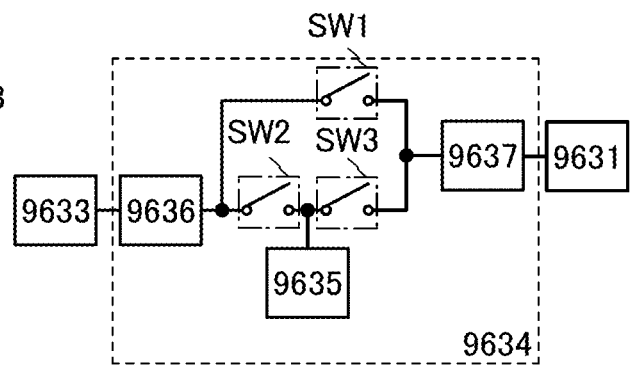

The structure and operation of the charge and discharge control circuit illustrated in FIG. 34B will be described with reference to a block diagram of FIG. 34C. FIG. 34C illustrates the solar cell 9633, the battery 9635, the DC-DC converter 9636, a converter 9637, switches SW1 to SW3, and the display portion 9631. The battery 9635, the DC-DC converter 9636, the converter 9637, and the switches SW1 to SW3 correspond to the charge and discharge control circuit 9634 in FIG. 34B.

First, an example of operation in the case where electric power is generated by the solar cell 9633 using external light will be described. The voltage of electric power generated by the solar cell is raised or lowered by the DC-DC converter 9636 so that the electric power has a voltage for charging the battery 9635. When the display portion 9631 is operated with the electric power from the solar cell 9633, the switch SW1 is turned on and the voltage of the electric power is raised or lowered by the converter 9637 to a voltage needed for operating the display portion 9631. In addition, when display on the display portion 9631 is not performed, the switch SW1 is turned off and the switch SW2 is turned on so that the battery 9635 may be charged.

Although the solar cell 9633 is described as an example of a power generation means, there is no particular limitation on the power generation means, and the battery 9635 may be charged with any of the other means such as a piezoelectric element or a thermoelectric conversion element (Peltier element). For example, the battery 9635 may be charged with a non-contact power transmission module capable of performing charging by transmitting and receiving electric power wirelessly (without contact), or any of the other charge means used in combination.

The structures and the like described in this embodiment can be combined as appropriate with any of the structures and the like described in the other embodiments and example.

Example 1

In this example, a liquid crystal display device is fabricated using Embodiment 2. The specifications and display image of the liquid crystal display device will be described.

In this example, a liquid crystal display device in which the gate insulating film 227 had a two-layer structure and a semiconductor film 119 in a capacitor 245 was in contact with the insulating film 225 formed of a nitride insulating film so that the semiconductor film 119 serving as one electrode of the capacitor was n-type was fabricated as illustrated in FIG. 24. Table 1 shows the specifications of the liquid crystal display device, a signal line driver circuit, and a scan line driver circuit.

TABLE 1

| Liquid crystal display device | |
|---|---|
| Panel size | 3.4 inch (portrait) |
| Effective pixels | 540 (H) × RGB × 960 (V) (qHD) |
| Pixel size | 0.026 mm (H) × 0.078 mm (V) |
| External size | 52.2 mm (H) × 93.1 mm (V) |
| Display area | 41.15 mm (H) × 74.88 mm (V) |
| Resolution | 326 ppi |
| Display element | LCD (TN mode) |
| Color method | CF method |
| Aperture ratio | 60.00% |
| Drive frequency | 60 Hz |
| Video signal mode | Analog dot-sequential |
| Gate Driver | Embedded |
| Source Driver | Embedded |
| VCOM | ≤15 V |
| Signal line driver cirucit | |
| Video signal voltage | −5/5 V |
| Clock frequency | 289.18 kHz |
| Sampling period | 432 ns |
| Signal voltage | −10/16 V |
| Video division | 45 pixels simultaneously sampling |
| Scan line driver circuit | |
| Clock frequency | 14.46 kHz |
| Signal voltage | −14/14 V |

Note that transistors provided in the signal line driver circuit and the scan line driver circuit each have a structure where a conductive film is not provided over a protective insulating film as in a pixel portion.

Figure 45:
FIG. 45 illustrates a display image of a liquid crystal display device.

Next, FIG. 45 shows a photograph of an image displayed by the liquid crystal display device fabricated in this example. As shown in FIG. 45, the liquid crystal display device fabricated in this example can display a high-quality image.

EXPLANATION OF REFERENCE

100: pixel portion, 101: pixel, 102: substrate, 103: transistor, 104: scan line driver circuit, 105: capacitor, 106: signal line driver circuit, 107: scan line, 107a: gate electrode, 108: liquid crystal element, 109: signal line, 109a: source electrode, 111: semiconductor film, 113: conductive film, 113a: drain electrode, 115: capacitor line, 117: opening, 119: semiconductor film, 121: pixel electrode, 123: opening, 125: conductive film, 126: insulating film, 127: gate insulating film, 128: insulating film, 129: insulating film, 130: insulating film, 131: insulating film, 132: insulating film, 133: insulating film, 134: organic insulating film, 141: pixel, 143: opening, 145: capacitor, 146: capacitor, 150: substrate, 151: pixel, 152: light-blocking film, 154: counter electrode, 156: insulating film, 158: insulating film, 160: liquid crystal layer, 161: pixel, 165: capacitor, 167: conductive film, 169: transistor, 171: pixel, 172: pixel, 173: capacitor, 174: capacitor, 175: capacitor line, 176: capacitor line, 177: semiconductor film, 178: semiconductor film, 182: channel protective film, 183: transistor, 185: transistor, 187: conductive film, 190: transistor, 191: signal line, 193: conductive film, 195: semiconductor film, 196: pixel, 197: capacitor, 198: semiconductor film, 199: conductive film, 199a: oxide semiconductor film, 199b: oxide semiconductor film, 199c: oxide semiconductor film, 201: pixel, 205: capacitor, 221: pixel electrode, 225: insulating film, 226: insulating film, 227: gate insulating film, 228: insulating film, 229: insulating film, 230: insulating film, 231: insulating film, 232: insulating film, 233: insulating film, 245: capacitor, 255: capacitor, 271: pixel electrode, 279: insulating film, 281: insulating film, 282: insulating film, 301: pixel, 305: capacitor, 307: gate electrode, 309: source electrode, 315: capacitor line, 319: semiconductor film, 401_1: pixel, 401_2: pixel, 403_1: transistor, 403_2: transistor, 405_1: capacitor, 405_2: capacitor, 407_1: scan line, 407_2: scan line, 409: signal line, 411_1: semiconductor film, 411_2: semiconductor film, 413_1: conductive film, 413_2: conductive film, 415: capacitor line, 417_1: opening, 417_2: opening, 419_1: semiconductor film, 419_2: semiconductor film, 421_1: pixel electrode, 421_2: pixel electrode, 423: opening, 425: conductive film, 431_1: pixel, 431_2: pixel, 433_1: transistor, 433_2: transistor, 435_1: capacitor, 435_2: capacitor, 437: scan line, 439_1: signal line, 439_2: signal line, 441_1: semiconductor film, 441_2: semiconductor film, 443_1: conductive film, 443_2: conductive film, 445: capacitor line, 447_1: opening, 447_2: opening, 449_1: semiconductor film, 449_2: semiconductor film, 451_1: pixel electrode, 451_2: pixel electrode, 501: pixel, 505: capacitor, 519: semiconductor film, 521: common electrode, 607: gate electrode, 609: source electrode, 613: drain electrode, 685: transistor, 687: conductive film, 701: gate electrode, 703: gate insulating film, 705: oxide semiconductor film, 707: source electrode, 709: drain electrode, 711: insulating film, 713: conductive film, 901: substrate, 902: pixel portion, 903: signal line driver circuit, 904: scan line driver circuit, 905: sealant, 906: substrate, 908: liquid crystal layer, 910: transistor, 911: transistor, 913: liquid crystal element, 915: connection terminal electrode, 916: terminal electrode, 917: conductive film, 918: FPC, 918b: FPC, 919: anisotropic conductive agent, 922: gate insulating film, 923: insulating film, 924: insulating film, 925: sealant, 926: capacitor, 927: oxide semiconductor film, 928: electrode, 929: capacitor line, 930: electrode, 931: electrode, 932: insulating film, 933: insulating film, 935: spacer, 940: electrode, 941: electrode, 943: liquid crystal element, 945: electrode, 946: common wiring, 971: source electrode, 973: drain electrode, 975: common potential line, 977: common electrode, 985: common potential line, 987: common electrode, 9000: table, 9001: housing, 9002: leg portion, 9003: display portion, 9004: displayed button, 9005: power cord, 9033: fastener, 9034: display-mode switching button, 9035: power button, 9036: power-saving-mode switching button, 9038: operation button, 9100: television set, 9101: housing, 9103: display portion, 9105: stand, 9107: display portion, 9109: operation key, 9110: remote controller, 9200: computer, 9201: main body, 9202: housing, 9203: display portion, 9204: keyboard, 9205: external connection port, 9206: pointing device, 9630: housing, 9631: display portion, 9631a: display portion, 9631b: display portion, 9632a: touch panel area, 9632b: touch panel area, 9633: solar cell, 9634: charge and discharge control circuit, 9635: battery, 9636: DC-DC converter, 9637: converter, 9638: operation key, and 9639: button.

This application is based on Japanese Patent Application serial no. 2012-173349 filed with the Japan Patent Office on Aug. 3, 2012, Japanese Patent Application serial no. 2012-178941 filed with the Japan Patent Office on Aug. 10, 2012, and Japanese Patent Application serial no. 2012-188093 filed with the Japan Patent Office on Aug. 28, 2012, the entire contents of which are hereby incorporated by reference.

The invention claimed is:

1. A semiconductor device comprising:
a substrate;
a gate electrode and a line over the substrate, in non-overlapping regions;
a first insulating film over the substrate, the gate electrode, and the line;
a second insulating film over the first insulating film;
a third insulating film over the second insulating film;
a light-transmitting pixel electrode over the third insulating film;
a transistor comprising:
the gate electrode;
the first insulating film over the gate electrode; and
a semiconductor film over the first insulating film and overlapping the gate electrode, the semiconductor film being electrically connected to the pixel electrode; and
a capacitor comprising:
a light-transmitting film able to conduct electricity as a first capacitor electrode over the first insulating film;
the third insulating film as a capacitor dielectric film over the first capacitor electrode; and
the pixel electrode as a second capacitor electrode over the capacitor dielectric film,
wherein the first, the second, and the third insulating films overlap with the semiconductor film,
wherein a stack comprising the first insulating film, the second insulating film, and the third insulating film is interposed between the line and the pixel electrode, and
wherein the second insulating film is not provided in a region entirely overlapping with the first and the second capacitor electrodes, and the third insulating film is on and in direct contact with the first capacitor electrode.

2. The semiconductor device according to claim 1, wherein the semiconductor film and the first capacitor electrode are on and in direct contact with the first insulating film.

3. The semiconductor device according to claim 1, wherein the first capacitor electrode and the semiconductor film are formed from a same film.

4. The semiconductor device according to claim 1, wherein the first capacitor electrode and the semiconductor film are formed from a same oxide semiconductor film.

5. The semiconductor device according to claim 1,
wherein the first capacitor electrode and the semiconductor film are formed from an oxide semiconductor film, and
wherein the first capacitor electrode further contains a dopant at a concentration greater than $1 \times 10^{19}$ atoms/cm$^3$ and less than or equal to $1 \times 10^{22}$ atoms/cm$^3$.

6. The semiconductor device according to claim 1, further comprising an organic insulating film interposed between the third insulating film and the pixel electrode,
wherein the pixel electrode is in direct contact with the third insulating film through an opening in the organic insulating film.

7. The semiconductor device according to claim 1, further comprising a capacitor line formed from a same film as the gate electrode,
wherein the first capacitor electrode is connected to the capacitor line through a film formed from a same film as a source electrode or a drain electrode of the transistor.

8. The semiconductor device according to claim 1, further comprising a capacitor line,
wherein the light-transmitting film able to conduct electricity contains a semiconductor material, and
wherein the semiconductor device is configured so that, when used, a potential applied to the capacitor line is constantly lower than a potential to be supplied to the pixel electrode by a threshold voltage of the capacitor or more.

9. A display device comprising the semiconductor device according to claim 1.

10. An electronic device comprising the semiconductor device according to claim 1.

11. A semiconductor device comprising:
a substrate;
a gate electrode and a line over the substrate, in non-overlapping regions;
a first insulating film over the substrate, the gate electrode, and the line;
a second insulating film over the first insulating film;
a third insulating film over the second insulating film;
a light-transmitting pixel electrode over the third insulating film;
a transistor comprising:
  the gate electrode;
  the first insulating film over the gate electrode; and
  a metal oxide semiconductor film over the first insulating film and overlapping the gate electrode, the metal oxide semiconductor film being electrically connected to the pixel electrode; and
a capacitor comprising:
  a light-transmitting film able to conduct electricity as a first capacitor electrode over the first insulating film;
  the third insulating film as a capacitor dielectric film over the first capacitor electrode; and
  the pixel electrode as a second capacitor electrode over the capacitor dielectric film,
wherein the first capacitor electrode and the metal oxide semiconductor film are formed from a same film,
wherein a stack comprising the first insulating film, the second insulating film, and the third insulating film is interposed between the line and the pixel electrode,
wherein the first insulating film and the second insulating film sandwich the metal oxide semiconductor film, are respectively a first oxide insulating film and a second oxide insulating film, and are each in direct contact with the metal oxide semiconductor film,
wherein the third insulating film is a nitride insulating film and overlaps with the metal oxide semiconductor film,
wherein the second oxide insulating film is not provided in a region entirely overlapping with the first and the second capacitor electrodes,
wherein the nitride insulating film is on and in direct contact with the first capacitor electrode, and
wherein the second capacitor electrode is on and in direct contact with the nitride insulating film.

12. The semiconductor device according to claim 11, wherein the first capacitor electrode contains a dopant at a concentration greater than $1 \times 10^{19}$ atoms/cm$^3$ and less than or equal to $1 \times 10^{22}$ atoms/cm$^3$.

13. The semiconductor device according to claim 11, further comprising an organic insulating film interposed between the second insulating film and the pixel electrode,
wherein the pixel electrode is in direct contact with the second insulating film through an opening in the organic insulating film.

14. The semiconductor device according to claim 11, further comprising a capacitor line formed from a same film as the gate electrode,
wherein the first capacitor electrode is connected to the capacitor line through a film formed from a same film as a source electrode or a drain electrode of the transistor.

15. The semiconductor device according to claim 11, further comprising a capacitor line,
wherein the semiconductor device is configured so that, when used, a potential applied to the capacitor line is constantly lower than a potential to be supplied to the pixel electrode by a threshold voltage of the capacitor or more.

16. A display device comprising the semiconductor device according to claim 11.

17. An electronic device comprising the semiconductor device according to claim 11.

18. A semiconductor device comprising:
a substrate;
a gate electrode and a line over the substrate, in non-overlapping regions;
a first insulating film over the substrate, the gate electrode, and the line;
a second insulating film over the first insulating film;
a third insulating film over the second insulating film;
a light-transmitting pixel electrode over the third insulating film;
a transistor comprising:
  the gate electrode;
  the first and the second insulating films over the gate electrode; and
  a semiconductor film over the first and the second insulating films and overlapping the gate electrode, the semiconductor film being electrically connected to the pixel electrode; and
a capacitor comprising:
  a light-transmitting film able to conduct electricity as a first capacitor electrode over the first insulating film;

the third insulating film as a capacitor dielectric film over the first capacitor electrode; and the pixel electrode as a second capacitor electrode over the capacitor dielectric film, wherein the first, the second, and the third insulating films overlap with the semiconductor film, wherein a stack comprising the first insulating film, the second insulating film, and the third insulating film is interposed between the line and the pixel electrode, and wherein the second insulating film is not provided in a region entirely overlapping with the first and the second capacitor electrodes, and the first capacitor electrode is on and in direct contact with the first insulating film.

19. The semiconductor device according to claim 18, wherein the first capacitor electrode and the semiconductor film are formed from a same film.

20. The semiconductor device according to claim 18, wherein the first capacitor electrode and the semiconductor film are formed from a same oxide semiconductor film.

21. A semiconductor device comprising:
a substrate;
a gate electrode and a line over the substrate, in non-overlapping regions;
a first insulating film over the substrate, the gate electrode, and the line;
a second insulating film over the first insulating film;
a third insulating film over the second insulating film;
a light-transmitting pixel electrode over the third insulating film;
a transistor comprising:
  the gate electrode;
  the first and the second insulating films over the gate electrode; and
  a metal oxide semiconductor film over the first and the second insulating films and overlapping the gate electrode, the metal oxide semiconductor film being electrically connected to the pixel electrode; and
a capacitor comprising:
  a light-transmitting film able to conduct electricity as a first capacitor electrode over the first insulating film;
  the third insulating film as a capacitor dielectric film over the first capacitor electrode; and
  the pixel electrode as a second capacitor electrode over the capacitor dielectric film,
wherein the first capacitor electrode and the metal oxide semiconductor film are formed from a same film,
wherein a stack comprising the first insulating film, the second insulating film, and the third insulating film is interposed between the line and the pixel electrode,
wherein the second insulating film and the third insulating film sandwich the metal oxide semiconductor film, are respectively a first oxide insulating film and a second oxide insulating film, and are each in direct contact with the metal oxide semiconductor film,
wherein the first insulating film is a nitride insulating film and overlaps with the metal oxide semiconductor film, and
wherein the first oxide insulating film is not provided in a region entirely overlapping with the first and the second capacitor electrodes, and the first capacitor electrode is on and in direct contact with the nitride insulating film.

22. The semiconductor device according to claim 1, wherein the pixel electrode is in direct contact with the third insulating film in the region overlapping with the first and the second capacitor electrodes.

* * * * *